(12) United States Patent
Liu et al.

(10) Patent No.: US 12,532,518 B2
(45) Date of Patent: Jan. 20, 2026

(54) TRANSISTOR SOURCE/DRAIN REGIONS AND METHODS OF FORMING THE SAME

(71) Applicant: Taiwan Semiconductor Manufacturing Co., Ltd., Hsinchu (TW)

(72) Inventors: Wei-Min Liu, Hsinchu (TW); Tsz-Mei Kwok, Hsinchu (TW); Hui-Lin Huang, Hsinchu (TW); Cheng-Yen Wen, Taichung (TW); Li-Li Su, Chubei (TW); Chii-Horng Li, Zhubei (TW); Yee-Chia Yeo, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 838 days.

(21) Appl. No.: 17/835,139

(22) Filed: Jun. 8, 2022

(65) Prior Publication Data
US 2023/0275123 A1     Aug. 31, 2023

Related U.S. Application Data

(60) Provisional application No. 63/268,513, filed on Feb. 25, 2022.

(51) Int. Cl.
| | | |
|---|---|---|
| *H10D 30/00* | (2025.01) | |
| *H10D 30/01* | (2025.01) | |
| *H10D 30/67* | (2025.01) | |
| *H10D 62/10* | (2025.01) | |
| *H10D 64/01* | (2025.01) | |

(Continued)

(52) U.S. Cl.
CPC ........ *H10D 62/118* (2025.01); *H10D 30/031* (2025.01); *H10D 30/6713* (2025.01); *H10D 30/6735* (2025.01); *H10D 30/6757* (2025.01); *H10D 64/021* (2025.01);
(Continued)

(58) Field of Classification Search
CPC ........... H10D 30/6735; H10D 30/6757; H10D 62/121; H10D 84/013
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |

(Continued)

FOREIGN PATENT DOCUMENTS

| | | |
|---|---|---|
| CN | 114038899 A | 2/2022 |
| KR | 20170101729 A | 9/2017 |

(Continued)

OTHER PUBLICATIONS

Dupre, C. et al., "15nm-diameter 3D Stacked Nanowires with Independent Gates Operation: FFET," 2008 IEEE International Electron Devices Meeting, Dec. 15-17, 2008, doi: 10.1109/IEDM.2008.4796805, 4 pages.

*Primary Examiner* — Reema Patel
(74) *Attorney, Agent, or Firm* — Slater Matsil, LLP

(57) ABSTRACT

In an embodiment, a device includes: a semiconductor fin extending from a semiconductor substrate; a nanostructure above the semiconductor fin; a source/drain region adjacent a channel region of the nanostructure; a bottom spacer between the source/drain region and the semiconductor fin; and a gap between the bottom spacer and the source/drain region.

20 Claims, 62 Drawing Sheets

(51) Int. Cl.
*H10D 84/01* (2025.01)
*H10D 84/03* (2025.01)

(52) U.S. Cl.
CPC ....... *H10D 84/0128* (2025.01); *H10D 84/013* (2025.01); *H10D 84/0147* (2025.01); *H10D 84/038* (2025.01)

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,972,701 | B2 | 5/2018 | Kim et al. |
| 10,128,379 | B2 | 11/2018 | Song et al. |
| 10,164,012 | B2 | 12/2018 | Fung et al. |
| 10,361,278 | B2 | 7/2019 | Yang et al. |
| 10,461,195 | B2 | 10/2019 | Kwon et al. |
| 11,211,456 | B2 | 12/2021 | Jung et al. |
| 11,862,701 | B2 | 1/2024 | Chung et al. |
| 12,237,230 | B2 | 2/2025 | Lai et al. |
| 2018/0190829 | A1* | 7/2018 | Song ................. H01L 21/02532 |
| 2019/0131431 | A1 | 5/2019 | Cheng et al. |
| 2019/0295899 | A1 | 9/2019 | Seo et al. |
| 2020/0075423 | A1 | 3/2020 | Kwok et al. |
| 2021/0135008 | A1 | 5/2021 | Chiang et al. |
| 2021/0320210 | A1 | 10/2021 | Lin et al. |

FOREIGN PATENT DOCUMENTS

| | | |
|---|---|---|
| KR | 20180080527 A | 7/2018 |
| KR | 20180115392 A | 10/2018 |
| KR | 20200132436 A | 11/2020 |
| KR | 20220016445 A | 2/2022 |

\* cited by examiner

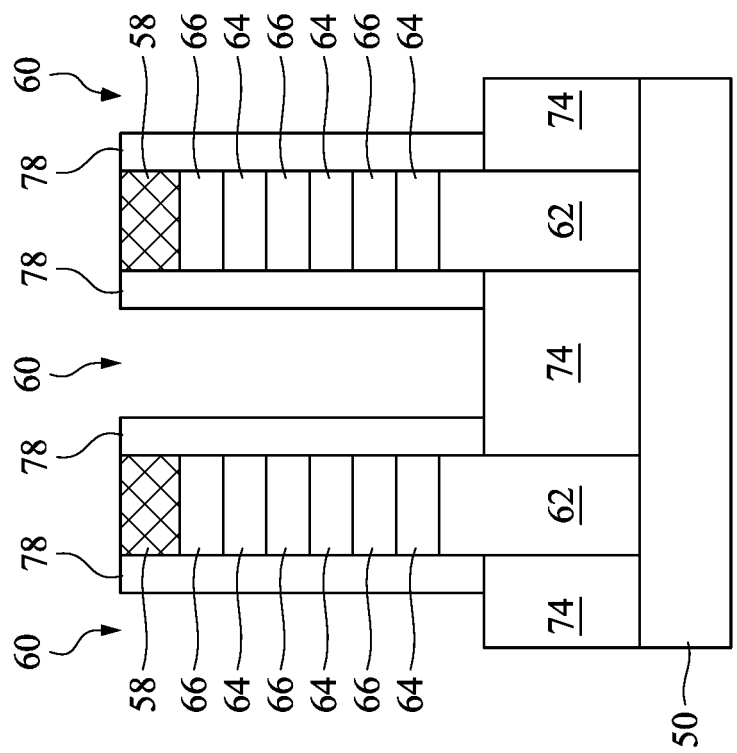
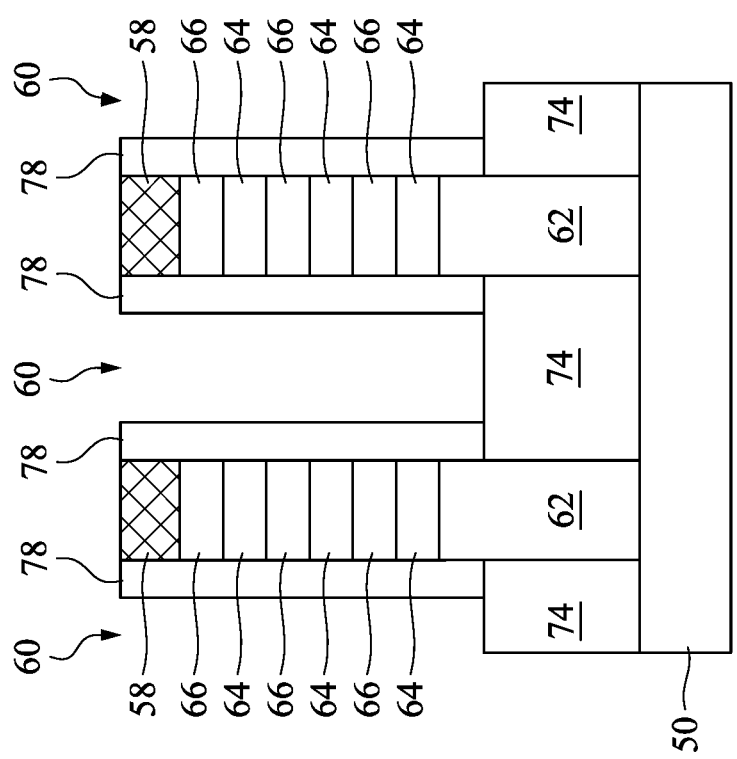

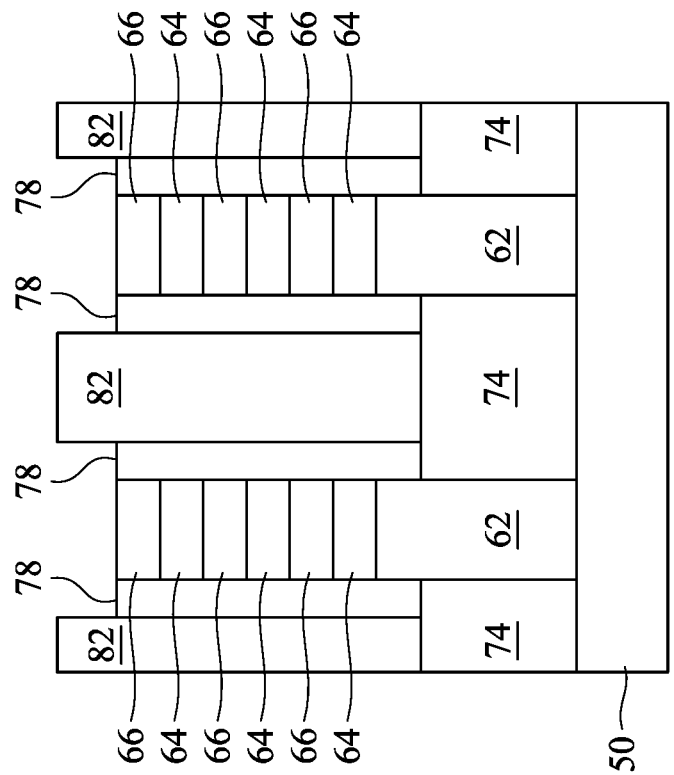
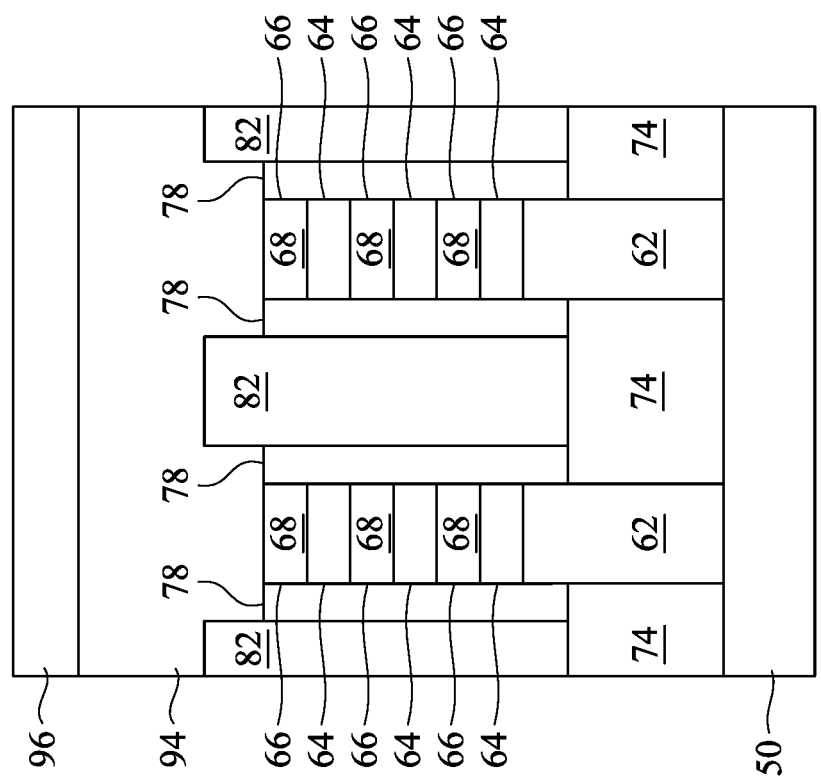
Figure 10B
Figure 10A

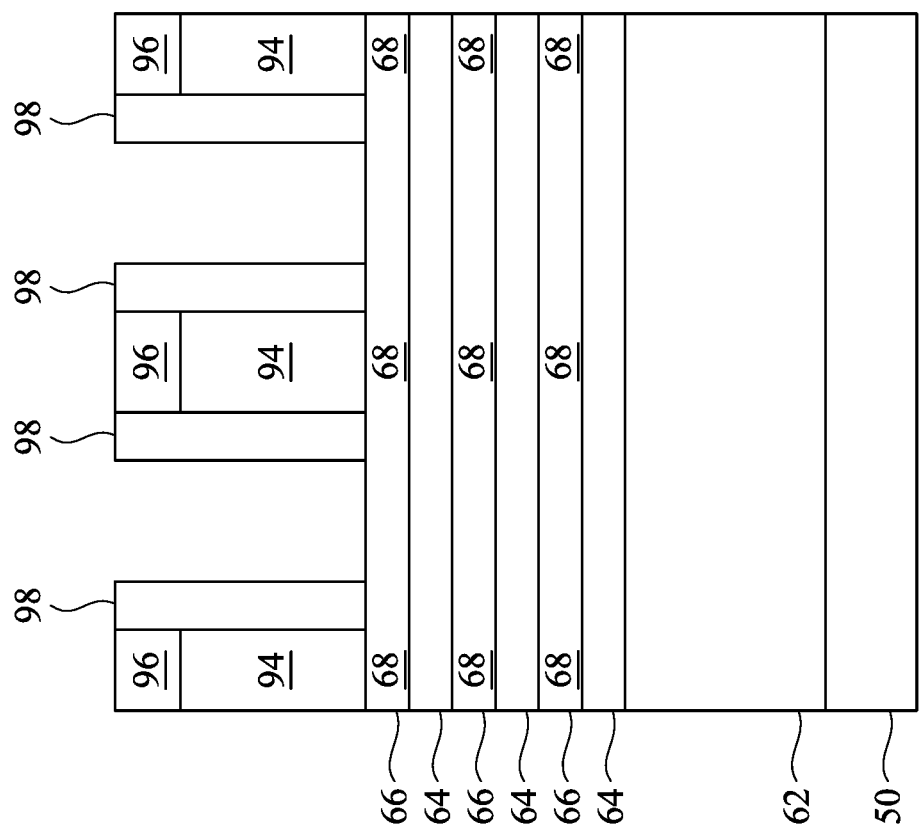

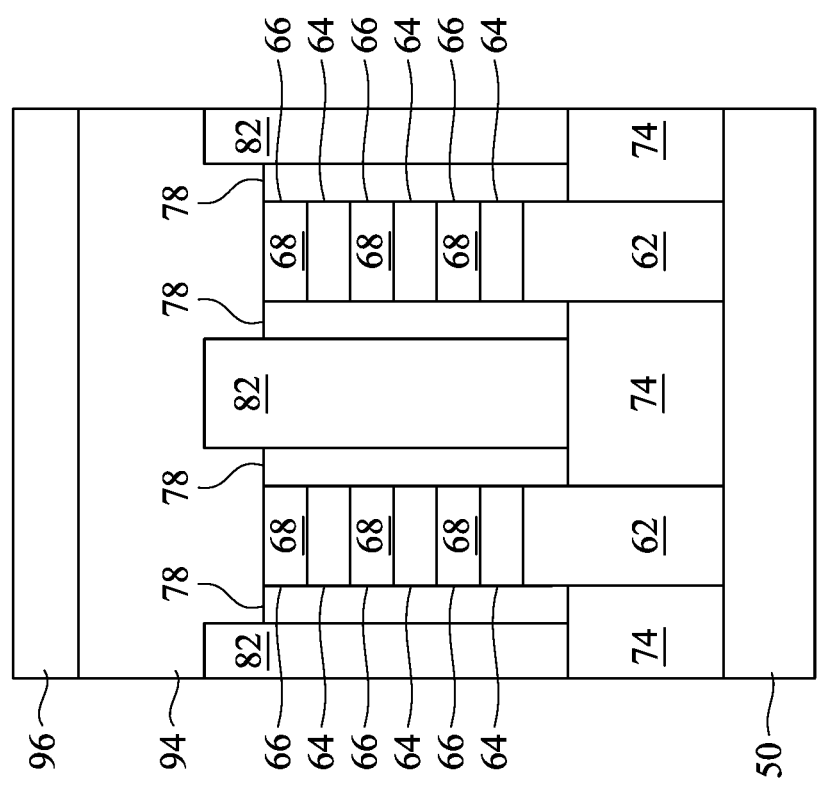
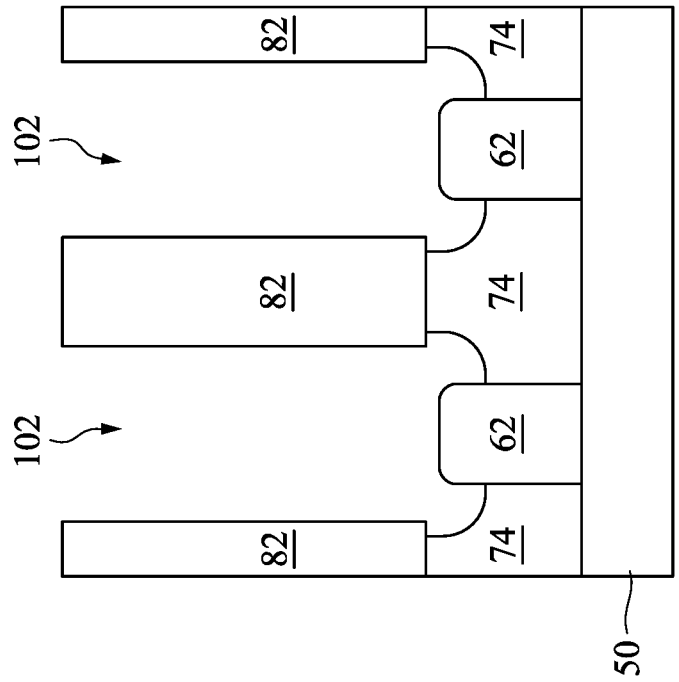
Figure 12A
Figure 12B

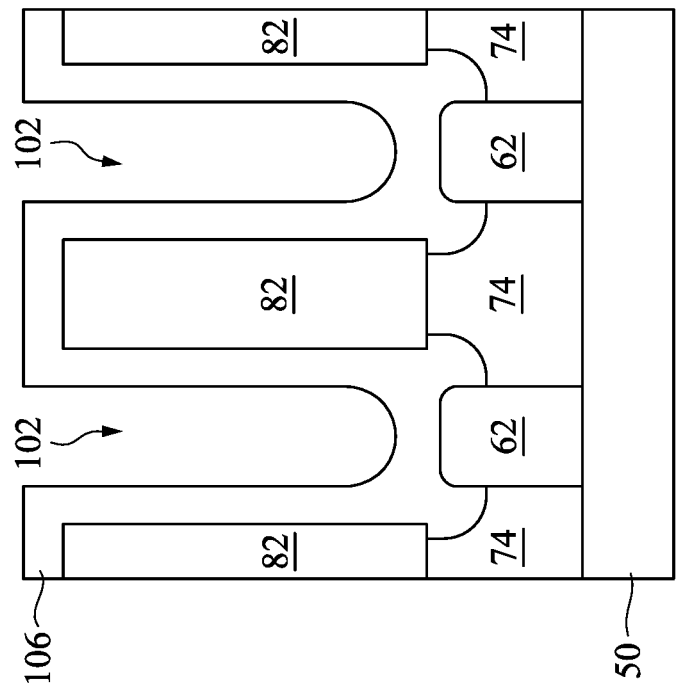
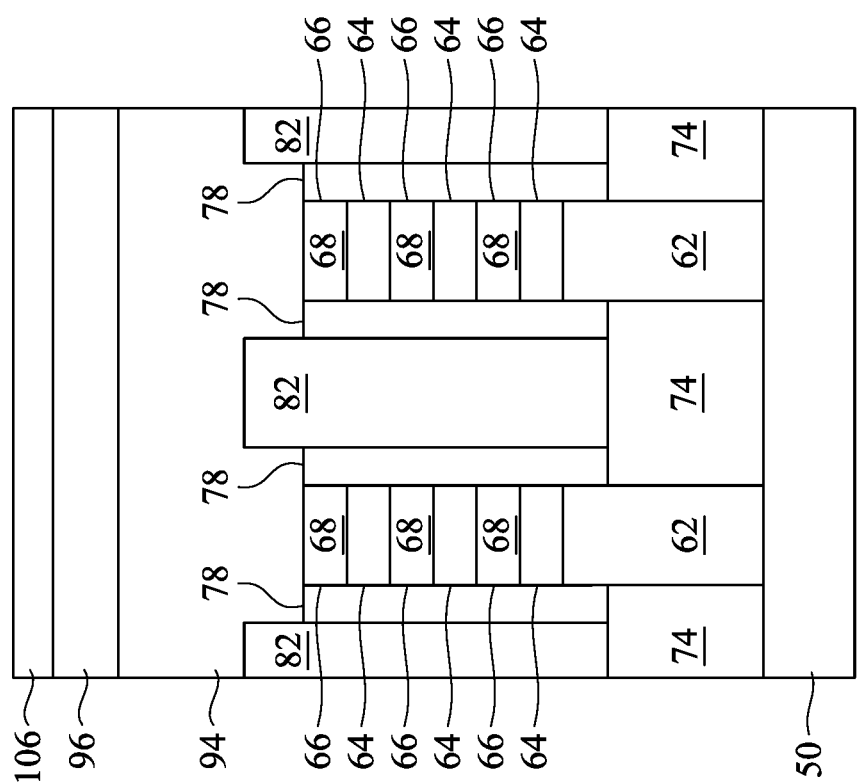
Figure 13A
Figure 13B

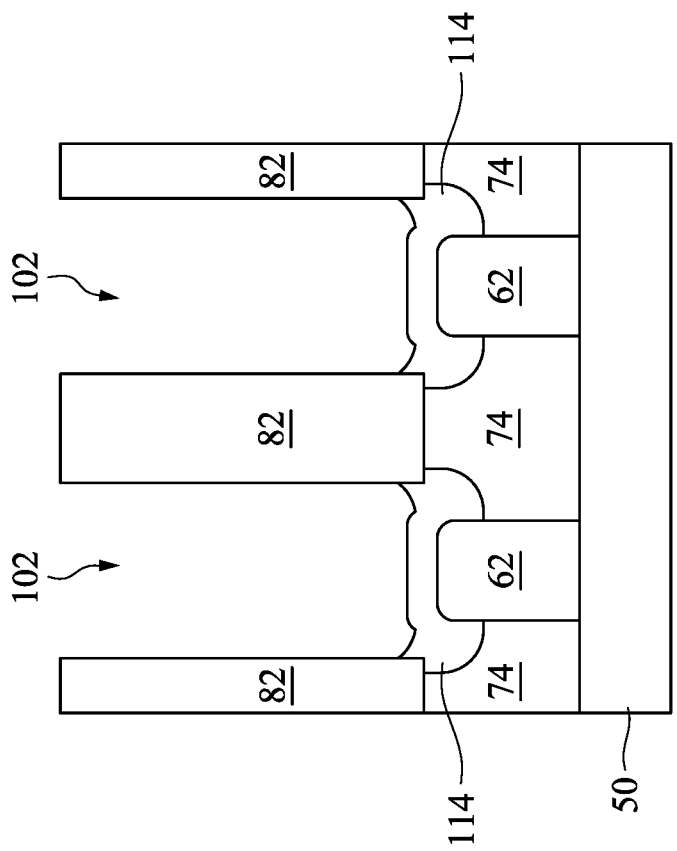
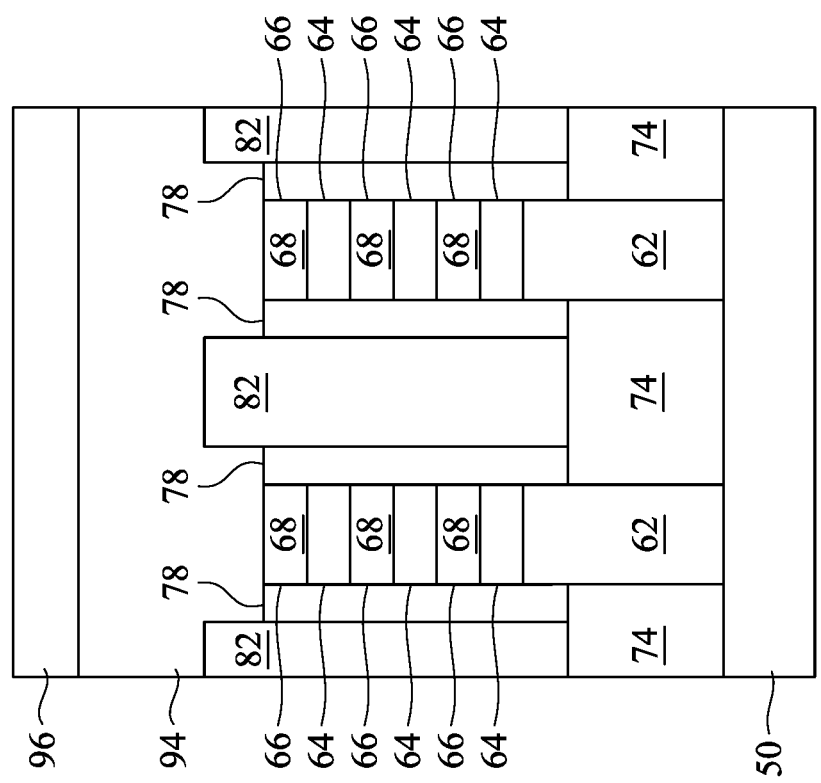
Figure 14B
Figure 14A

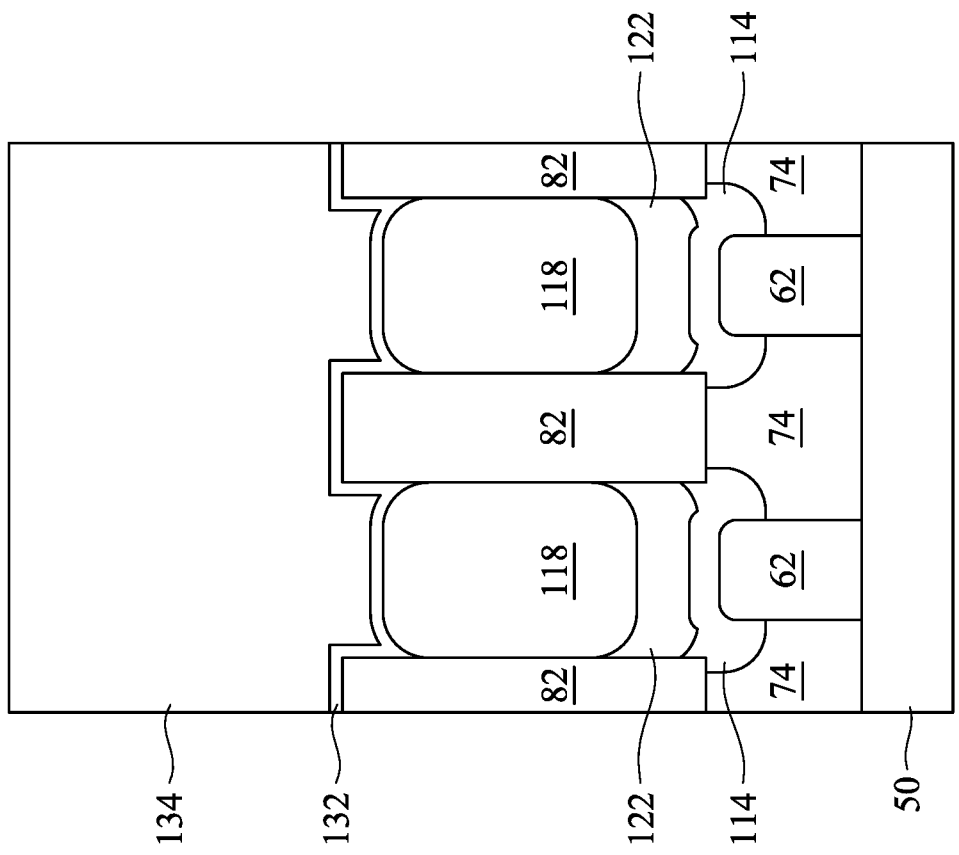
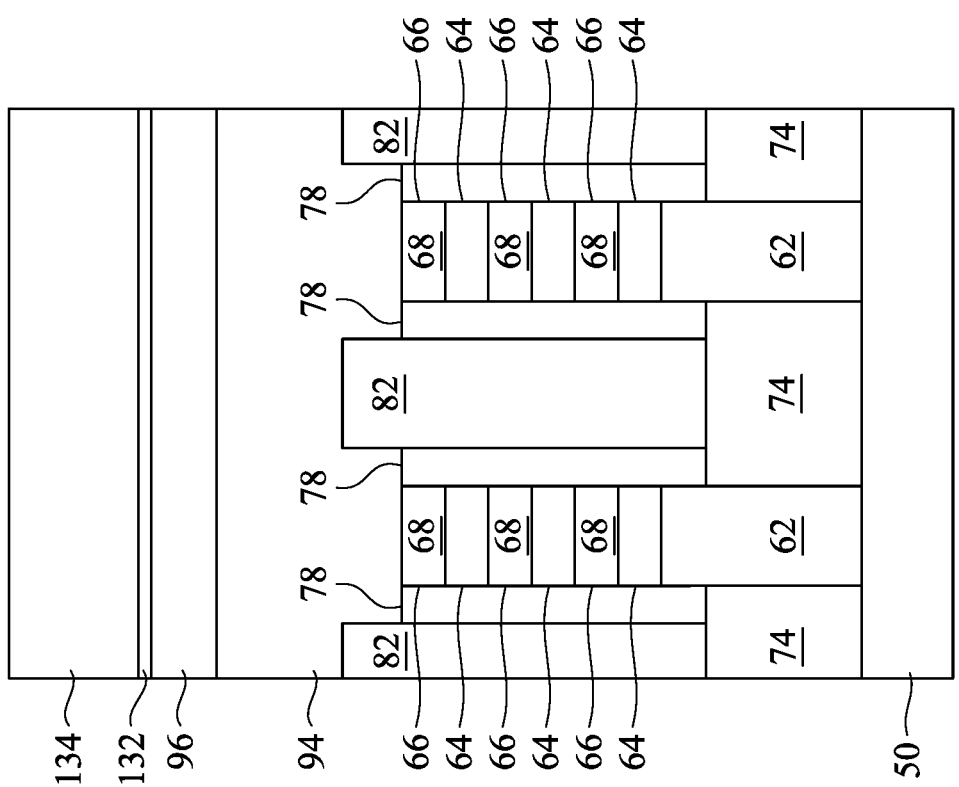
Figure 16A
Figure 16B

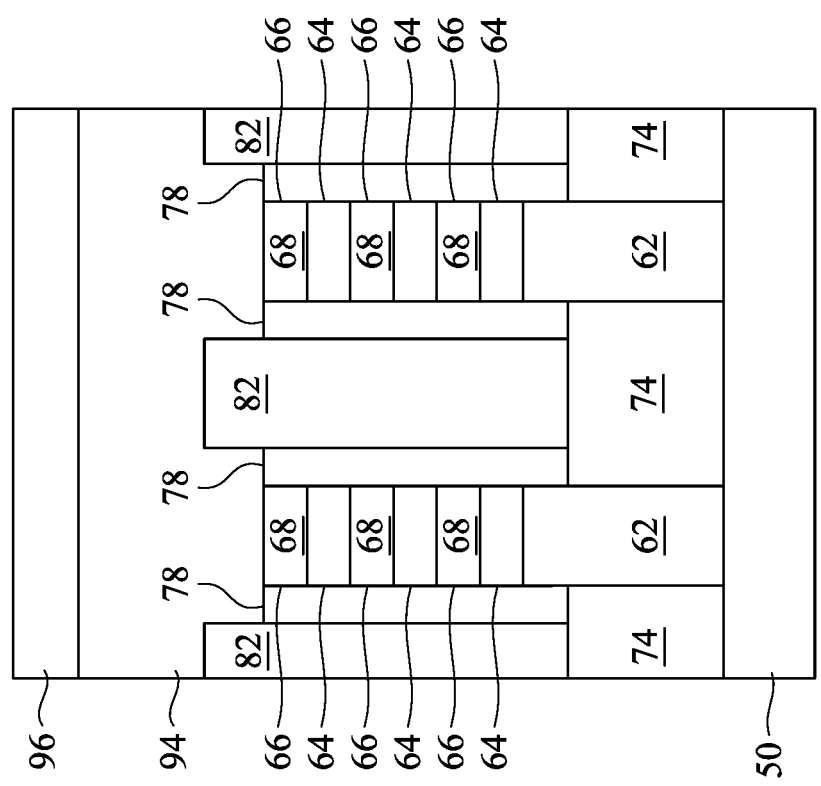
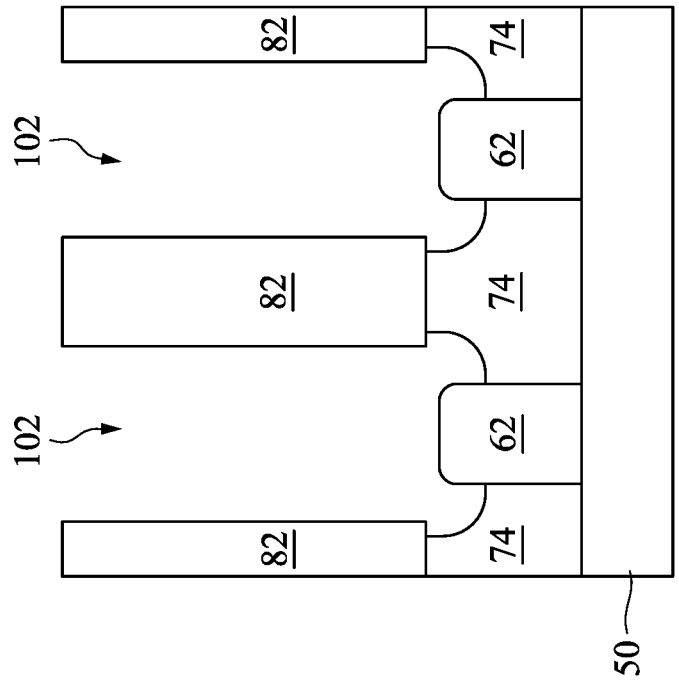
Figure 28A
Figure 28B

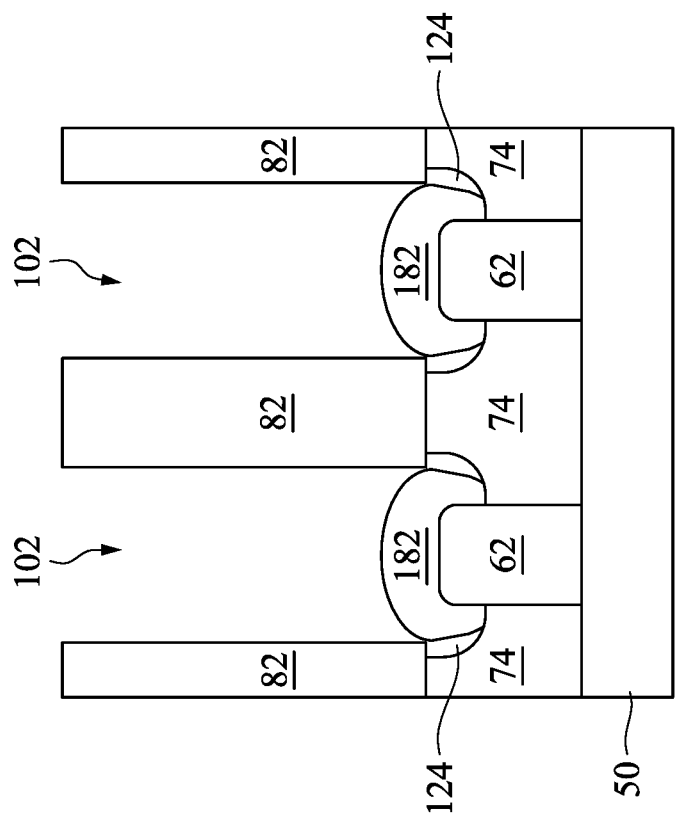
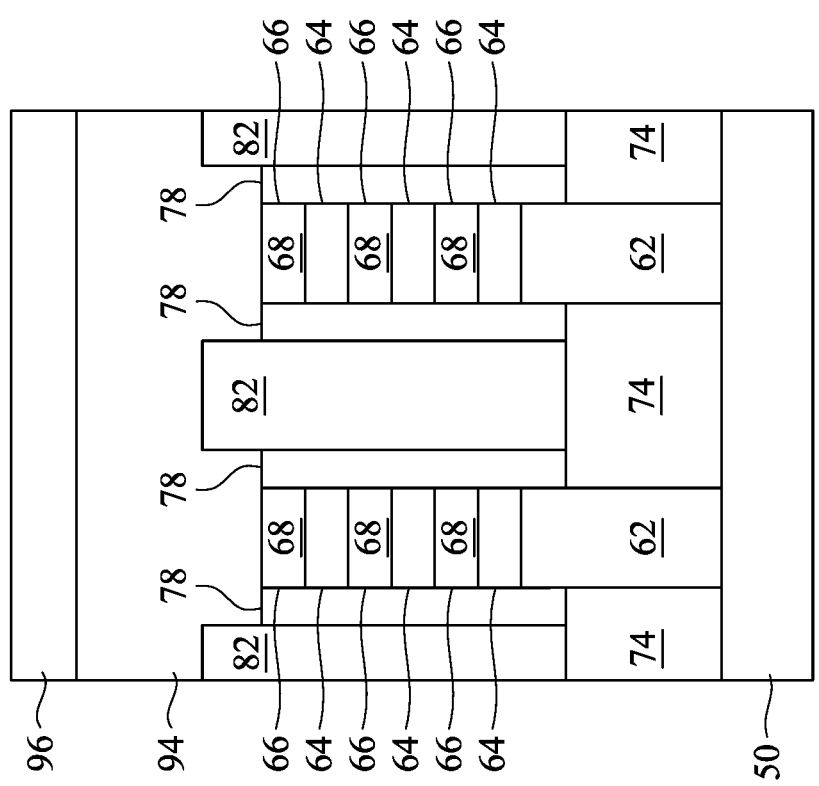

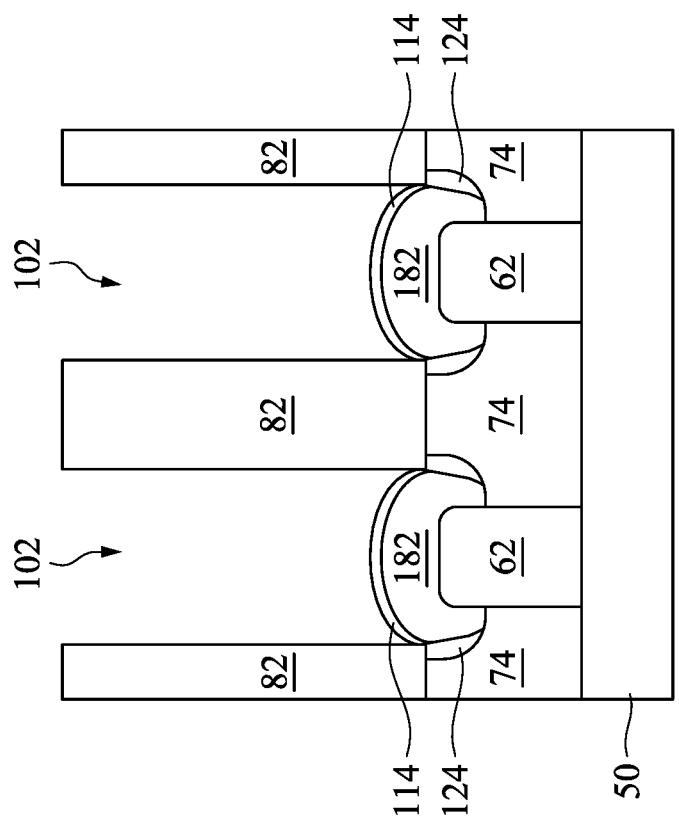
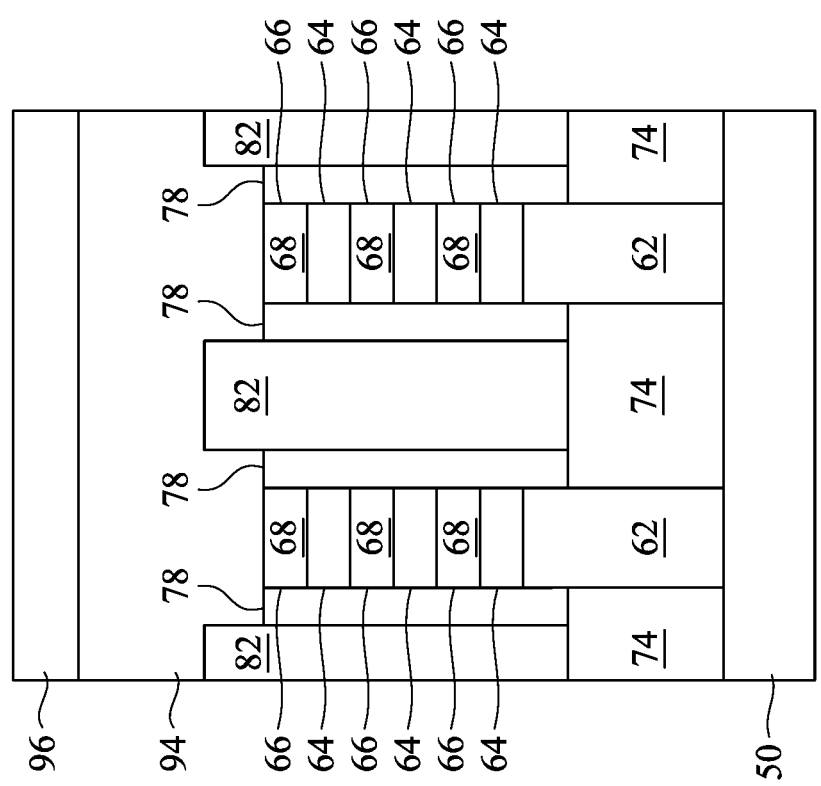
Figure 30B
Figure 30A

TRANSISTOR SOURCE/DRAIN REGIONS AND METHODS OF FORMING THE SAME

PRIORITY CLAIM AND CROSS-REFERENCE

This application claims the benefit of U.S. Provisional Application No. 63/268,513, filed on Feb. 25, 2022, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-21C are views of intermediate stages in the manufacturing of nanostructure-FETs, in accordance with some embodiments.

DETAILED DESCRIPTION

Figure 1:
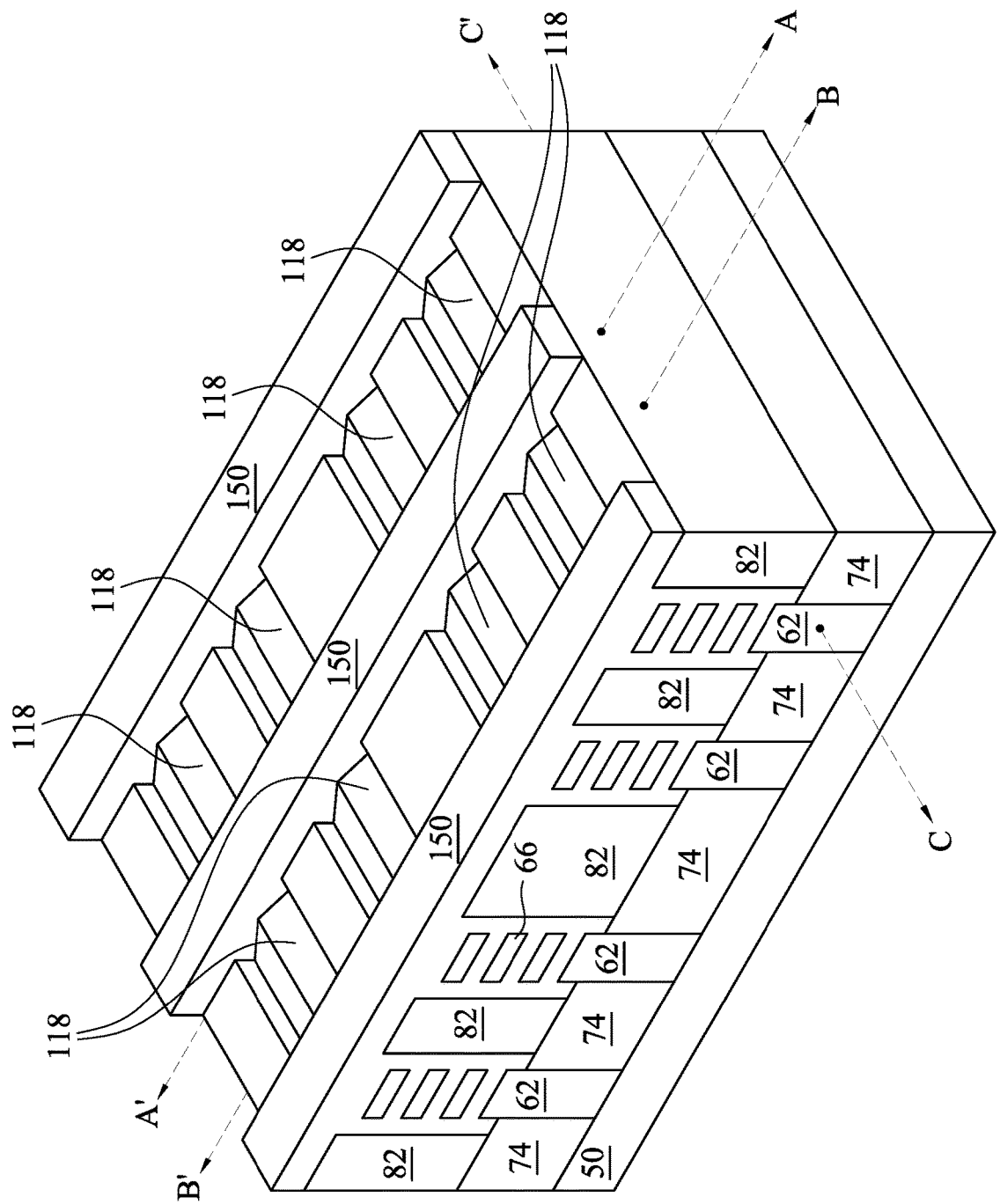
FIG. 1 illustrates an example of nanostructure field-effect transistors (nanostructure-FETs) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, spacers are formed at the bottom of source/drain recesses and on underlying semiconductor fins. Source/drain regions are subsequently grown in the source/drain recesses. The spacers reduce the electrical coupling between the semiconductor fins and the source/drain regions. Reducing electrical coupling between the semiconductor fins and the source/drain regions may help reduce the leakage current of the resulting devices, such as by avoiding the operation of parasitic channel regions in the semiconductor fins. Additionally, gaps may be formed between the spacers and the source/drain regions. The gaps may further reduce electrical coupling between the semiconductor fins and the source/drain regions by blocking leakage currents. Performance of the resulting devices may thus be improved.

Embodiments are described in a particular context, a die including nanostructure-FETs. Various embodiments may be applied, however, to dies including other types of transistors (e.g., fin field-effect transistors (FinFETs), planar transistors, or the like) in lieu of or in combination with the nanostructure-FETs.

FIG. 1 illustrates an example of nanostructure-FETs (e.g., nanowire FETs, nanosheet FETs, or the like), in accordance with some embodiments. FIG. 1 is a three-dimensional view, where some features of the nanostructure-FETs are omitted for illustration clarity. The nanostructure-FETs may be nanosheet field-effect transistors (NSFETs), nanowire field-effect transistors (NWFETs), gate-all-around field-effect transistors (GAAFETs), or the like.

The nanostructure-FETs include nanostructures 66 (e.g., nanosheets, nanowires, or the like) over semiconductor fins 62 on a substrate 50 (e.g., a semiconductor substrate), with the nanostructures 66 acting as channel regions for the nanostructure-FETs. The nanostructures 66 may include p-type nanostructures, n-type nanostructures, or a combination thereof. Shallow trench isolation (STI) regions 74 are disposed between adjacent semiconductor fins 62, which may protrude above and from between adjacent STI regions 74. Although the STI regions 74 are described/illustrated as being separate from the substrate 50, as used herein, the term "substrate" may refer to the semiconductor substrate alone or a combination of the semiconductor substrate and the isolation regions. Additionally, although the bottom portions of the semiconductor fins 62 are illustrated as being separate from the substrate 50, the bottom portions of the semiconductor fins 62 may be single, continuous materials with the substrate 50.

Gate structures 150 are over top surfaces of the semiconductor fins 62 and along top surfaces, sidewalls, and bottom surfaces of the nanostructures 66. Source/drain regions 118 are disposed on the semiconductor fins 62 at opposing sides of the gate structures 150. Source/drain region(s) 118 may refer to a source or a drain, individually or collectively dependent upon the context. Insulating fins 82, also referred to as hybrid fins or dielectric fins, are disposed over the STI regions 74, and are between adjacent source/drain regions 118. The insulating fins 82 block epitaxial growth to prevent coalescing of some of the source/drain regions 118 during epitaxial growth. For example, the insulating fins 82 may be formed at cell boundaries to separate the source/drain regions 118 of adjacent cells.

FIG. 1 further illustrates reference cross-sections that are used in later figures. Cross-section A-A' is along a longitudinal axis of a gate structure 150 and in a direction, for example, perpendicular to a direction of current flow between the source/drain regions 118 of a nanostructure-FET. Cross-section B-B' is parallel to cross-section A-A' and extends through source/drain regions 118 of the nanostructure-FETs. Cross-section C-C' is along a longitudinal axis of a semiconductor fin 62 and in a direction of, for example, a current flow between the source/drain regions 118 of the nanostructure-FET. Subsequent figures refer to these reference cross-sections for clarity.

FIGS. 2-21C are views of intermediate stages in the manufacturing of nanostructure-FETs, in accordance with some embodiments. FIGS. 2, 3, 4, and 5 are three-dimensional views. FIGS. 6A, 7A, 8A, 9A, 10A, 11A, 12A, 13A, 14A, 15A, 16A, 17A, 18A, 19A, 20A, and 21A are cross-sectional views illustrated along a similar cross-section as reference cross-section A-A' in FIG. 1. FIGS. 6B, 7B, 8B, 9B, 10B, 11B, 12B, 13B, 14B, 15B, 16B, 17B, 18B, 19B, 20B, and 21B are cross-sectional views illustrated along a similar cross-section as reference cross-section B-B' in FIG. 1. FIGS. 10C, 11C, 12C, 13C, 14C, 15C, 16C, 17C, 18C, 19C, 20C, and 21C is a cross-sectional view illustrated along a similar cross-section as reference cross-section C-C' in FIG. 1.

Figure 2:
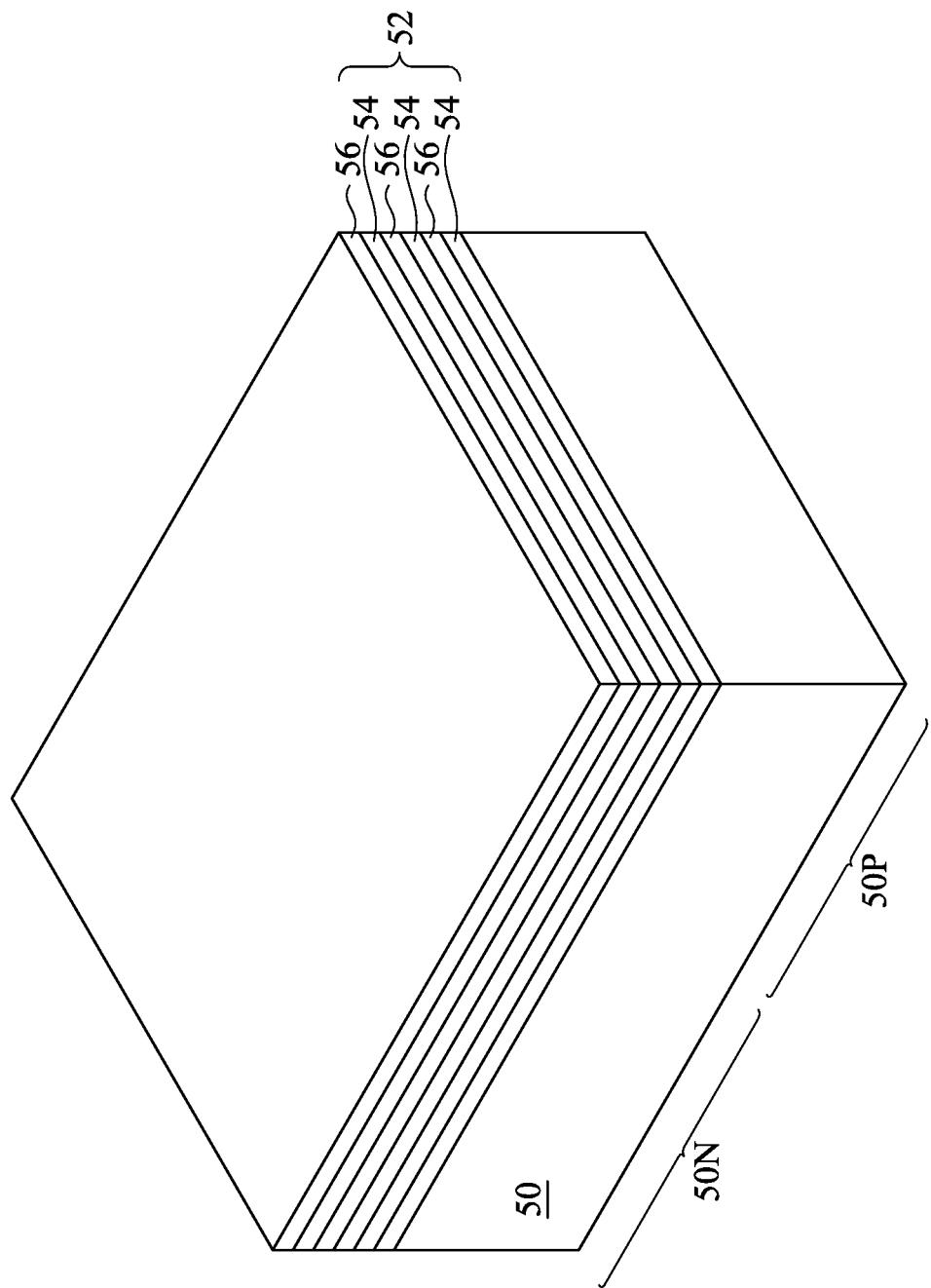

In FIG. 2, a substrate 50 is provided for forming nanostructure-FETs. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has an n-type region 50N and a p-type region 50P. The n-type region 50N can be for forming n-type devices, such as NMOS transistors, e.g., n-type nanostructure-FETs, and the p-type region 50P can be for forming p-type devices, such as PMOS transistors, e.g., p-type nanostructure-FETs. The n-type region 50N may be physically separated (not separately illustrated) from the p-type region 50P, and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

The substrate 50 may be lightly doped with a p-type or an n-type impurity. An anti-punch-through (APT) implantation may be performed on an upper portion of the substrate 50 to form an APT region. During the APT implantation, impurities may be implanted in the substrate 50. The impurities may have a conductivity type opposite from a conductivity type of source/drain regions that will be subsequently formed in each of the n-type region 50N and the p-type region 50P. The APT region may extend under the source/drain regions in the nanostructure-FETs. The APT region may be used to reduce the leakage from the source/drain regions to the substrate 50. In some embodiments, the doping concentration in the APT region is in the range of $10^{18}$ cm$^{-3}$ to $10^{19}$ cm$^{-3}$.

A multi-layer stack 52 is formed over the substrate 50. The multi-layer stack 52 includes alternating first semiconductor layers 54 and second semiconductor layers 56. The first semiconductor layers 54 are formed of a first semiconductor material, and the second semiconductor layers 56 are formed of a second semiconductor material. The semiconductor materials may each be selected from the candidate semiconductor materials of the substrate 50. In the illustrated embodiment, the multi-layer stack 52 includes three layers of each of the first semiconductor layers 54 and the second semiconductor layers 56. It should be appreciated that the multi-layer stack 52 may include any number of the first semiconductor layers 54 and the second semiconductor layers 56. For example, the multi-layer stack 52 may include from one to ten layers of each of the first semiconductor layers 54 and the second semiconductor layers 56.

In the illustrated embodiment, and as will be subsequently described in greater detail, the first semiconductor layers 54 will be removed and the second semiconductor layers 56 will patterned to form channel regions for the nanostructure-FETs in both the n-type region 50N and the p-type region 50P. The first semiconductor layers 54 are sacrificial layers (or dummy layers), which will be removed in subsequent processing to expose the top surfaces and the bottom surfaces of the second semiconductor layers 56. The first semiconductor material of the first semiconductor layers 54 is a material that has a high etching selectivity from the etching of the second semiconductor layers 56, such as silicon germanium. The second semiconductor material of the second semiconductor layers 56 is a material suitable for both n-type and p-type devices, such as silicon.

In another embodiment (not separately illustrated), the first semiconductor layers 54 will be patterned to form channel regions for nanostructure-FETs in one region (e.g., the p-type region 50P), and the second semiconductor layers 56 will be patterned to form channel regions for nanostructure-FETs in another region (e.g., the n-type region 50N). The first semiconductor material of the first semiconductor layers 54 may be a material suitable for p-type devices, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 56 may be a material suitable for n-type devices, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 54 may be removed without removing the second semiconductor layers 56 in the n-type region 50N, and the second semiconductor layers 56 may be removed without removing the first semiconductor layers 54 in the p-type region 50P.

Figure 3:
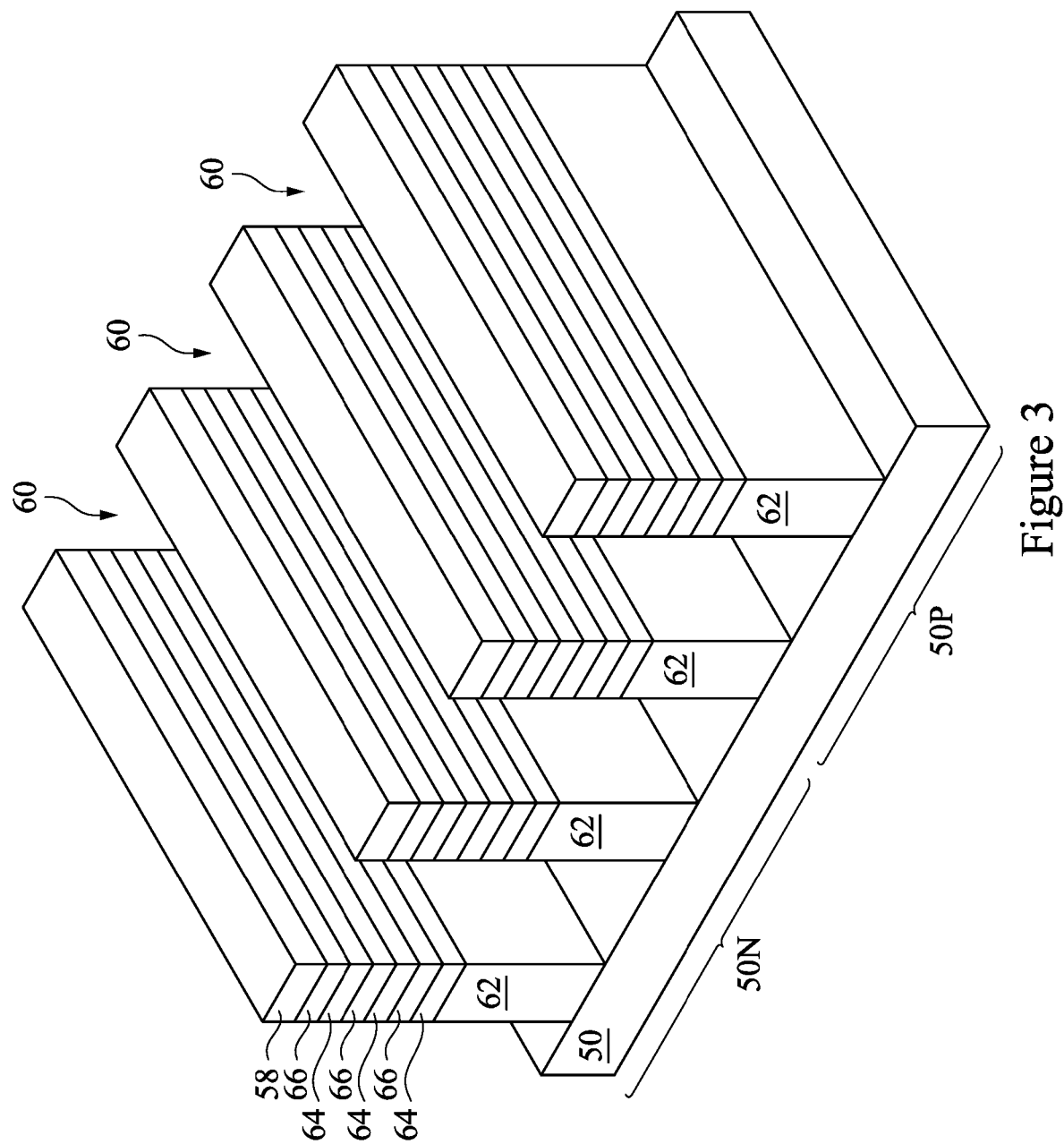

In FIG. 3, trenches 60 are patterned in the substrate 50 and the multi-layer stack 52 to form semiconductor fins 62, nanostructures 64, and nanostructures 66. The semiconductor fins 62 are semiconductor strips patterned in the substrate 50. The nanostructures 64 and the nanostructures 66 include the remaining portions of the first semiconductor layers 54 and the second semiconductor layers 56, respectively. The trenches 60 may be patterned by any acceptable etching process, such as a reactive ion etch (RIE), neutral beam etch (NBE), the like, or a combination thereof. The etching may be anisotropic.

The semiconductor fins 62 and the nanostructures 64, 66 may be patterned by any suitable method. For example, the semiconductor fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as a mask 58 to pattern the semiconductor fins 62 and the nanostructures 64, 66.

In the illustrated embodiment, the semiconductor fins 62 and the nanostructures 64, 66 have substantially equal widths in the n-type region 50N and the p-type region 50P. In another embodiment, the semiconductor fins 62 and the nanostructures 64, 66 in one region (e.g., the n-type region 50N) are wider or narrower than the semiconductor fins 62 and the nanostructures 64, 66 in another region (e.g., the p-type region 50P). Further, while each of the semiconductor fins 62 and the nanostructures 64, 66 are illustrated as having a consistent width throughout, in other embodiments, the semiconductor fins 62 and/or the nanostructures 64, 66 may have tapered sidewalls such that a width of each of the semiconductor fins 62 and/or the nanostructures 64, 66 continuously increases in a direction towards the substrate 50. In such embodiments, each of the nanostructures 64, 66 may have a different width and be trapezoidal in shape.

Figure 4:
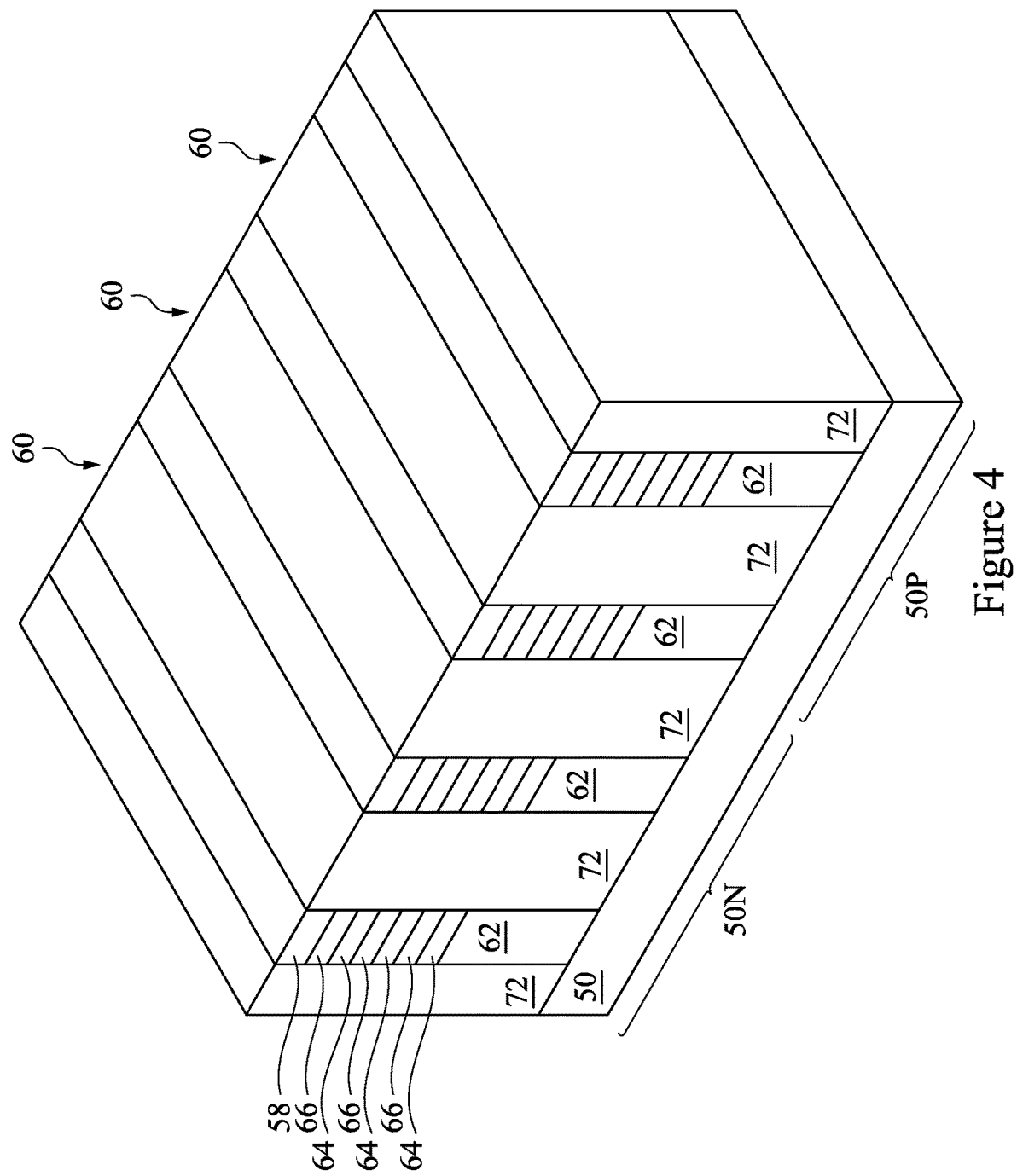

In FIG. 4, an insulation material 72 is formed over the substrate 50 and the nanostructures 64, 66, and in the trenches 60 between adjacent semiconductor fins 62. The insulation material 72 may be an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof. Other insulation materials formed by any acceptable process may be used. In some embodiments, the insulation material 72 is silicon oxide formed by FCVD. An anneal process may be performed once the insulation material 72 is formed. In an embodiment, the insulation material 72 is formed such that excess insulation material 72 covers the nanostructures 64, 66. Although the STI regions 74 are each illustrated as a single layer, some embodiments may utilize multiple layers. For example, in some embodiments a liner (not separately illustrated) may first be formed along surfaces of the substrate 50, the semiconductor fins 62, and the nanostructures 64, 66. Thereafter, an insulation material, such as those previously described may be formed over the liner.

A removal process is then applied to the insulation material 72 to remove excess insulation material 72 outside of the trenches 60, which excess portions are over the nanostructures 64, 66. In some embodiments, a planarization process such as a chemical mechanical polish (CMP), an etch-back process, combinations thereof, or the like may be utilized. In some embodiments, the planarization process may expose the mask 58 or remove the mask 58. After the planarization process, the top surfaces of the insulation material 72 and the mask 58 or the nanostructures 64, 66 are coplanar (within process variations). Accordingly, the top surfaces of the mask 58 (if present) or the nanostructures 64, 66 are exposed through the insulation material 72. In the illustrated embodiment, the mask 58 remains on the nanostructures 64, 66.

Figure 5:
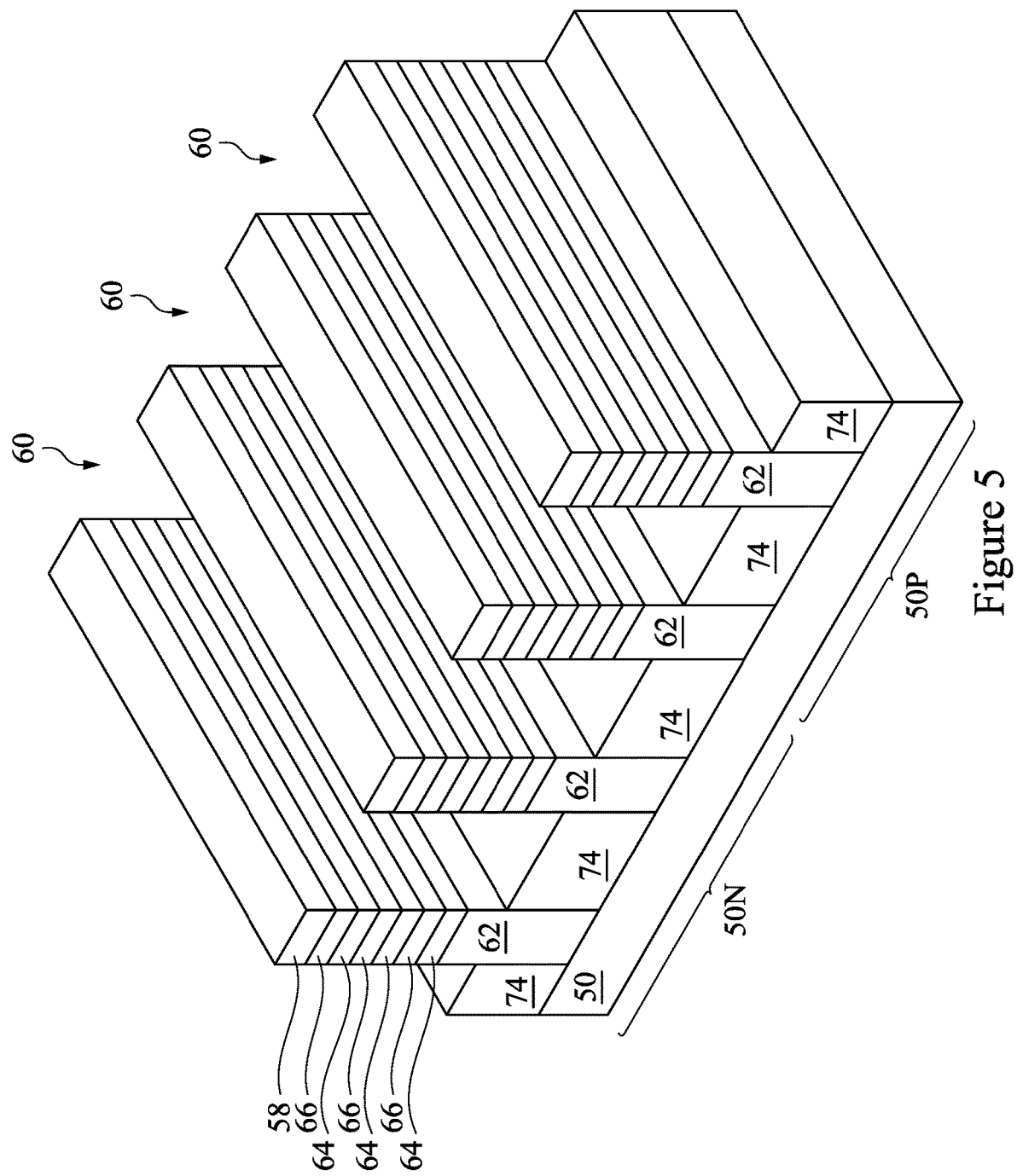

In FIG. 5, the insulation material 72 is recessed to form STI regions 74 over the substrate 50 and in the trenches 60 between adjacent semiconductor fins 62. The STI regions 74 are disposed around at least a portion of the semiconductor fins 62 such that at least a portion of the nanostructures 64, 66 protrude from between adjacent STI regions 74. The insulation material 72 is recessed such that at least a portion of the nanostructures 64, 66 protrude from between adjacent portions of the insulation material 72. In the illustrated embodiment, the top surfaces of the STI regions 74 are below the top surfaces of the semiconductor fins 62. In some embodiments, the top surfaces of the STI regions 74 are above or coplanar (within process variations) with the top surfaces of the semiconductor fins 62. Further, the top surfaces of the STI regions 74 may have a flat surface as illustrated, a convex surface, a concave surface (such as dishing), or a combination thereof by applying an appropriate etch. The insulation material 72 may be recessed using any acceptable etching process, such as one that is selective to the material of the insulation material 72 (e.g., selectively etches the insulation material 72 at a faster rate than the materials of the semiconductor fins 62 and the nanostructures 64, 66). For example, an oxide removal may be performed using dilute hydrofluoric (dHF) acid as an etchant.

The process previously described is just one example of how the semiconductor fins 62 and the nanostructures 64, 66 may be formed. In some embodiments, the semiconductor fins 62 and/or the nanostructures 64, 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the semiconductor fins 62 and/or the nanostructures 64, 66. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together.

Further, appropriate wells (not separately illustrated) may be formed in the nanostructures 64, 66, the semiconductor fins 62, and/or the substrate 50. The wells may have a conductivity type opposite from a conductivity type of source/drain regions that will be subsequently formed in each of the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In embodiments with different well types, different implant steps for the n-type region 50N and the p-type region 50P may be achieved using mask (not separately illustrated) such as a photoresist. For example, a photoresist may be formed over the semiconductor fins 62, the nanostructures 64, 66, and the STI regions 74 in the n-type region 50N. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of $10^{13}$ cm$^{-3}$ to $10^{14}$ cm$^{-3}$. After the implant, the photoresist may be removed, such as by any acceptable ashing process.

Following or prior to the implanting of the p-type region 50P, a mask (not separately illustrated) such as a photoresist is formed over the semiconductor fins 62, the nanostructures 64, 66, and the STI regions 74 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of $10^{13}$ cm$^{-3}$ to $10^{14}$ cm$^{-3}$. After the implant, the photoresist may be removed, such as by any acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the semiconductor fins 62 and/or the nanostructures 64, 66, the grown materials may be in situ doped during growth, which may obviate the implantations, although in situ and implantation doping may be used together.

FIGS. 6A-21C illustrate various additional steps in the manufacturing of embodiment devices. FIGS. 6A-21C illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are explained in the description for each figure.

In FIGS. 6A-6B, sacrificial spacers 78 are formed on the sidewalls of the mask 58 (if present), the semiconductor fins 62 and the nanostructures 64, 66, and further on the top surface of the STI regions 74. The sacrificial spacers 78 may be formed by conformally forming a sacrificial material in the trenches 60 and patterning the sacrificial material. The sacrificial material may be a semiconductor material selected from the candidate semiconductor materials of the substrate 50, which may be grown by a process such as vapor phase epitaxy (VPE) or molecular beam epitaxy (MBE), deposited by a process such as chemical vapor deposition (CVD) or atomic layer deposition (ALD), or the like. For example, the sacrificial material may be silicon or silicon germanium. The sacrificial material may be patterned using an etching process, such as a dry etch, a wet etch, or a combination thereof. The etching process may be anisotropic. As a result of the etching process, the portions of the sacrificial material over the mask 58 (if present) and the nanostructures 64, 66 are removed, and the STI regions 74 between the nanostructures 64, 66 are partially exposed. The sacrificial spacers 78 include the remaining portions of the sacrificial material in the trenches 60.

In subsequent process steps, a dummy gate layer 84 is deposited over portions of the sacrificial spacers 78 (see below, FIGS. 9A-9B), and the dummy gate layer 84 is patterned to form dummy gates 94 (see below, FIGS. 10A-10B). The dummy gates 94, the underlying portions of the sacrificial spacers 78, and the nanostructures 64 are then collectively replaced with functional gate structures. Specifically, the sacrificial spacers 78 are used as temporary spacers during processing to delineate boundaries of insulating fins, and the sacrificial spacers 78 and the nanostructures 64 will be subsequently removed and replaced with gate structures that are wrapped around the nanostructures 66. The sacrificial spacers 78 are formed of a material that has a high etching selectivity from the etching of the material of the nanostructures 66. For example, the sacrificial spacers 78 may be formed of the same semiconductor material as the nanostructures 64 so that the sacrificial spacers 78 and the nanostructures 64 may be removed in a single process step. Alternatively, the sacrificial spacers 78 may be formed of a different material from the nanostructures 66.

Figure 7A:
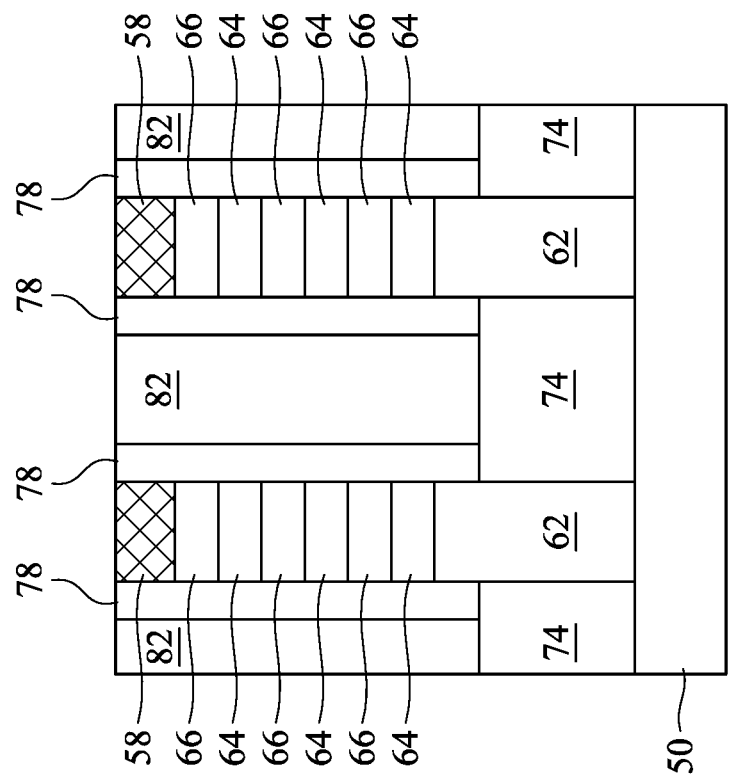
Figure 7B:
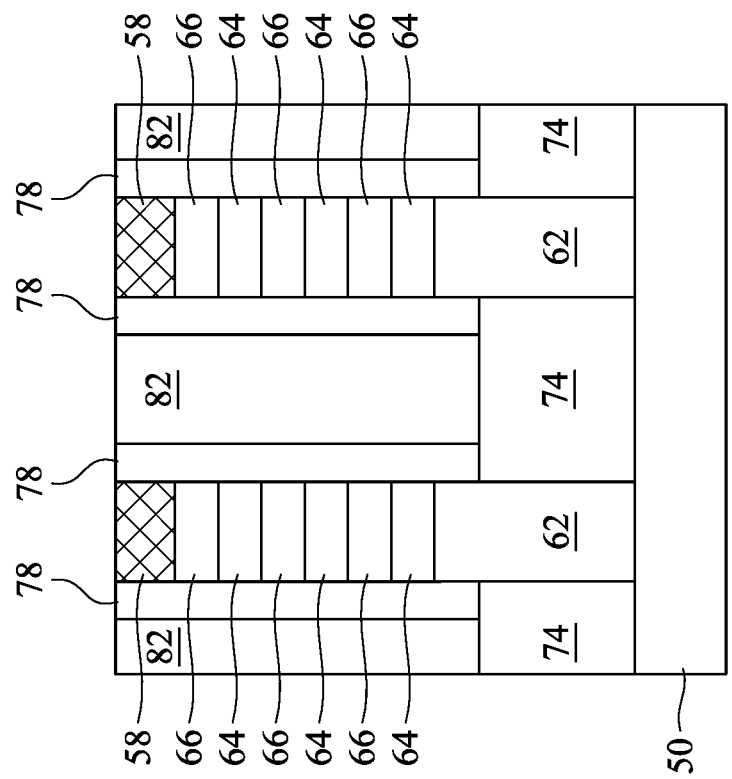

In FIGS. 7A-7B, insulating fins 82 are formed in the trenches 60, between the sacrificial spacers 78 adjacent to the semiconductor fins 62 and nanostructures 64, 66. The insulating fins 82 may insulate and physically separate subsequently formed source/drain regions (see below, FIGS. 15A-15C) from each other. The insulating fins 82 may be formed of a dielectric material such as silicon oxide, silicon nitride, silicon oxynitride, silicon oxycarbonitride, combinations thereof, or the like, which may be formed by a conformal deposition process such as CVD, ALD, or the like. Additionally or alternatively, the insulating fins 82 may be formed of a high-k dielectric material (e.g., dielectric materials having a k-value greater than about 7.0), such as a metal oxide or a silicate of hafnium, aluminum, zirconium, lanthanum, manganese, barium, titanium, lead, combinations thereof, or the like. The material(s) of the insulating fins 82 have a high etching selectivity from the etching of the semiconductor fins 62, the nanostructures 64, 66, and the sacrificial spacers 78.

As an example to form the insulating fins 82, one or more insulating layer(s) for the insulating fins may be formed in the trenches 60. The insulating layer(s) may be conformally deposited over exposed surfaces of the sacrificial spacers 78, the STI regions 74, and the masks 58 (if present) or the nanostructures 64, 66. A removal process may then be performed to remove the excess portions of the insulating layer(s), which excess portions are over the top surfaces of the sacrificial spacers 78 and the masks 58 (if present) or the nanostructures 64, 66. The insulating layer(s), after the removal process, have portions left in the trenches 60 (thus forming the insulating fins 82). In some embodiments, a planarization process such as a chemical mechanical polish (CMP), an etch-back process, combinations thereof, or the like may be utilized. After the planarization process, the top surfaces of the insulating fins 82, the sacrificial spacers 78, and the masks 58 (if present) or the nanostructures 64, 66 are substantially coplanar (within process variations).

Figure 8A:
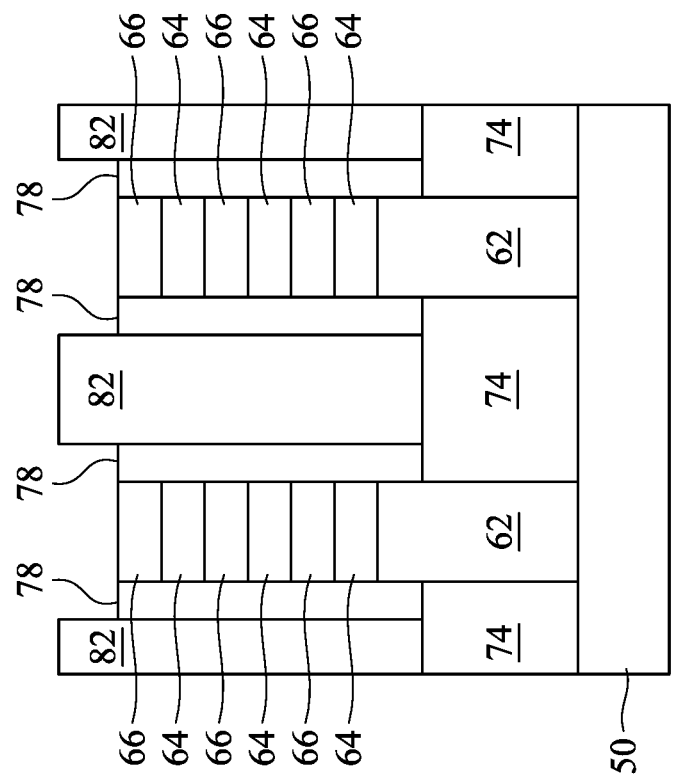
Figure 8B:
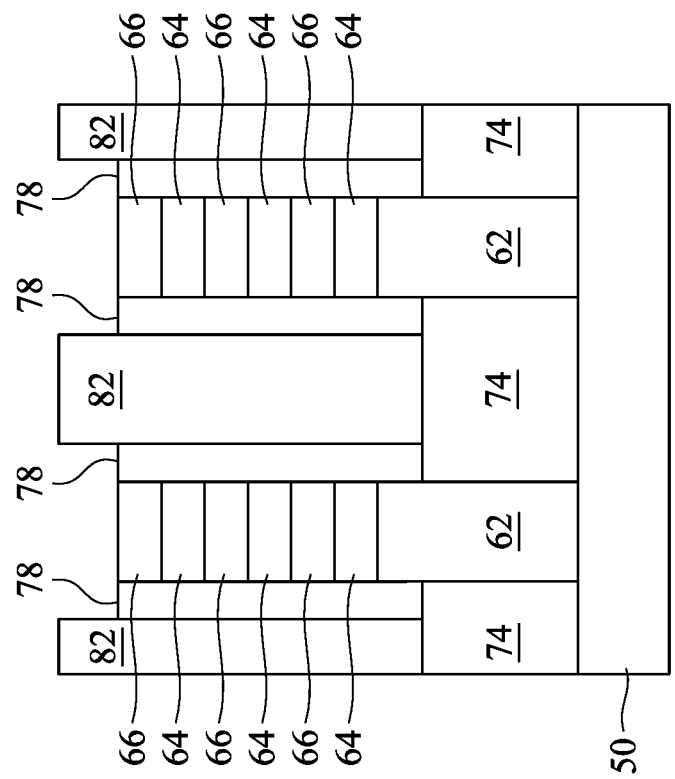

In FIGS. 8A-8B, the mask 58 is optionally removed. The mask 58 may be removed using an etching process, for example. The etching process may be a wet etch that selective removes the mask 58 without significantly etching the insulating fins 82. The etching process may be anisotropic. Further, the etching process (or a separate, selective etching process) may also be applied to reduce a height of the sacrificial spacers 78 to a similar level (e.g., same within processing variations) as the nanostructures 64, 66. After the etching process(es), a top surface of the nanostructures 64, 66 and a top surface of the sacrificial spacers 78 may be exposed and may be lower than a top surface of the insulating fins 82.

Figure 9A:
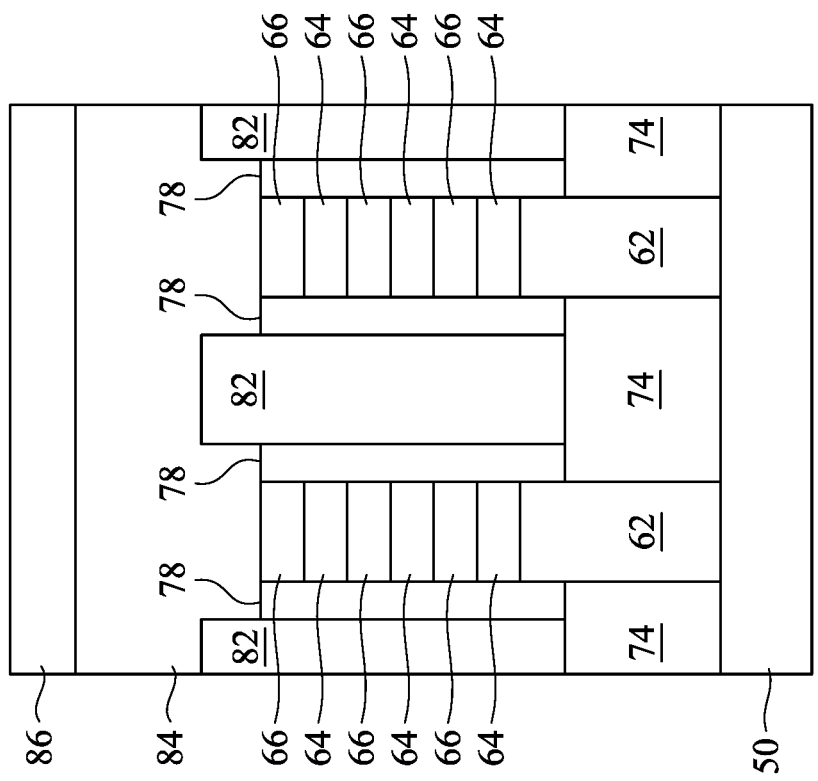
Figure 9B:
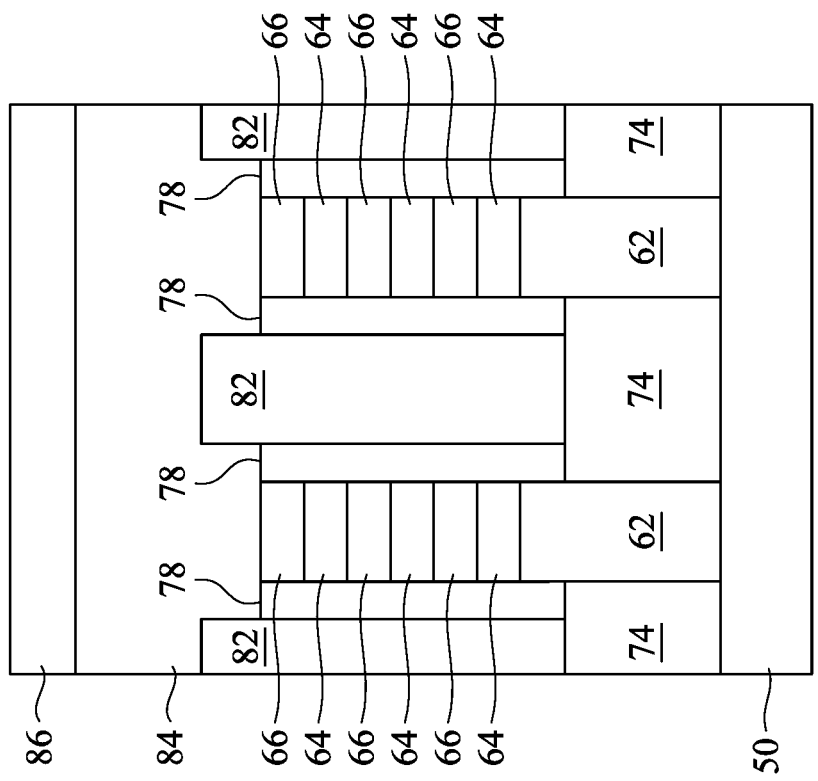

In FIG. 9A-9B, a dummy gate layer 84 is formed on the insulating fins 82, the sacrificial spacers 78, and the nanostructures 64, 66. Because the nanostructures 64, 66 and the sacrificial spacers 78 extend lower than the insulating fins 82, the dummy gate layer 84 may be disposed along exposed sidewalls of the insulating fins 82. The dummy gate layer 84 may be deposited and then planarized, such as by a CMP. The dummy gate layer 84 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 84 may also be formed of a semiconductor material (such as one selected from the candidate semiconductor materials of the substrate 50), which may be grown by a process such as vapor phase epitaxy (VPE) or molecular beam epitaxy (MBE), deposited by a process such as chemical vapor deposition (CVD) or atomic layer deposition (ALD), or the like. The dummy gate layer 84 may be formed of material(s) that have a high etching selectivity from the etching of insulation materials, e.g., the insulating fins 82. A mask layer 86 may be deposited over the dummy gate layer 84. The mask layer 86 may be formed of a dielectric material such as silicon nitride, silicon oxynitride, or the like. In this example, a single dummy gate layer 84 and a single mask layer 86 are formed across the n-type region 50N and the p-type region 50P.

In FIGS. 10A-10C, the mask layer 86 is patterned using acceptable photolithography and etching techniques to form masks 96. The pattern of the masks 96 is then transferred to the dummy gate layer 84 by any acceptable etching technique to form dummy gates 94. The dummy gates 94 cover the top surfaces of the nanostructures 64, 66 that will be exposed in subsequent processing to form channel regions. The pattern of the masks 96 may be used to physically separate adjacent dummy gates 94. The dummy gates 94 may also have lengthwise directions substantially perpendicular (within process variations) to the lengthwise directions of the semiconductor fins 62. The masks 96 can optionally be removed after patterning, such as by any acceptable etching technique.

The dummy gates 94, the sacrificial spacers 78, and the nanostructures 64 collectively extend along the portions of the nanostructures 66 that will be patterned to form channel regions 68. Subsequently formed gate structures will replace the dummy gates 94, the sacrificial spacers 78, and the nanostructures 64. Forming the dummy gates 94 over the sacrificial spacers 78 allows the subsequently formed gate structures to have a greater height.

As noted above, the dummy gates 94 may be formed of a semiconductor material. In such embodiments, the nanostructures 64, the sacrificial spacers 78, and the dummy gates 94 are each formed of semiconductor materials. In some embodiments, the nanostructures 64, the sacrificial spacers 78, and the dummy gates 94 are formed of a same semiconductor material (e.g., silicon germanium), so that during a replacement gate process, the nanostructures 64, the sacrificial spacers 78, and the dummy gates 94 may be removed together in a same etching step. In some embodiments, the nanostructures 64 and the sacrificial spacers 78 are formed of a first semiconductor material (e.g., silicon germanium) and the dummy gates 94 are formed of a second semiconductor material (e.g., silicon), so that during a replacement gate process, the dummy gates 94 may be removed in a first etching step, and the nanostructures 64 and the sacrificial spacers 78 may be removed together in a second etching step. In some embodiments, the nanostructures 64 are formed of a first semiconductor material (e.g., silicon germanium) and the sacrificial spacers 78 and the dummy gates 94 are formed of a second semiconductor material (e.g., silicon), so that during a replacement gate process, the sacrificial spacers 78 and the dummy gates 94 may be removed together in a first etching step, and the nanostructures 64 may be removed in a second etching step.

Gate spacers 98 are formed over the nanostructures 64, 66, and on exposed sidewalls of the masks 96 (if present) and the dummy gates 94. The gate spacers 98 may be formed by conformally depositing one or more dielectric material(s) on the dummy gates 94 and subsequently etching the dielectric material(s). Acceptable dielectric materials may include silicon oxide, silicon nitride, silicon oxynitride, silicon oxycarbonitride, or the like, which may be formed by a conformal deposition process such as CVD, ALD, or the like. Other dielectric materials formed by any acceptable process may be used. Any acceptable etching process, such as a dry etch, a wet etch, the like, or a combination thereof, may be performed to pattern the dielectric material(s). The etching may be anisotropic. The dielectric material(s), when etched, have portions left on the sidewalls of the dummy gates 94 (thus forming the gate spacers 98). After etching, the gate spacers 98 can have curved sidewalls or can have straight sidewalls.

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the semiconductor fins 62 and/or the nanostructures 64, 66 exposed in the p-type region 50P. The mask may then be removed. Subsequently, a mask (not separately illustrated) such as a photoresist may be formed over the p-type region 50P while exposing the n-type region 50N, and appropriate type impurities (e.g., n-type) may be implanted into the semiconductor fins 62 and/or the nanostructures 64, 66 exposed in the n-type region 50N. The mask may then be removed. The n-type impurities may be any of the n-type impurities previously described, and the p-type impurities may be any of the p-type impurities previously described. During the implanting, the channel regions 68 remain covered by the dummy gates 94, so that the channel regions 68 remain substantially free of the impurity implanted to form the LDD regions. The LDD regions may have a concentration of impurities in the range of $10^{15}$ cm$^{-3}$ to $10^{19}$ cm$^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figure 11B:
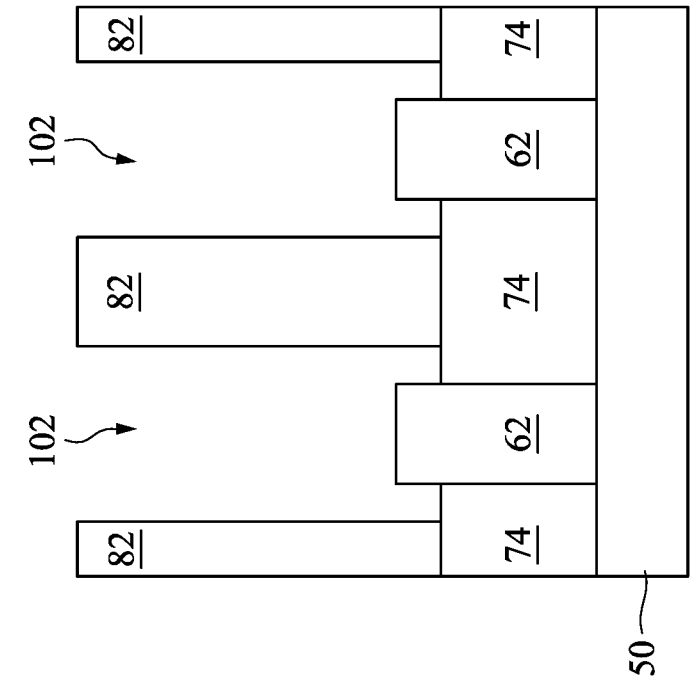
Figure 11A:
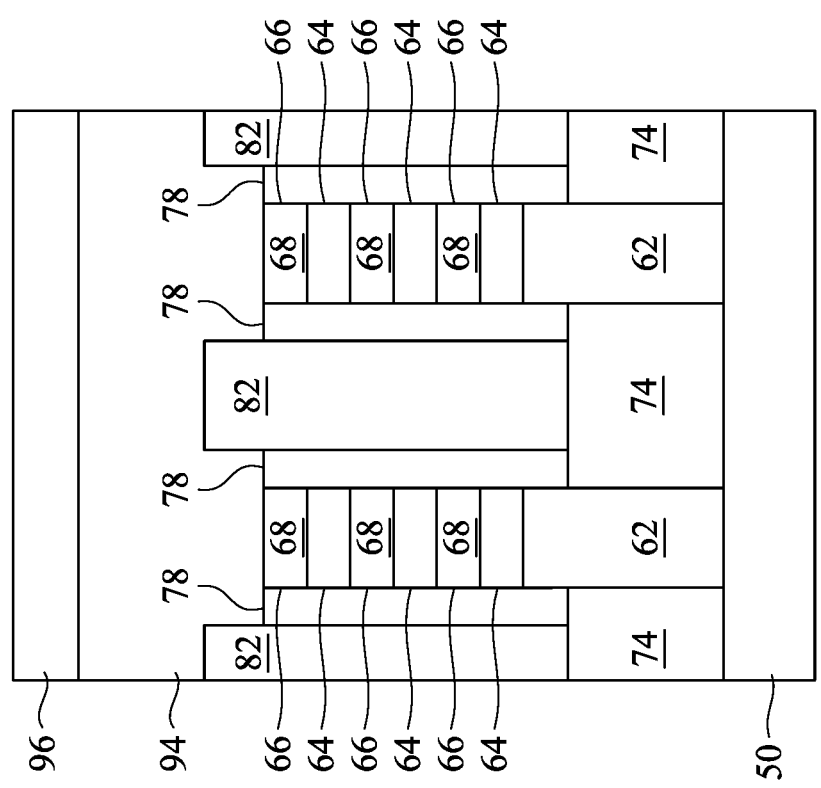
Figure 11C:
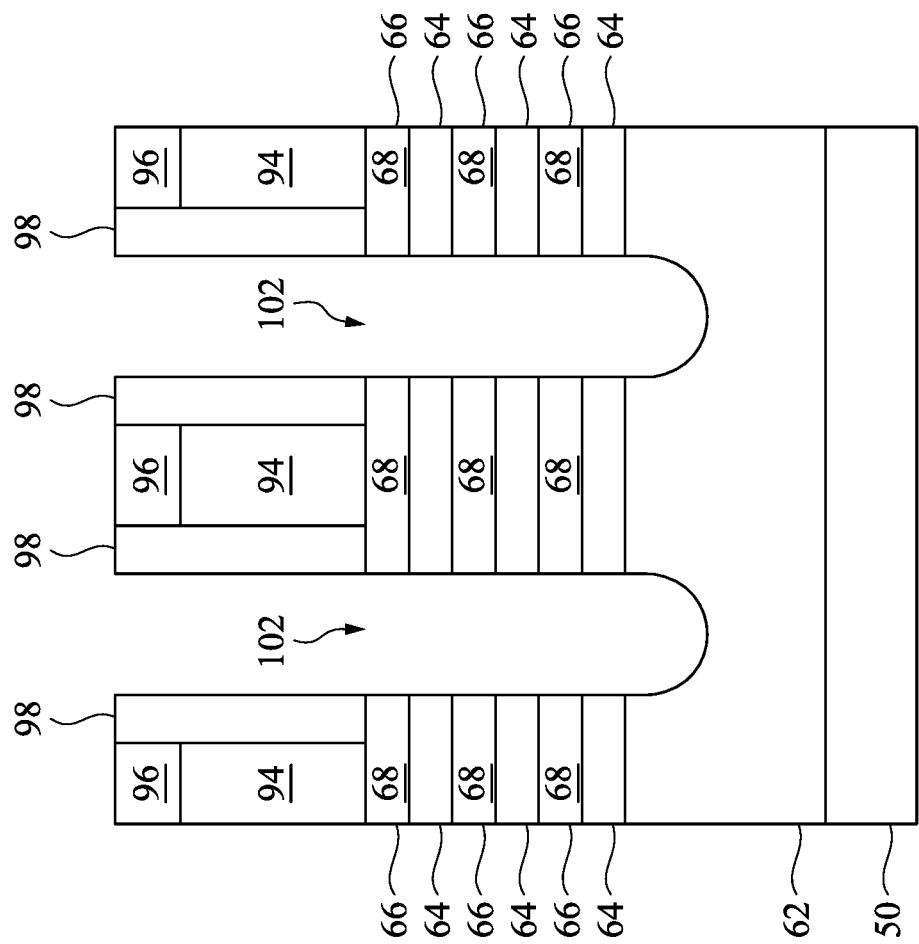

In FIGS. 11A-11C, source/drain recesses 102 are formed in the nanostructures 64, 66 and the sacrificial spacers 78. In the illustrated embodiment, the source/drain recesses 102 extend through the nanostructures 64, 66 and the sacrificial spacers 78 into the semiconductor fins 62. The source/drain recesses 102 may also extend into the substrate 50. In various embodiments, the source/drain recesses 102 may extend to a top surface of the substrate 50 without etching the substrate 50; the semiconductor fins 62 may be etched such that bottom surfaces of the source/drain recesses 102 are disposed below the top surfaces of the STI regions 74; or the like. The source/drain recesses 102 may be formed by etching the nanostructures 64, 66 and the sacrificial spacers 78 using an anisotropic etching process, such as a RIE, a NBE, or the like. The gate spacers 98 and the dummy gates 94 collectively mask portions of the semiconductor fins 62 and/or the nanostructures 64, 66 during the etching processes used to form the source/drain recesses 102. A single etching process may be used to etch each of the nanostructures 64, 66 and the sacrificial spacers 78, or multiple etching processes may be used to etch the nanostructures 64, 66 and the sacrificial spacers 78. Timed etching processes may be used to stop the etching of the source/drain recesses 102 after the source/drain recesses 102 reach a desired depth.

Figure 12C:
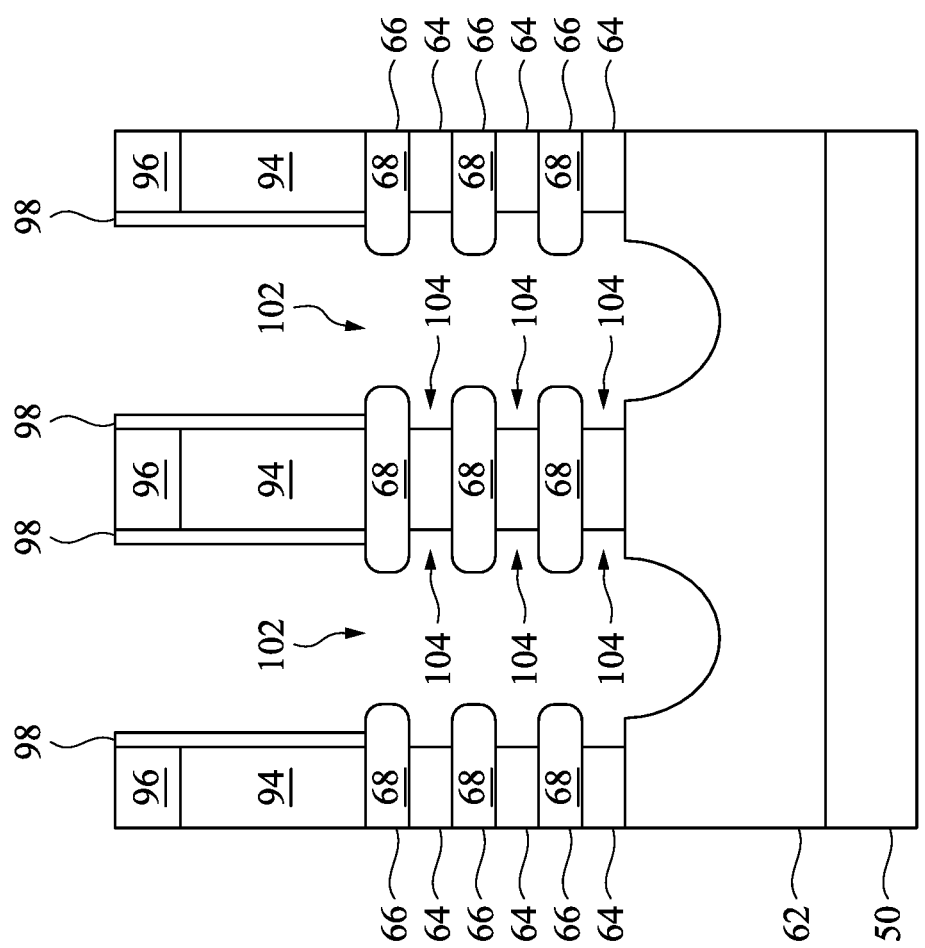

In FIGS. 12A-12C, the source/drain recesses 102 are laterally expanded to form sidewall recesses 104 in the source/drain recesses 102. Specifically, portions of the sidewalls of the nanostructures 64 exposed by the source/drain recesses 102 are recessed. Although sidewalls of the nanostructures 64 are illustrated as being straight, the sidewalls may be concave or convex. The sidewalls may be recessed by any acceptable etching process, such as one that is selective to the material of the nanostructures 64 (e.g., selectively etches the material of the nanostructures 64 at a faster rate than the material of the nanostructures 66). The etching may be isotropic. For example, when the nanostructures 66 are formed of silicon and the nanostructures 64 are formed of silicon germanium, the etching process may be a wet etch using tetramethylammonium hydroxide (TMAH), ammonium hydroxide (NH$_4$OH), or the like. In another embodiment, the etching process may be a dry etch using a fluorine-based gas such as hydrogen fluoride (HF) gas. In some embodiments, the same etching process may be continually performed to both form the source/drain recesses 102 and recess the sidewalls of the nanostructures 64.

In some embodiments, the widths of the gate spacers 98 are reduced, such as by the etching process used to form and/or expand the source/drain recesses 102. Further, the sidewalls of the nanostructures 66 and the top surfaces of the semiconductor fins 62 may be etched by the etching process used to form and/or expand the source/drain recesses 102. In some embodiments, the sidewalls of the nanostructures 66 and the semiconductor fins 62 are rounded convex sidewalls after the source/drain recesses 102 are expanded. The depths of the source/drain recesses 102 may also be increased when the semiconductor fins 62 are etched. For example, the source/drain recesses 102 may be extended further into the semiconductor fins 62 and/or may be extended into the STI regions 74. More specifically, the source/drain recesses 102 may be extended into the STI regions 74 and beneath the insulating fins 82, such that the bottom surfaces of the insulating fins 82 are exposed by the source/drain recesses 102.

Figure 13C:
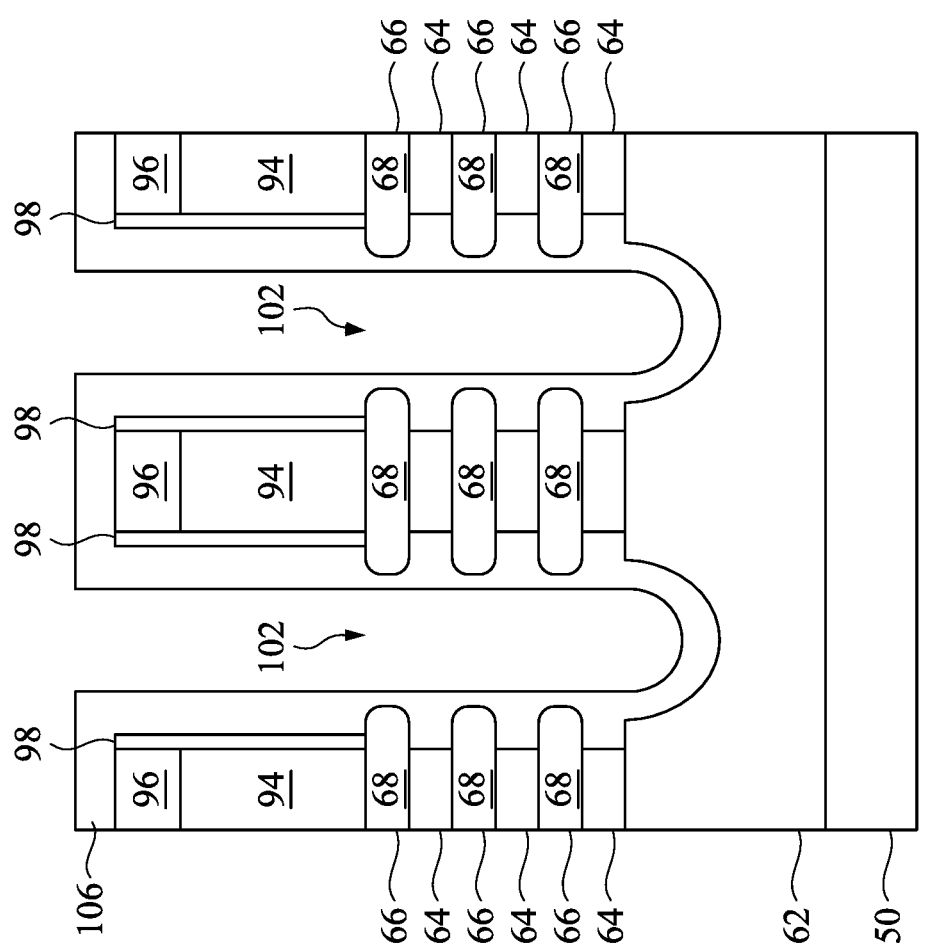

In FIGS. 13A-13C, a spacer layer 106 is deposited in the sidewall recesses 104 and the source/drain recesses 102 (see FIGS. 12A-12C). The spacer layer 106 is also deposited on the top surfaces and the sidewalls of the insulating fins 82, the top surfaces of the STI regions 74, the top surfaces and the sidewalls of the gate spacers 98, and the top surfaces of the masks 96 (if present) or the dummy gates 94. The spacer layer 106 may be formed of a dielectric material such as silicon nitride, silicon oxynitride, silicon oxycarbonitride, or the like, which may be deposited by a conformal deposition process, such as ALD, CVD, or the like. A low-k dielectric material (e.g., dielectric materials having a k-value less than about 3.5) may be utilized. Other insulation materials formed by any acceptable process may be used.

Figure 14C:
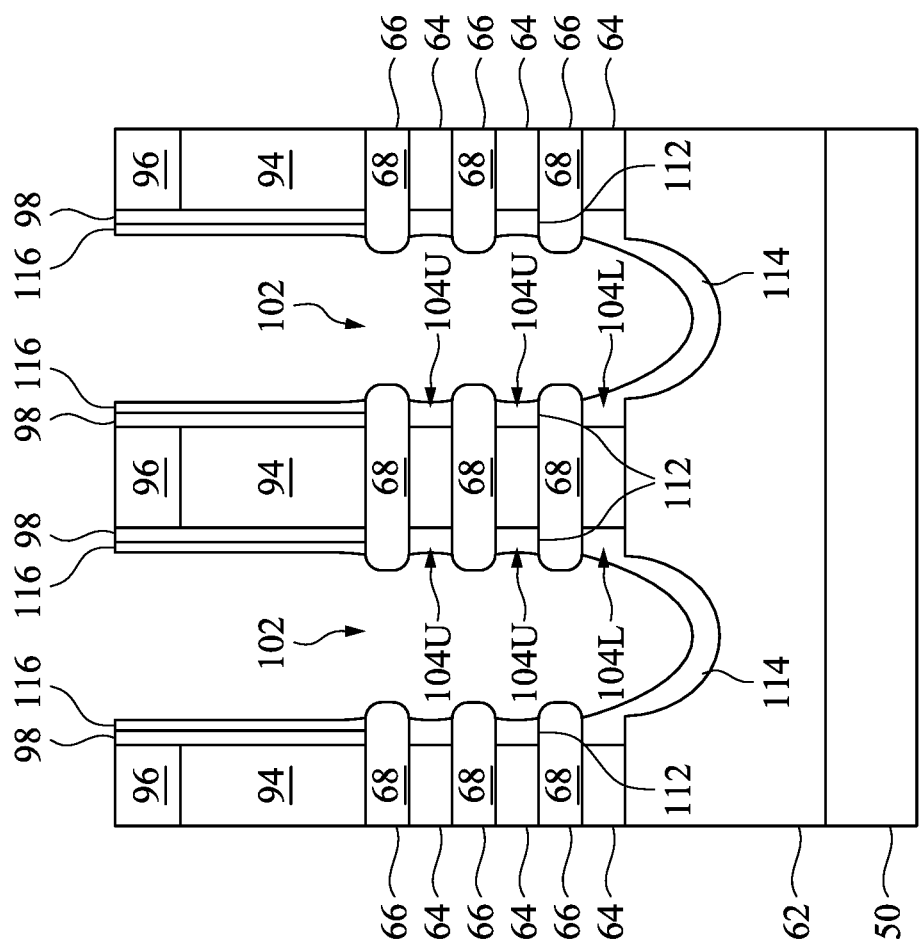

In FIGS. 14A-14C, the spacer layer 106 is patterned to form inner spacers 112 and bottom spacers 114. The inner spacers 112 are disposed in some or all of the sidewall recesses 104 (see FIGS. 12A-12C). The bottom spacers 114 are disposed at the bottoms of the source/drain recesses 102. In some embodiments, patterning the spacer layer 106 also forms gate spacers 116 on the sidewalls of the gate spacers 98.

The inner spacers 112 are disposed on the sidewalls of the remaining portions of the nanostructures 64, e.g., those sidewalls exposed by the sidewall recesses 104. As will be subsequently described in greater detail, source/drain regions will be subsequently formed in the source/drain recesses 102, and the nanostructures 64 will be subsequently replaced with corresponding gate structures. The inner spacers 112 act as isolation features between the subsequently formed source/drain regions and the subsequently formed gate structures. Further, the inner spacers 112 may be used to substantially prevent damage to the subsequently formed source/drain regions by subsequent etching processes, such as etching processes used to subsequently remove the nanostructures 64. Although outer sidewalls of the inner spacers 112 are illustrated as being flush with respect to the sidewalls of the gate spacers 116, the outer sidewalls of the inner spacers 112 may extend beyond or be recessed from the sidewalls of the gate spacers 116 (if present) or the gate spacer 98. The inner spacers 112 may partially fill, completely fill, or overfill the sidewall recesses 104. Moreover, although the sidewalls of the inner spacers 112 are illustrated as being concave, the sidewalls of the inner spacers 112 may be straight or convex.

The bottom spacers 114 are disposed on the top surfaces and the sidewalls of the semiconductor fins 62, the top surfaces of the STI regions 74, and the sidewalls of the insulating fins 82 in the source/drain recesses 102. In this embodiment, the bottom spacers 114 cover the top surfaces and also the sidewalls of the semiconductor fins 62 in the source/drain recesses 102. In other embodiments (subsequently described), the bottom spacers 114 cover the top surfaces of the semiconductor fins 62 in the source/drain recesses 102, but the sidewalls of the semiconductor fins 62 in the source/drain recesses 102 remain uncovered by the bottom spacers 114. As will be subsequently described in greater detail, source/drain regions will be subsequently formed in the source/drain recesses 102. The bottom spacers 114 act as isolation features between the subsequently formed source/drain regions and the semiconductor fins 62. In this embodiment, the bottom spacers 114 are in directly physical contact with the semiconductor fins 62. In other embodiments (subsequently described), semiconductor layers are formed between the bottom spacers 114 and the semiconductor fins 62, to help further increase the isolation between the subsequently formed source/drain regions and the semiconductor fins 62.

The bottom spacers 114 are different from the inner spacers 112. In this embodiment, the bottom spacers 114 are also disposed in the lower sidewall recesses 104L. As such, a bottom spacer 114 extends continuously between the lower sidewall recesses 104L in a source/drain recess 102. The lower sidewall recesses 104L are those sidewall recesses 104 that are closest to the semiconductor fins 62 such that they are at least partially defined by the top surfaces of the semiconductor fins 62. The inner spacers 112 are disposed in the upper sidewall recesses 104U. The upper sidewall recesses 104U are those sidewall recesses 104 other than the lower sidewall recesses 104L. In other embodiments (subsequently described), the inner spacers 112 are disposed in all of the sidewall recesses 104 (including the lower sidewall recesses 104L and the upper sidewall recesses 104U).

The spacer layer 106 may be patterned by any acceptable etch process, such as a reactive ion etch (RIE), neutral beam etch (NBE), the like, or a combination thereof. The etching may be isotropic, anisotropic, or a combination of isotropic and anisotropic. In some embodiments, the etch is an isotropic wet etch performed using potassium hydroxide (KOH), tetramethylammonium hydroxide (TMAH), ethylenediamine pyrocatechol (EDP), the like, or combinations thereof as an etchant. In some embodiments, the etch is an anisotropic dry etch performed using carbon tetrafluoride ($CF_4$), fluoromethane ($CH_3F$), hydrogen bromide (HBr), oxygen ($O_2$), helium (He), argon (Ar), the like, or combinations thereof as an etchant while generating a plasma with a bias power. In some embodiments, the etch is an isotropic dry etch performed using nitrogen trifluoride ($NF_3$), chlorine ($Cl_2$), hydrogen ($H_2$), argon (Ar), helium (He) the like, or combinations thereof as an etchant without generating a plasma. In some embodiments, the etch is a combination of these processes.

The amount of etching that is performed on the spacer layer 106 determines the thickness of the bottom spacers 114, whether the gate spacers 116 are formed, and whether or not the bottom spacers 114 are formed in the lower sidewall recesses 104L. In this embodiment, a small amount of etching is performed, so that the bottom spacers 114 have a large thickness (subsequently described), the gate spacers 116 are formed, and the bottom spacers 114 are formed in the lower sidewall recesses 104L. In other embodiments (subsequently described), a large amount of etching is performed, so that the gate spacers 116 are not formed and the bottom spacers 114 are not formed in the lower sidewall recesses 104L. The amount of etching may be determined by the pitch between adjacent dummy gates 94, where a smaller pitch causes less etching due to crowding. In this embodiment, the pitch between adjacent dummy gates 94 is small, causing a small amount of etching to be performed. For example, the pitch between adjacent dummy gates 94 may be in the range of 30 nm to 70 nm. In other embodiments (subsequently described), the pitch between adjacent dummy gates 94 is large, causing a large amount of etching to be performed.

The bottom spacers 114 may be formed by other processes. In other embodiments (subsequently described), the bottom spacers 114 are formed after the inner spacers 112, by depositing and patterning an additional spacer layer. In such embodiments, additional features such as semiconductor layers may be formed beneath the bottom spacers 114, to help reduce contouring at the bottom of the source/drain recesses 102

Figure 15B:
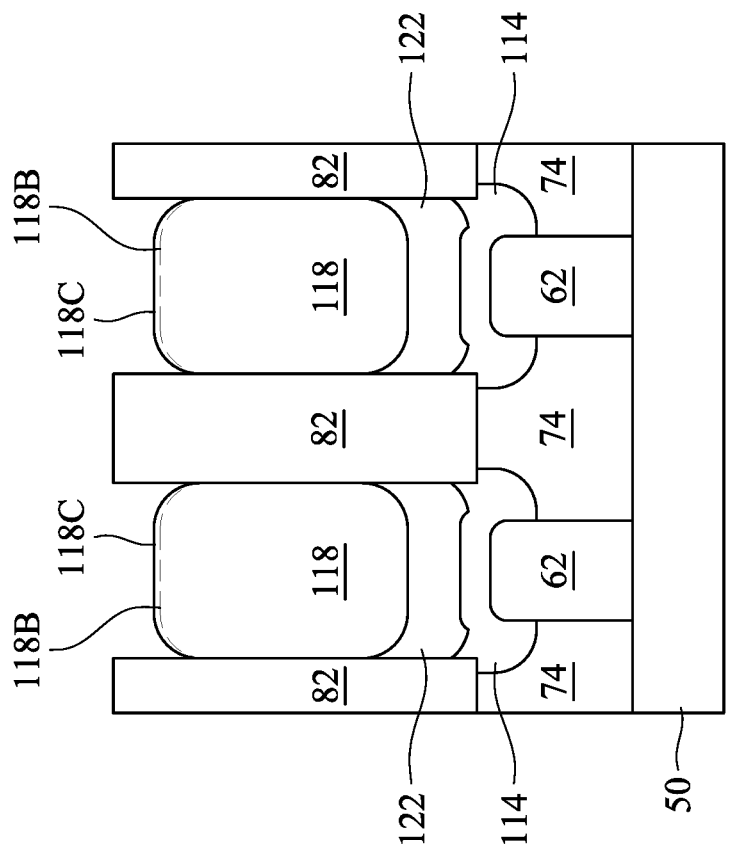
Figure 15A:
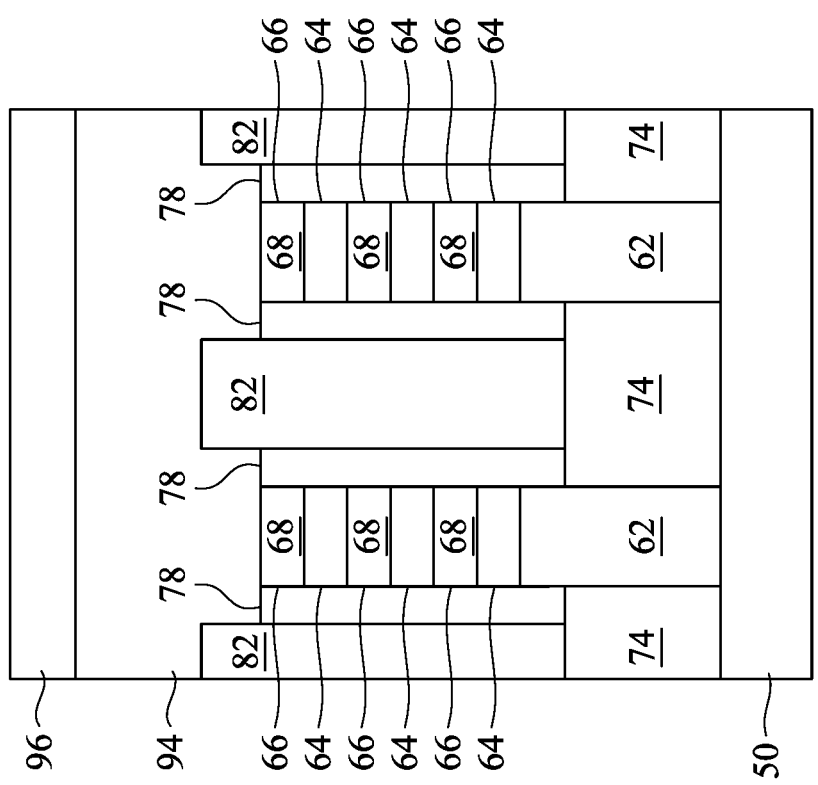
Figure 15C:
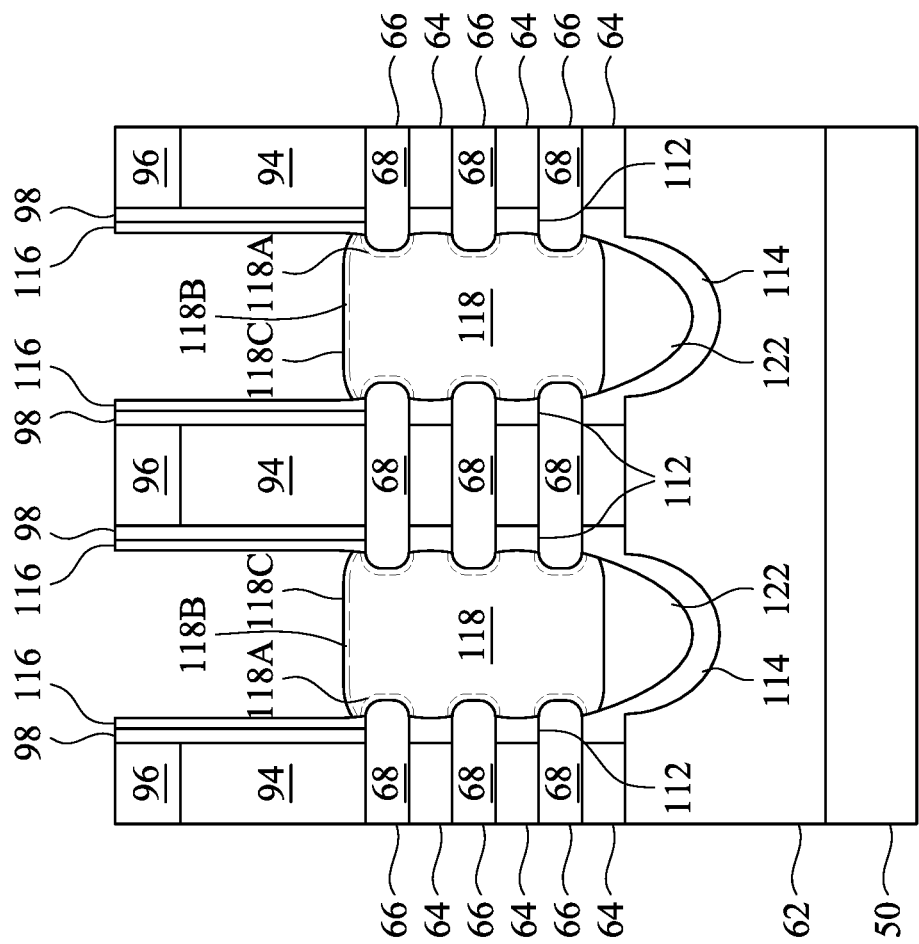

In FIGS. 15A-15C, epitaxial source/drain regions 118 are formed in the source/drain recesses 102. The epitaxial source/drain regions 118 are formed in the source/drain recesses 102 such that each dummy gate 94 (and corresponding channel region 68) is disposed between respective adjacent pairs of the epitaxial source/drain regions 118. In some embodiments, the gate spacers 98, the inner spacers 112, and the gate spacers 116 (if present) are used to separate the epitaxial source/drain regions 118 from, respectively, the dummy gates 94 and the nanostructures 64 by an appropriate lateral distance so that the epitaxial source/drain regions 118 do not short out with subsequently formed gates of the resulting nanostructure-FETs. A material of the epitaxial source/drain regions 118 may be selected to exert stress in the respective channel regions 68, thereby improving performance.

The epitaxial source/drain regions 118 in the n-type region 50N may be formed by masking the p-type region 50P. Then, the epitaxial source/drain regions 118 in the n-type region 50N are epitaxially grown in the source/drain recesses 102 in the n-type region 50N. The epitaxial source/drain regions 118 may include any acceptable material appropriate for n-type devices. For example, if the nanostructures 66 are silicon, the epitaxial source/drain regions 118 in the n-type region 50N may include materials exerting a tensile strain on the channel regions 68, such as silicon, silicon carbide, phosphorous-doped silicon carbide, silicon phosphide, or the like. The epitaxial source/drain regions 118 in the n-type region 50N may be referred to as "n-type source/drain regions." The epitaxial source/drain regions 118 in the n-type region 50N may have surfaces raised from respective surfaces of the semiconductor fins 62 and the nanostructures 64, 66, and may have facets.

The epitaxial source/drain regions 118 in the p-type region 50P may be formed by masking the n-type region 50N. Then, the epitaxial source/drain regions 118 in the p-type region 50P are epitaxially grown in the source/drain recesses 102 in the p-type region 50P. The epitaxial source/drain regions 118 may include any acceptable material appropriate for p-type devices. For example, if the nanostructures 66 are silicon, the epitaxial source/drain regions 118 in the p-type region 50P may include materials exerting a compressive strain on the channel regions 68, such as silicon germanium, boron-doped silicon germanium, germanium, germanium tin, or the like. The epitaxial source/drain regions 118 in the p-type region 50P may be referred to as "p-type source/drain regions." The epitaxial source/drain regions 118 in the p-type region 50P may have surfaces raised from respective surfaces of the semiconductor fins 62 and the nanostructures 64, 66, and may have facets.

The epitaxial source/drain regions 118, the nanostructures 64, 66, and/or the semiconductor fins 62 may be implanted with impurities to form source/drain regions, similar to the process previously described for forming LDD regions, followed by an anneal. The source/drain regions may have an impurity concentration in the range of $10^{19}$ cm$^{-3}$ to $10^{21}$ cm$^{-3}$. The n-type and/or p-type impurities for source/drain regions may be any of the impurities previously described. In some embodiments, the epitaxial source/drain regions 118 may be in situ doped during growth.

As a result of the epitaxy processes used to form the epitaxial source/drain regions 118, upper surfaces of the epitaxial source/drain regions 118 have facets which expand laterally outward beyond sidewalls of the semiconductor fins 62 and the nanostructures 64, 66. However, the insulating fins 82 block the lateral epitaxial growth. Therefore, adjacent epitaxial source/drain regions 118 remain separated after the epitaxy process is completed as illustrated by FIG. 15B. The epitaxial source/drain regions 118 may contact the sidewalls of the insulating fins 82. In the illustrated embodiment, the epitaxial source/drain regions 118 are grown so that the upper surfaces of the epitaxial source/drain regions 118 are disposed below the top surfaces of the insulating fins 82. In various embodiments, the upper surfaces of the epitaxial source/drain regions 118 are disposed above the top surfaces of the insulating fins 82; the upper surfaces of the epitaxial source/drain regions 118 have portions disposed above and below the top surfaces of the insulating fins 82; or the like.

The epitaxial source/drain regions 118 include multiple semiconductor material layers. Specifically, each epitaxial source/drain region 118 includes a liner layer 118A, a main layer 118B, and (optionally) a finishing layer 118C (or more generally, first, second, and third epitaxial layers). Other quantities of semiconductor material layers may be used for the epitaxial source/drain regions 118. The liner layers 118A are grown in the source/drain recesses 102. The main layers 118B are grown on the liner layers 118A. The finishing layers 118C (if present) are grown on the main layers 118B. Each of the liner layer 118A, the main layer 118B, and the finishing layer 118C may be formed of different semiconductor materials and may be doped (e.g., with a p-type or an n-type impurity) to different dopant concentrations. In some embodiments, the main layers 118B have a greater impurity concentration than the finishing layers 118C, and the finishing layers 118C have a greater impurity concentration than the liner layers 118A. Forming the liner layers 118A with a lesser impurity concentration than the main layers 118B may increase adhesion in the source/drain recesses 102, and forming the finishing layers 118C with a lesser impurity concentration than the main layers 118B may reduce out-diffusion of dopants from the main layers 118B in subsequent processing.

The epitaxy processes used to form the epitaxial source/drain regions 118 are performed so that the epitaxial source/drain regions 118 are selectively grown from semiconductor features (e.g., the semiconductor fins 62 and the nanostructures 66) and do not grow from dielectric features (e.g., the inner spacers 112 or the bottom spacers 114). The epitaxial source/drain regions 118 may be grown by flowing a semiconductor-containing precursor, an etchant-containing precursor, and a dopant-containing precursor in the source/drain recesses 102. The semiconductor-containing precursor may be a silicon-containing precursor such as a silane, such as monosilane ($SiH_4$), dichlorosilane ($H_2SiCl_2$), disilane ($Si_2H_6$), or the like. The etchant-containing precursor may be a chlorine-containing precursor such as hydrogen chloride (HCl) gas, chlorine ($Cl_2$) gas, or the like. The dopant-containing precursor may be a phosphorous-containing precursor such as diphosphine ($P_2H_6$), phosphorus trichloride ($PCl_3$), or the like when growing p-type source/drain regions, and may be an arsenic-containing precursor such as arsine ($AsH_3$) or the like when growing n-type source/drain regions. The etchant-containing precursor is flowed at a high flow rate, which helps increase epitaxial growth from semiconductor features and reduce epitaxial growth from dielectric features. In some embodiments, the semiconductor-containing precursor is flowed at a flow rate in the range of 5 sccm to 2000 sccm, and the etchant-containing precursor is flowed at a flow rate in the range of 5 sccm to 2000 sccm. The flow rate of the dopant-containing precursor may controlled depending on the dopant concentration of the epitaxial layer being grown, with a higher dopant-containing precursor flow rate being utilized when a higher dopant concentration is desired. In some embodiments, the epitaxial growth is performed at a temperature in the range of 400° C. to 800° C., and at a pressure in the range of 1 Torr to 760 Torr.

As noted above, the bottom spacers 114 cover at least the top surfaces and the sidewalls of the semiconductor fins 62 in the source/drain recess 102. As a result, most of the epitaxial growth occurs from the nanostructures 66, and little to no epitaxial growth occurs from the semiconductor fins 62. In this embodiment, the liner layers 118A are only grown on the nanostructures 66. In other embodiments (subsequently described), the liner layers 118A are grown from some but not all portions of the semiconductor fins 62 in the source/drain recess 102. The main layers 118B are grown on the liner layers 118A, and are grown until the portions of the main layers 118B in each source/drain recess 102 merge. Thus, the main layers 118B cover portions of some dielectric features (e.g., the inner spacers 112 or the bottom spacers 114), even though the main layers 118B are not grown from dielectric features. The bottom spacers 114 are beneath the epitaxial source/drain regions 118 and separate the epitaxial source/drain regions 118 from at least the top surfaces of the semiconductor fins 62 in the source/drain recess 102. The bottom spacers 114 reduce the electrical coupling between the semiconductor fins 62 and the epitaxial source/drain regions 118. Reducing electrical coupling between the semiconductor fins 62 and the epitaxial source/drain regions 118 may help reduce the leakage current of the resulting devices. Specifically, the operation of parasitic channel regions of the semiconductor fins 62 may be avoided.

Because most of the epitaxial growth occurs from the nanostructures 66, growth of the main layers 118B occurs in directions radiating out from the liner layers 118A. In some embodiments, the main layers 118B merge in the upper portions of the source/drain recesses 102 before the lower portions of the source/drain recesses 102 are filled. As a result, gaps 122 are formed beneath the epitaxial source/drain regions 118. Specifically, the gaps 122 are between the epitaxial source/drain regions 118 and the bottom spacers 114. The gaps 122 include the lower portions of the source/drain recesses 102 that are not filled by the epitaxial source/drain regions 118. The gaps 122 may be voids beneath the epitaxial source/drain regions 118 that are at a vacuum, filled with air, filled with an inert gas, or the like. Forming the gaps 122 may further reduce electrical coupling between the semiconductor fins 62 and the epitaxial source/drain regions 118 by blocking leakage currents. Additionally, epitaxial source/drain regions 118 have a decreased volume when the gaps 122 are present. Reducing the volume of the epitaxial source/drain regions 118 may help reduce the parasitic capacitance of the resulting devices.

Figure 16C:
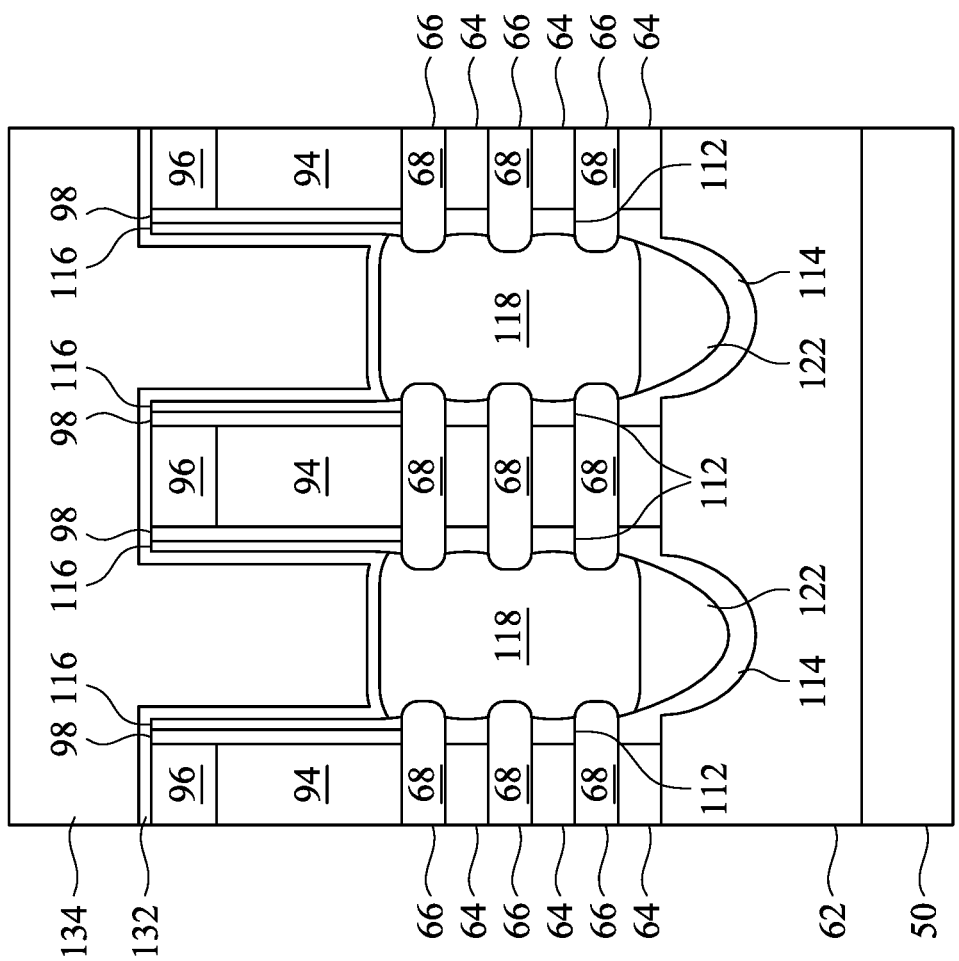

In FIGS. 16A-16C, a first ILD 134 is deposited over the epitaxial source/drain regions 118, the gate spacers 116 (if present), the gate spacers 98, and the masks 96 (if present) or the dummy gates 94. The first ILD 134 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other dielectric materials formed by any acceptable process may be used.

In some embodiments, a contact etch stop layer (CESL) 132 is formed between the first ILD 134 and the epitaxial source/drain regions 118, the gate spacers 116 (if present), the gate spacers 98, and the masks 96 (if present) or the dummy gates 94. The CESL 132 may be formed of a dielectric material having a high etching selectivity from the etching of the first ILD 134, such as silicon nitride, silicon oxide, silicon oxynitride, or the like, which may be formed by any suitable method, such as CVD, ALD, or the like.

Figure 17B:
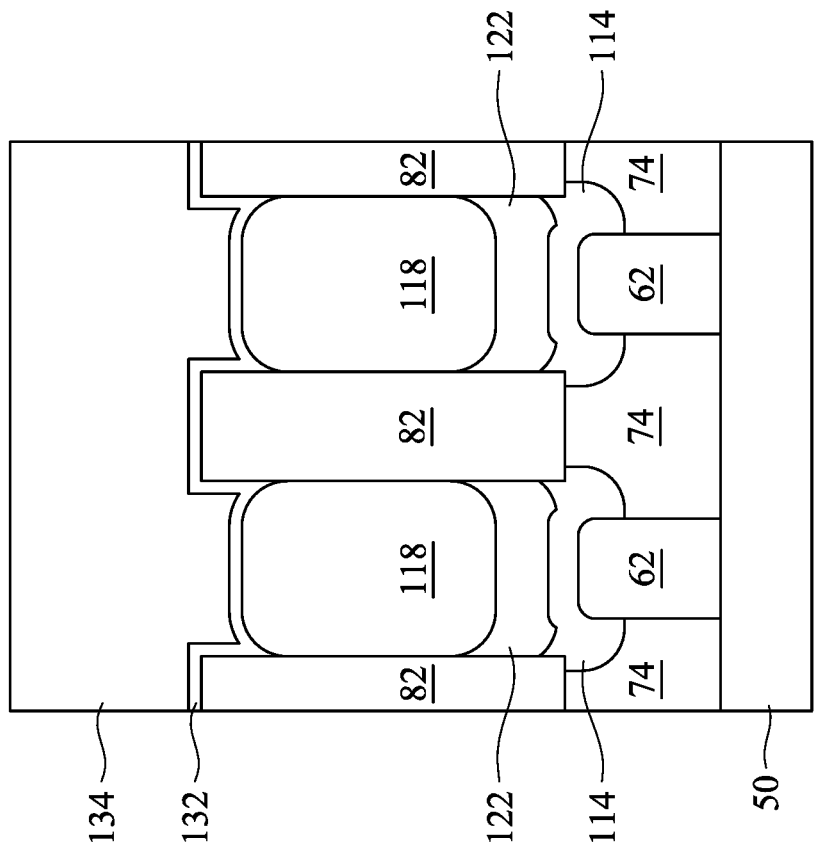
Figure 17A:
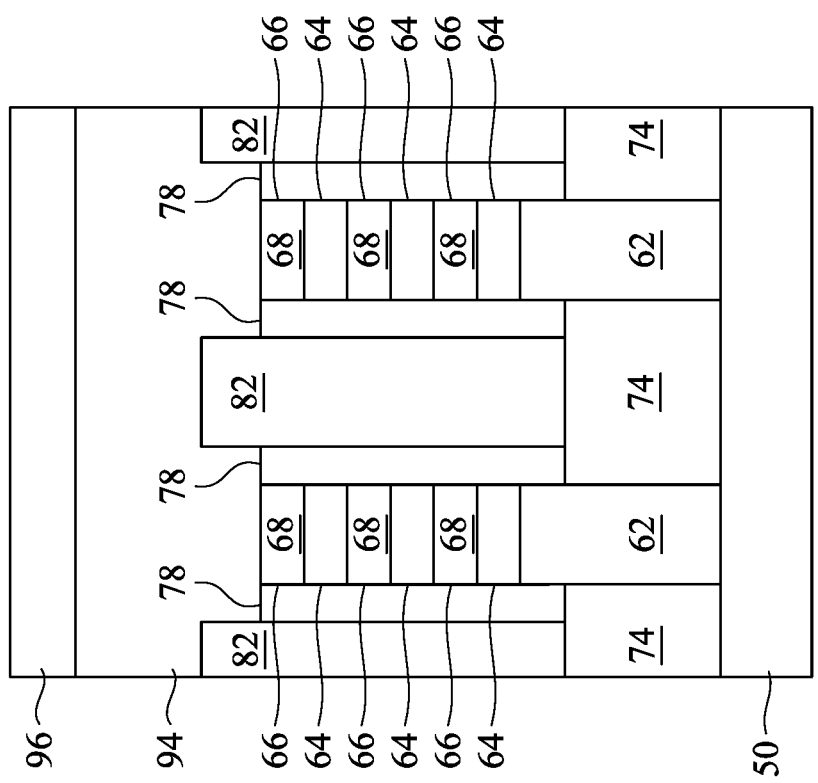
Figure 17C:
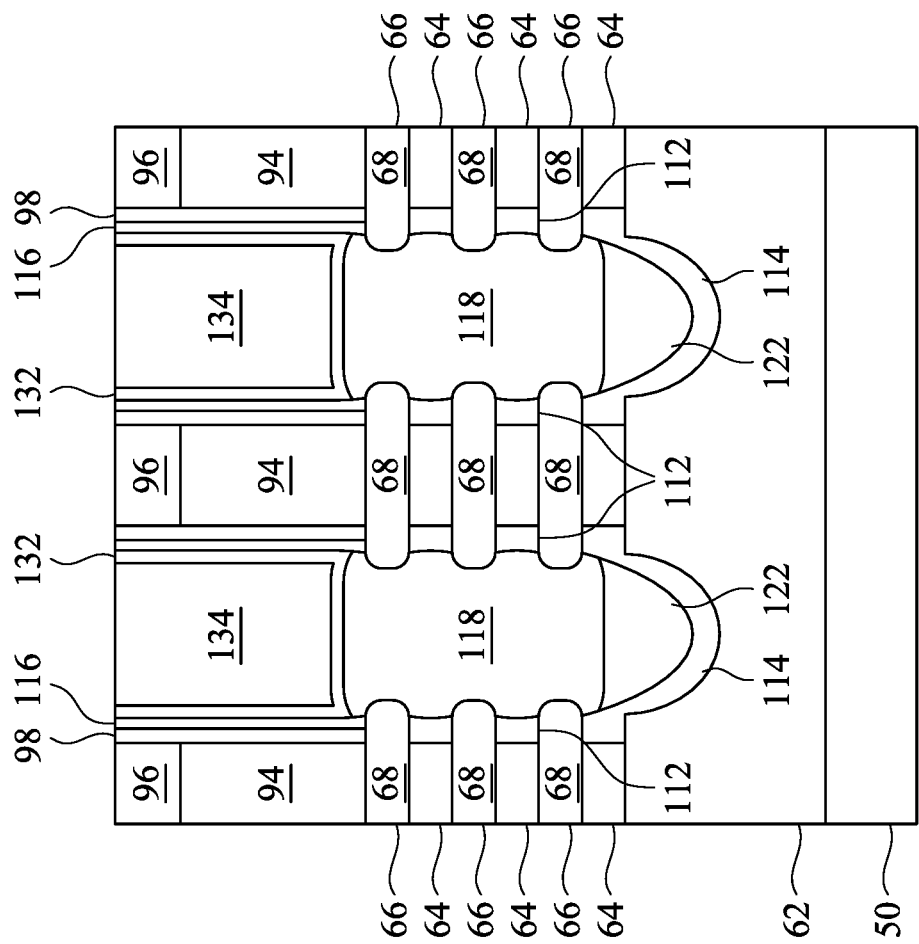

In FIGS. 17A-17C, a removal process is performed to level the top surfaces of the first ILD 134 with the top surfaces of the masks 96 (if present) or the dummy gates 94. In some embodiments, a planarization process such as a chemical mechanical polish (CMP), an etch-back process, combinations thereof, or the like may be utilized. The planarization process may also remove the masks 96 on the dummy gates 94, and portions of the gate spacers 116 (if present) and the gate spacers 98 along the sidewalls of the masks 96. After the planarization process, the top surfaces of the first ILD 134, the CESL 132, the gate spacers 116 (if present), the gate spacers 98, and the masks 96 (if present) or the dummy gates 94 are coplanar (within process variations). Accordingly, the top surfaces of the masks 96 (if present) or the dummy gates 94 are exposed through the first ILD 134. In the illustrated embodiment, the masks 96 remain, and the planarization process levels the top surfaces of the first ILD 134 with the top surfaces of the masks 96.

Figure 18A:
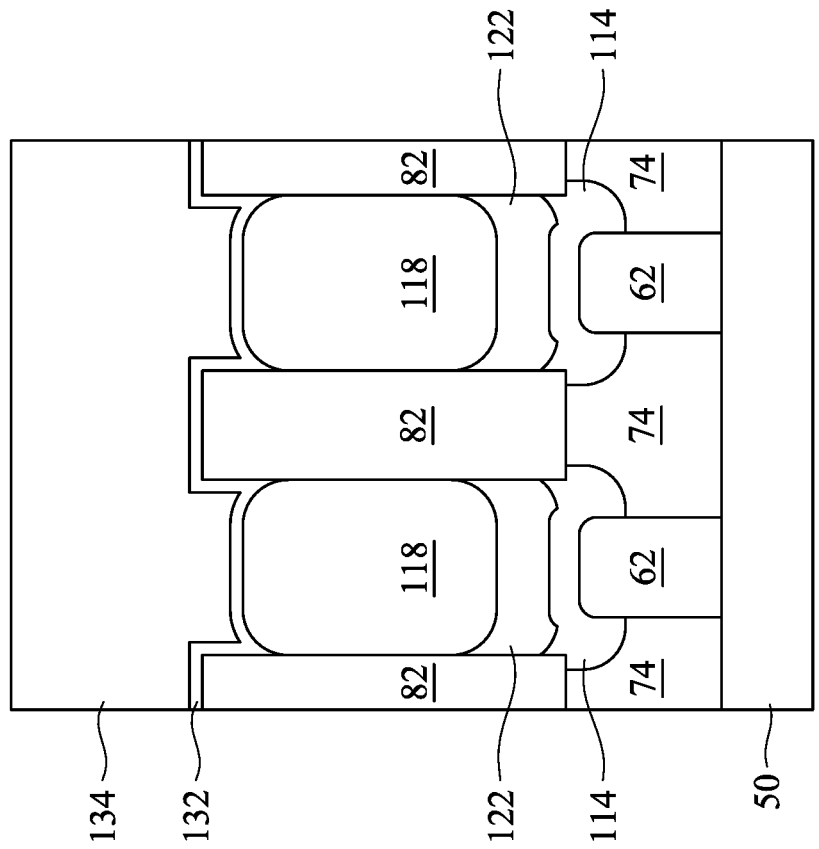
Figure 18B:
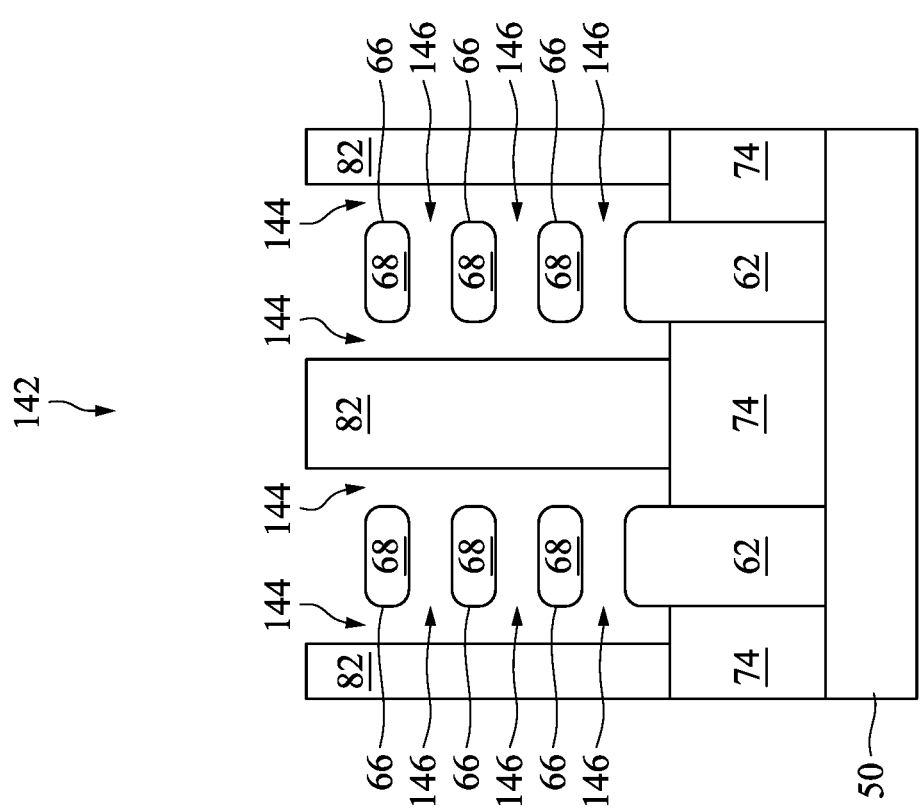
Figure 18C:
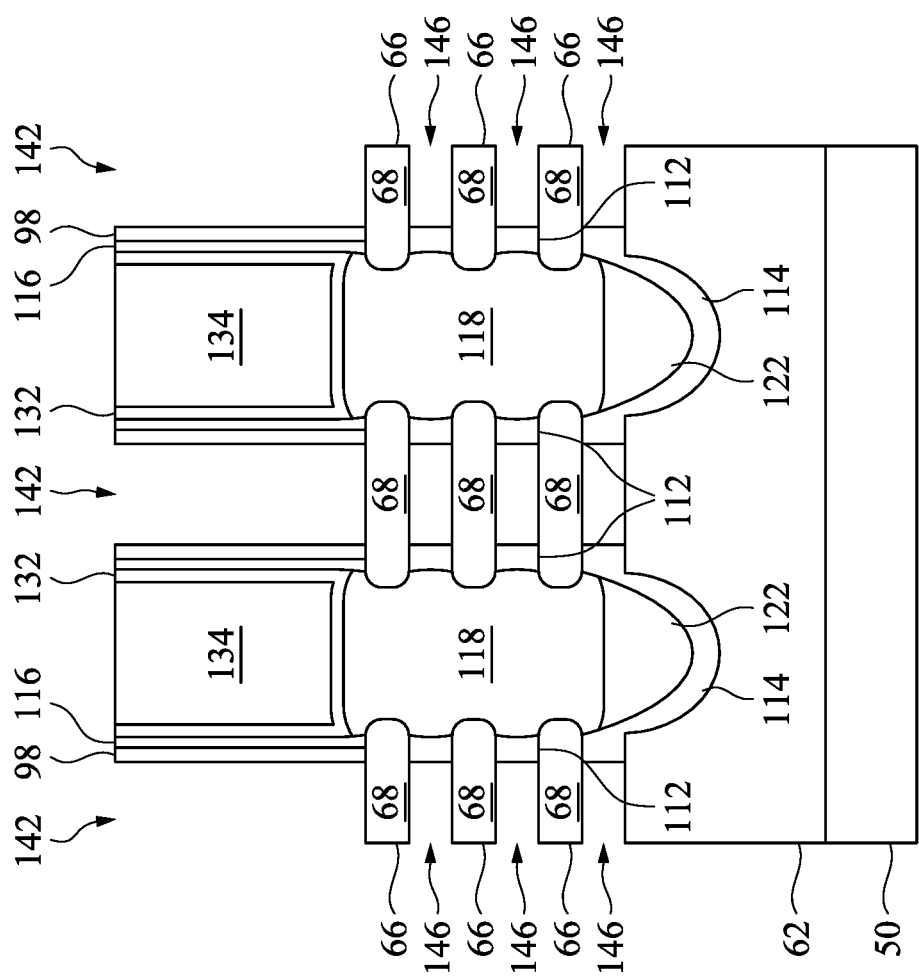

In FIGS. 18A-18C, the masks 96 (if present) and the dummy gates 94 are removed in an etching process, so that recesses 142 are formed. In some embodiments, the dummy gates 94 are removed by an anisotropic etching process. For example, the etching process may include a dry etching performed using reaction gas(es) that selectively etch the dummy gates 94 at a faster rate than the first ILD 134, the gate spacers 116 (if present), or the gate spacers 98. Each recess 142 exposes and/or overlies portions of the channel regions 68 of the nanostructures 66. The channel regions 68 are disposed between adjacent pairs of the epitaxial source/drain regions 118.

The remaining portions of the sacrificial spacers 78 are then removed to form openings 144 in regions between semiconductor fins 62 and the insulating fins 82. The remaining portions of the nanostructures 64 are also removed to form openings 146 in regions between the nanostructures 66. The remaining portions of the nanostructures 64 and the sacrificial spacers 78 can be removed by any acceptable etching process that selectively etches the material(s) of the nanostructures 64 and the sacrificial spacers 78 at a faster rate than the material of the nanostructures 66. The etching may be isotropic. For example, when the nanostructures 64 and the sacrificial spacers 78 are formed of silicon germanium and the nanostructures 66 are formed of silicon, the etching process may be a wet etch performed using tetramethylammonium hydroxide (TMAH), ammonium hydroxide (NH$_4$OH), or the like as an etchant. In some embodiments, a trim process is performed to decrease the thicknesses of the exposed portions of the nanostructures 66. The nanostructures 66 may have rounded surfaces (as illustrated) after the removal processes.

Figure 19B:
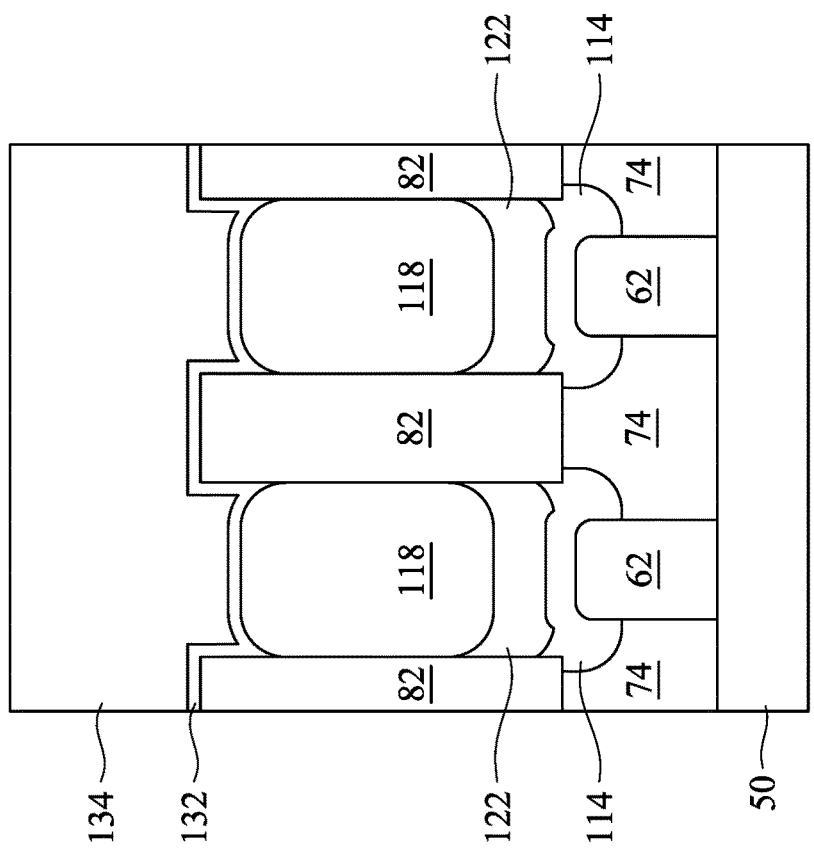
Figure 19A:
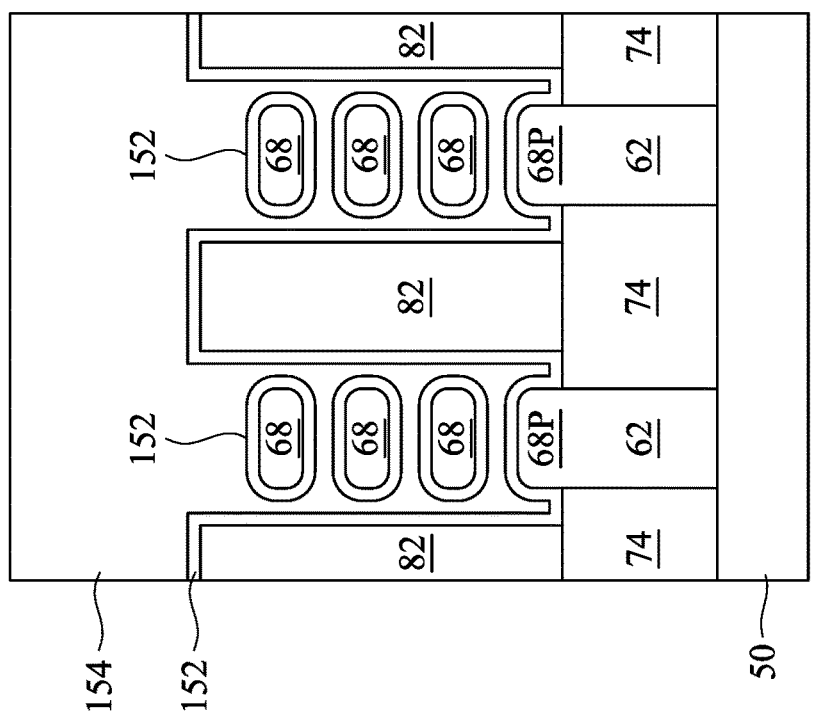
Figure 19C:
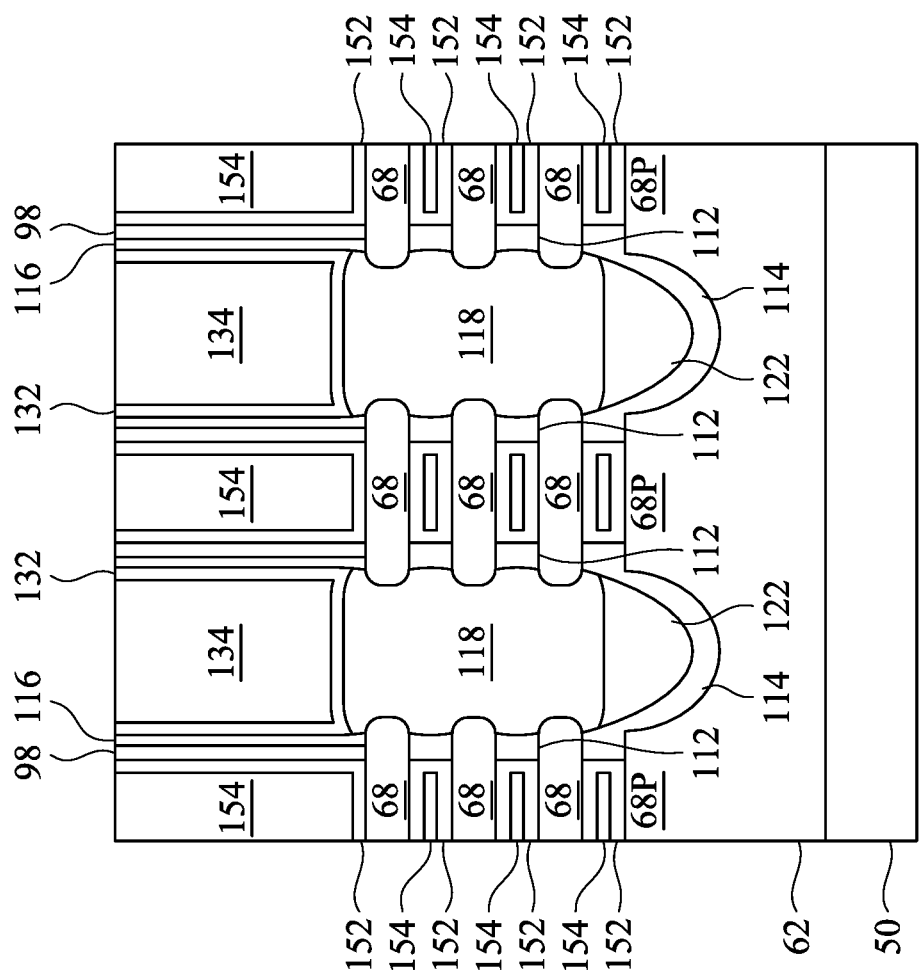

In FIGS. 19A-19C, gate dielectrics 152 and gate electrodes 154 are formed for replacement gates. Each respective pair of a gate dielectric 152 and a gate electrode 154 may be collectively referred to as a "gate structure." Each gate structure is wrapped around a channel region 68, such that the gate structure extends along sidewalls, a bottom surface, and a top surface of the channel region 68. Some of the gate structures also extend along sidewalls and/or a top surface of a semiconductor fin 62. As such, a portion of a gate structure is disposed between a semiconductor fin 62 and a channel region 68. Additionally, some of the gate structures extend along sidewalls and/or a top surface of an insulating fin 82. As a result, the insulating fins 82 are beneath the gate structures.

The gate dielectrics 152 include one or more gate dielectric layer(s) disposed on the sidewalls and/or the top surfaces of the semiconductor fins 62; on the top surfaces, the sidewalls, and the bottom surfaces of the channel regions 68; on the sidewalls of the inner spacers 112 adjacent the epitaxial source/drain regions 118; on the sidewalls of the gate spacers 116 (if present) or the gate spacers 98; and on the top surfaces and the sidewalls of the insulating fins 82. The gate dielectrics 152 may be formed of an oxide such as silicon oxide or a metal oxide, a silicate such as a metal silicate, combinations thereof, multi-layers thereof, or the like. Additionally or alternatively, the gate dielectrics 152 may be formed of a high-k dielectric material (e.g., dielectric materials having a k-value greater than about 7.0), such as a metal oxide or a silicate of hafnium, aluminum, zirconium, lanthanum, manganese, barium, titanium, lead, and combinations thereof. The dielectric material(s) of the gate dielectrics 152 may be formed by molecular-beam deposition (MBD), ALD, PECVD, or the like. Although single-layered gate dielectrics 152 are illustrated, the gate dielectrics 152 may include any number of interfacial layers and any number of main layers. For example, the gate dielectrics 152 may include an interfacial layer and an overlying high-k dielectric layer.

The gate electrodes 154 include one or more gate electrode layer(s) disposed over the gate dielectrics 152. The gate electrodes 154 may be formed of a metal-containing material such as titanium nitride, titanium oxide, tantalum nitride, tantalum carbide, tungsten, cobalt, ruthenium, aluminum, combinations thereof, multi-layers thereof, or the like. Although single-layered gate electrodes 154 are illustrated, the gate electrodes 154 may include any number of work function tuning layers, any number of barrier layers, any number of glue layers, and a fill material.

As an example to form the gate structures, one or more gate dielectric layer(s) may be deposited in the recesses 142 and the openings 144, 146. The gate dielectric layer(s) may also be deposited on the top surfaces of the first ILD 134, the CESL 132, the gate spacers 116 (if present), and the gate spacers 98. Subsequently, one or more gate electrode layer(s) may be deposited on the gate dielectric layer(s), and in the remaining portions of the recesses 142 and the openings 144, 146. A removal process may then be performed to remove the excess portions of the gate dielectric layer(s) and the gate electrode layer(s), which excess portions are over the top surfaces of the first ILD 134, the CESL 132, the gate spacers 116 (if present), and the gate spacers 98. In some embodiments, a planarization process such as a chemical mechanical polish (CMP), an etch-back process, combinations thereof, or the like may be utilized. After the planarization process, the top surfaces of the gate spacers 98, the gate spacers 116 (if present), the CESL 132, the first ILD 134, the gate dielectrics 152, and the gate electrodes 154 are coplanar (within process variations). The gate dielectric layer(s), after the removal process, have portions left in the recesses 142 and the openings 144, 146 (thus forming the gate dielectrics 152). The gate electrode layer(s), after the removal process, have portions left in the recesses 142 and the openings 144, 146 (thus forming the gate electrodes 154).

The formation of the gate dielectrics 152 in the n-type region 50N and the p-type region 50P may occur simultaneously such that the gate dielectrics 152 in each region are formed of the same material(s), and the formation of the gate electrodes 154 may occur simultaneously such that the gate electrodes 154 in each region are formed of the same material(s). In some embodiments, the gate dielectrics 152 in each region may be formed by distinct processes, such that the gate dielectrics 152 may include different materials and/or have a different number of layers, and/or the gate electrodes 154 in each region may be formed by distinct processes, such that the gate electrodes 154 may include different materials and/or have a different number of layers. Various masking steps may be used to mask and expose appropriate regions when using distinct processes.

As previously noted, some of the gate structures extend along sidewalls and/or a top surface of a semiconductor fin 62. The regions 68P of the semiconductor fins 62 underlying the gate structures may be controlled by the gate structures during operation. However, as noted above, the bottom spacers 114 reduce electrical coupling between the semiconductor fins 62 and the epitaxial source/drain regions 118. Thus, the bottom spacers 114 reduce the likelihood these regions 68P of the semiconductor fins 62 act as parasitic channel regions.

Figure 20B:
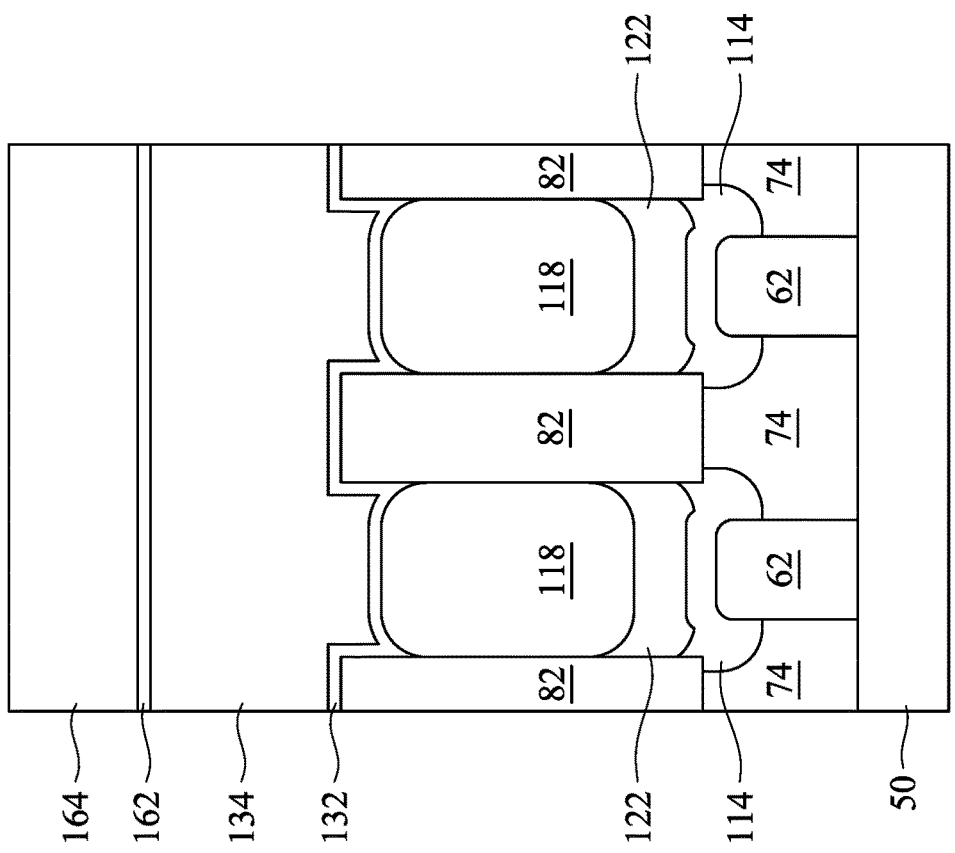
Figure 20A:
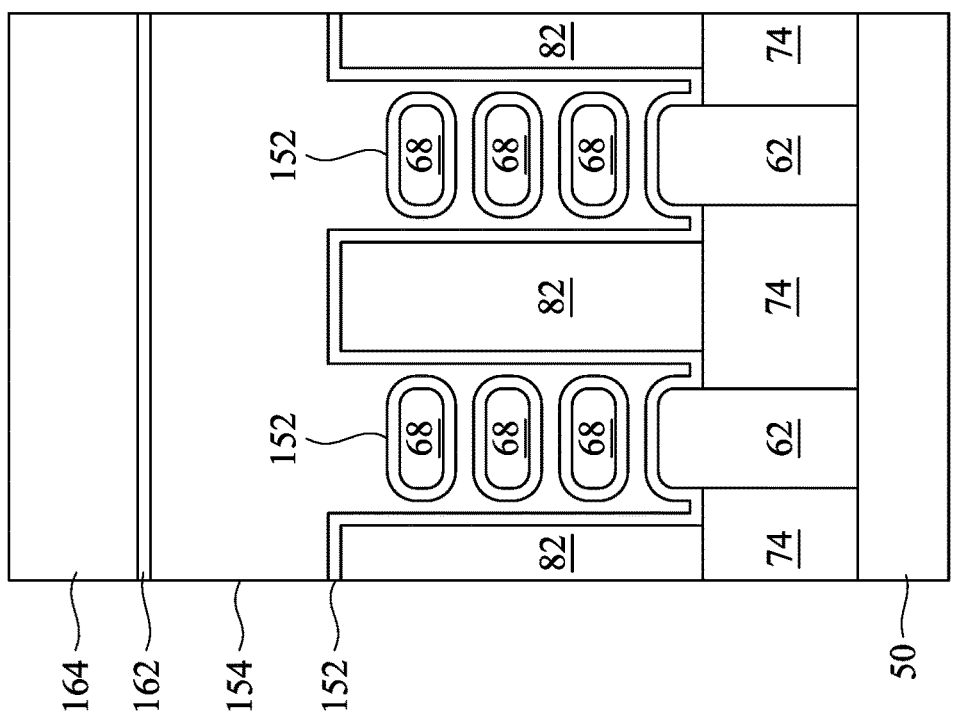
Figure 20C:
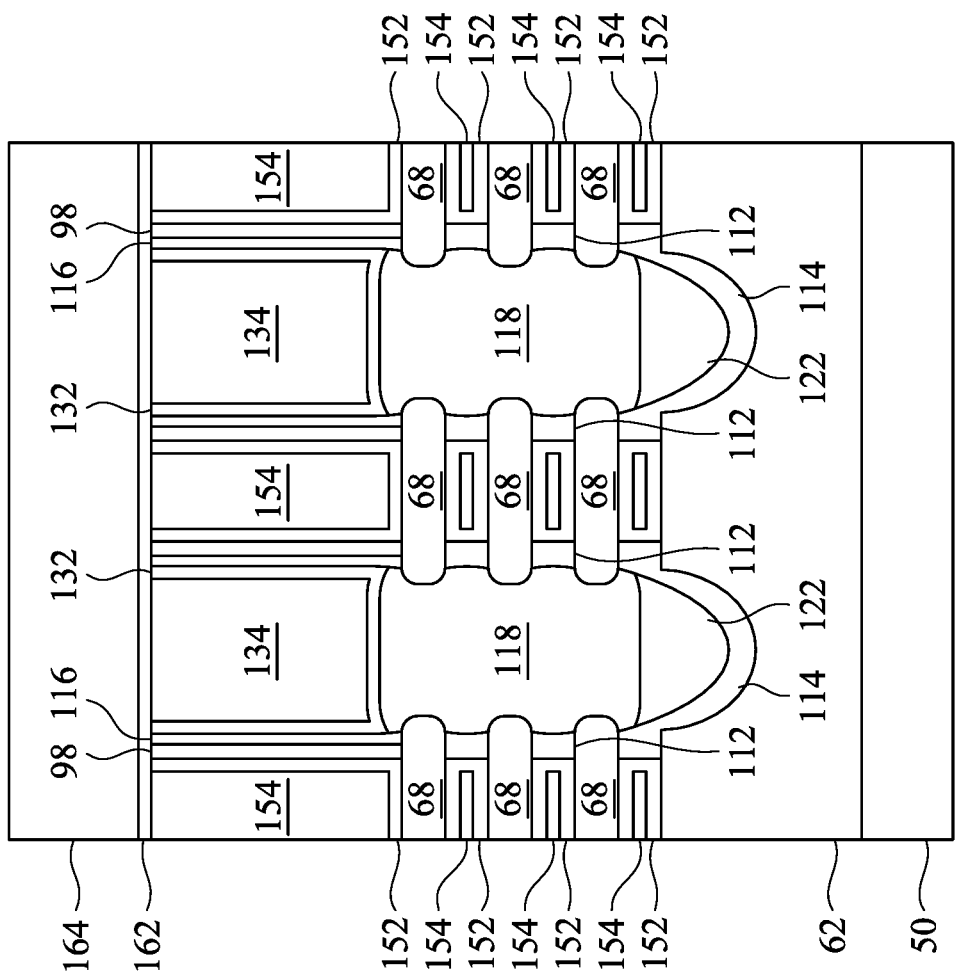

In FIGS. 20A-20C, a second ILD 164 is deposited over the gate spacers 98, the gate spacers 116 (if present), the CESL 132, the first ILD 134, the gate dielectrics 152, and the gate electrodes 154. In some embodiments, the second ILD 164 is a flowable film formed by a flowable CVD method. In some embodiments, the second ILD 164 is formed of a dielectric material such as PSG, BSG, BPSG, USG, or the like, which may be deposited by any suitable method, such as CVD, PECVD, or the like.

In some embodiments, an etch stop layer (ESL) 162 is formed between the second ILD 164 and the gate spacers 98, the gate spacers 116 (if present), the CESL 132, the first ILD 134, the gate dielectrics 152, and the gate electrodes 154. The ESL 162 may be formed of a dielectric material having a high etching selectivity from the etching of the second ILD 164, such as silicon nitride, silicon oxide, silicon oxynitride, or the like, which may be formed by any suitable method, such as CVD, ALD, or the like.

Figure 21B:
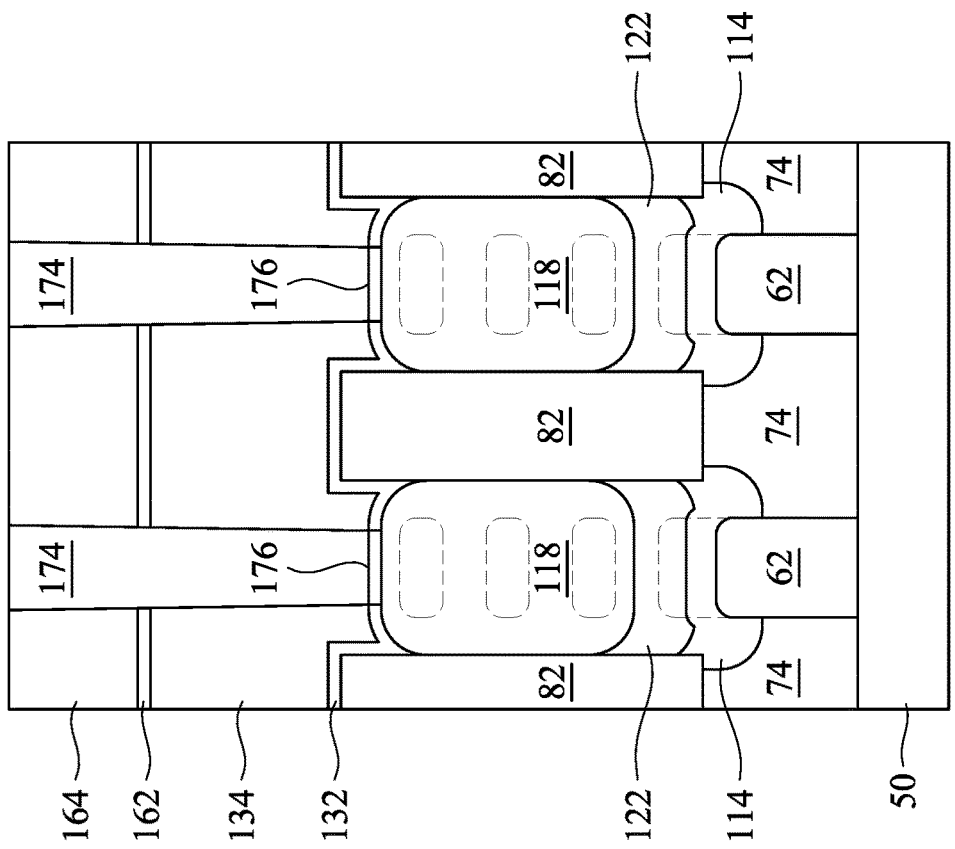
Figure 21A:
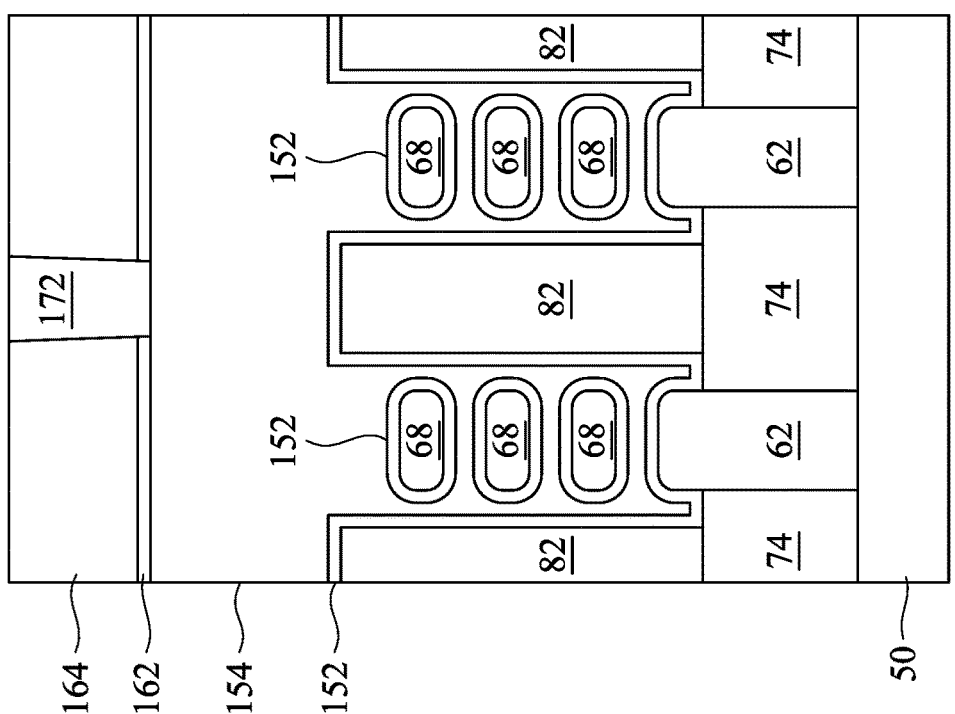
Figure 21C:
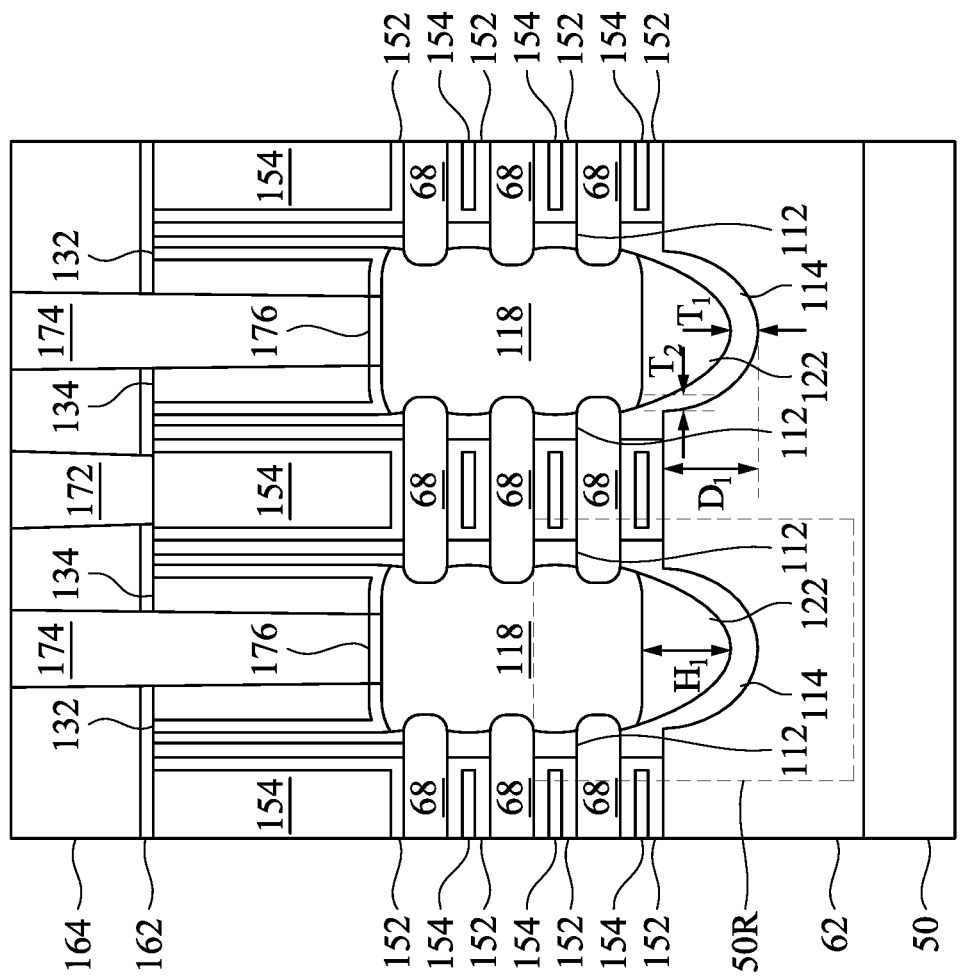

In FIGS. 21A-21C, gate contacts 172 and source/drain contacts 174 are formed to contact, respectively, the gate electrodes 154 and the epitaxial source/drain regions 118. The gate contacts 172 are physically and electrically coupled to the gate electrodes 154. The source/drain contacts 174 are physically and electrically coupled to the epitaxial source/drain regions 118.

As an example to form the gate contacts 172 and the source/drain contacts 174, openings for the gate contacts 172 are formed through the second ILD 164 and the ESL 162, and openings for the source/drain contacts 174 are formed through the second ILD 164, the ESL 162, the first ILD 134, and the CESL 132. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 164. The remaining liner and conductive material form the gate contacts 172 and the source/drain contacts 174 in the openings.

The gate contacts 172 and the source/drain contacts 174 may be formed in distinct processes, or may be formed in the same process. Although shown as being formed in the same cross-sections, it should be appreciated that each of the gate contacts 172 and the source/drain contacts 174 may be formed in different cross-sections, which may avoid shorting of the contacts.

Optionally, metal-semiconductor alloy regions 176 are formed at the interfaces between the epitaxial source/drain regions 118 and the source/drain contacts 174. The metal-semiconductor alloy regions 176 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 176 can be formed before the material(s) of the source/drain contacts 174 by depositing a metal in the openings for the source/drain contacts 174 and then performing a thermal anneal process. The metal can be any metal capable of reacting with the semiconductor materials (e.g., silicon, silicon-germanium, germanium, etc.) of the epitaxial source/drain regions 118 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the openings for the source/drain contacts 174, such as from surfaces of the metal-semiconductor alloy regions 176. The material(s) of the source/drain contacts 174 can then be formed on the metal-semiconductor alloy regions 176.

After the devices are formed, they may be interconnected by metallization layers in an overlying interconnect structure to form integrated circuits. The overlying interconnect structure can be formed in a back end of line (BEOL) process, in which the metallization layers are connected to the gate contacts 172 and the source/drain contacts 174. Additional features, such as passive devices, memories (e.g., magnetoresistive random-access memory (MRAM), resistive random access memory (RRAM), phase-change random access memory (PCRAM), etc.), or the like may be integrated with the interconnect structure during the BEOL process.

Figure 22A:
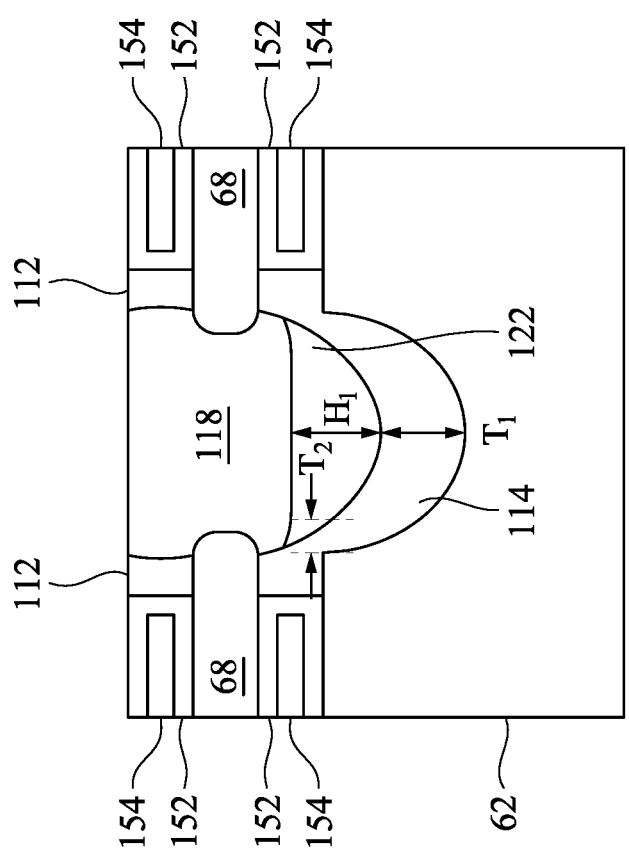
FIGS. 22A-22C are views of nanostructure-FETs, in accordance with some embodiments.
Figure 22B:
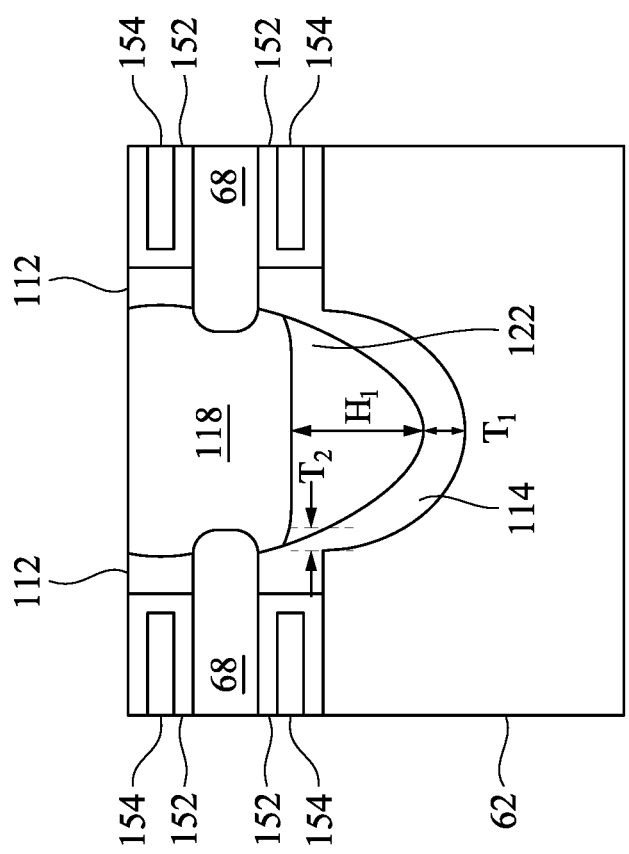
Figure 22C:
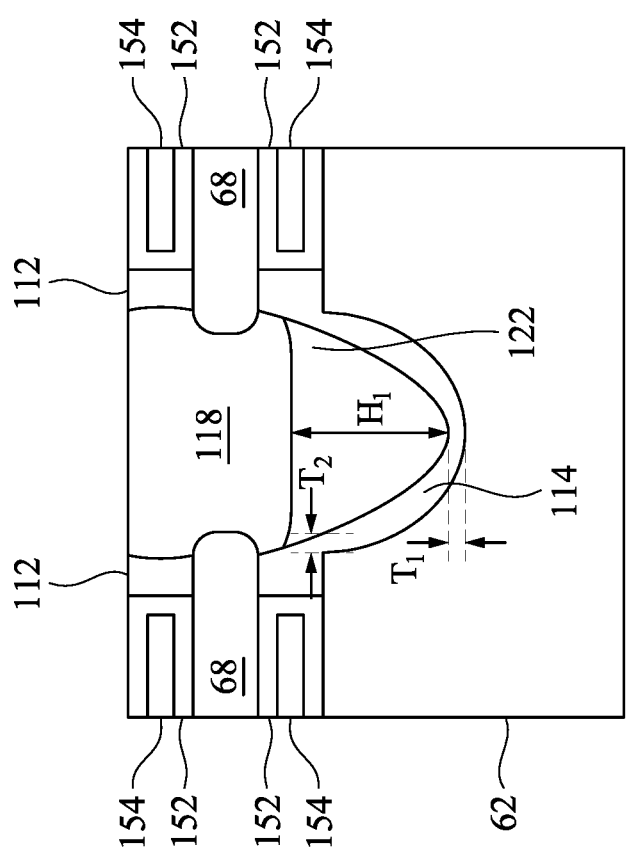

FIG. 21B illustrates the portions of the channel regions 68 and the semiconductor fins 62 in ghost to better illustrate aspects of embodiment devices. As can be more clearly seen, the gaps 122 have a large height as a result of the epitaxial source/drain regions 118 not being grown from the semiconductor fins 62. More specifically, the bottommost surface of an epitaxial source/drain region 118 is disposed above the topmost surface of the underlying semiconductor fin 62 (e.g., the top surface of the semiconductor fin 62 under a gate spacer 98). FIG. 21C illustrates the height $H_1$ of the gaps 122, the thickness $T_1$ of the bottom spacers 114 along the top surfaces of the semiconductor fins 62 in the source/drain recesses 102, and the thickness $T_2$ of the bottom spacers 114 along the sidewalls of the semiconductor fins 62 in the source/drain recesses 102. The portions of the source/drain recesses 102 in the semiconductor fins 62 have a depth $D_1$. The height $H_1$ may be expressed as $H_1 > D_1 - T_1$. FIGS. 22A-22C illustrate different dimensions for these parameters in a region 50R from FIG. 21C.

In the embodiment of FIG. 22A, the thickness $T_2$ is less than the thickness $T_1$. As a result, the gap 122 has a small height $H_1$. In some embodiments, the thickness $T_1$ is in the range of 1 Å to 200 Å, the thickness $T_2$ is in the range of 1 Å to 200 Å, and the height $H_1$ is in the range of 1 Å to 300 Å.

In the embodiment of FIG. 22B, the thickness $T_2$ is less than the thickness $T_1$, but the difference between the thickness $T_2$ and the thickness $T_1$ is smaller than the embodiment of FIG. 22A. As a result, the gap 122 has a small height $H_1$, but one that is larger than the embodiment of FIG. 22A. In some embodiments, the thickness $T_1$ is in the range of 1 Å to 200 Å, the thickness $T_2$ is in the range of 1 Å to 200 Å, and the height $H_1$ is in the range of 1 Å to 300 Å.

In the embodiment of FIG. 22C, the thickness $T_2$ is equal to the thickness $T_1$. As a result, the gap 122 has a large height $H_1$. In some embodiments, the thickness $T_1$ and the thickness $T_2$ are each in the range of 1 Å to 200 Å, the height $H_1$ is in the range of 1 Å to 300 Å.

Figure 23:
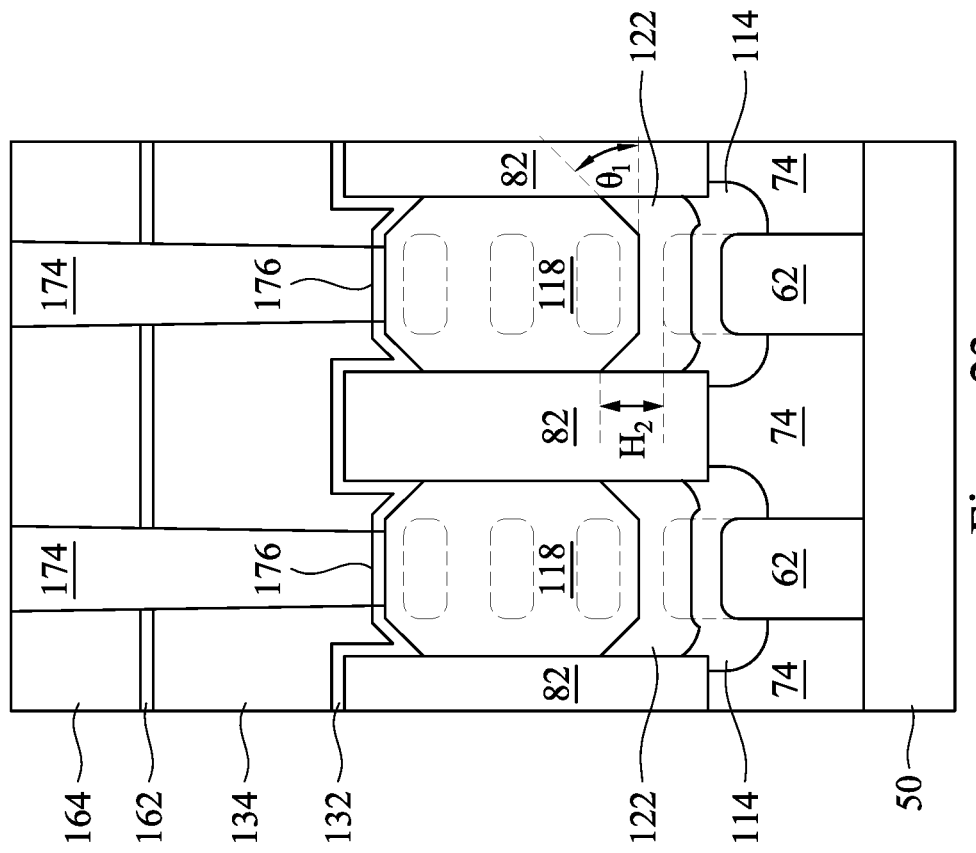
FIG. 23 is a view of nanostructure-FETs, in accordance with some other embodiments.

FIG. 23 is a view of nanostructure-FETs, in accordance with some other embodiments. This embodiment is similar to the embodiment of FIG. 21B, except the epitaxial source/drain regions 118 are grown to have <111> facets. The bottom surfaces of the epitaxial source/drain regions 118 form an angle $\theta_1$ with the <111> faceted surfaces of the epitaxial source/drain regions 118. In some embodiments, the angle $\theta_1$ is in the range of 5 degrees to 85 degrees. Forming the epitaxial source/drain regions 118 with <111> facets causes the gaps 122 to have a large height $H_2$ extending from the top surfaces of the semiconductor fins 62 and up the sidewalls of the insulating fins 82. In some embodiments, the height $H_2$ is in the range of 0 Å to 300 Å. Forming the gaps 122 with a large height $H_2$ allows the epitaxial source/drain regions 118 to have a decreased volume, which may help reduce the parasitic capacitance of the resulting devices.

The epitaxial source/drain regions 118 may be grown with <111> facets by flowing the etchant-containing precursor (described for FIGS. 15A-15C) at a high flow rate. The flow rate of the etchant-containing precursor when growing the epitaxial source/drain regions 118 of this embodiment may be greater than the flow rate of the etchant-containing precursor when growing the epitaxial source/drain regions 118 of the embodiment of FIGS. 21A-21C. In some embodiments, the semiconductor-containing precursor is flowed at a flow rate in the range of 10 sccm to 10000 sccm, and the etchant-containing precursor is flowed at a flow rate in the range of 10 sccm to 10000 sccm.

Figure 24B:
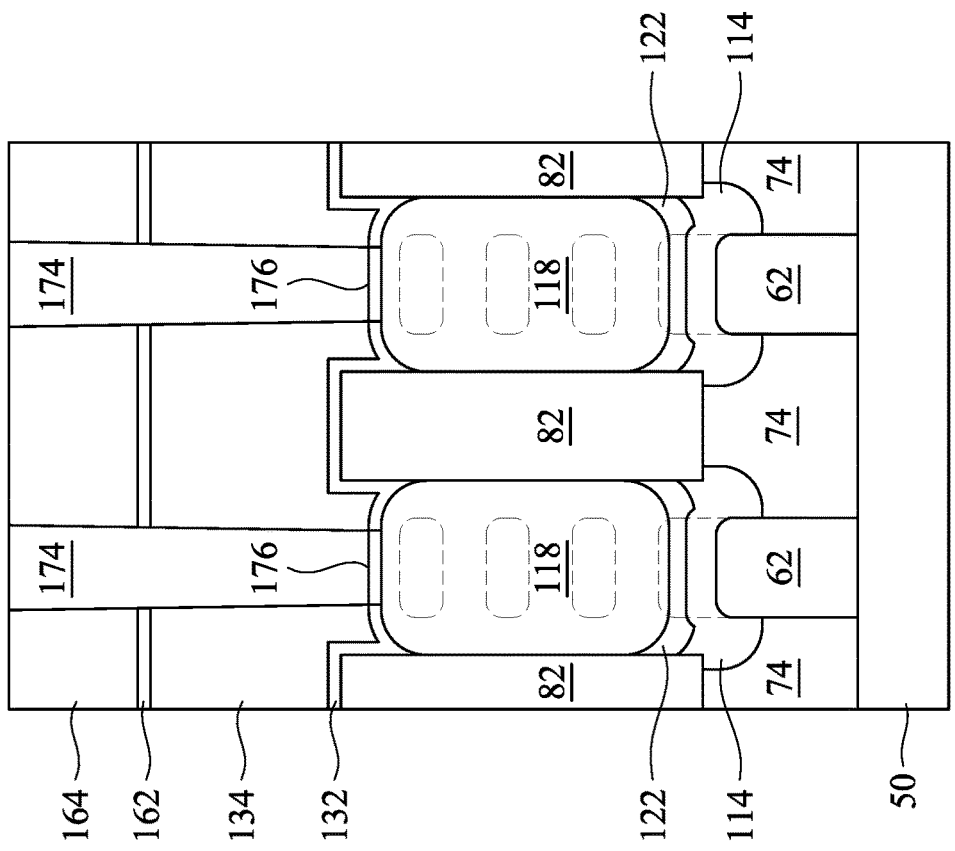
FIGS. 24A-24C are views of nanostructure-FETs, in accordance with some other embodiments.
Figure 24A:
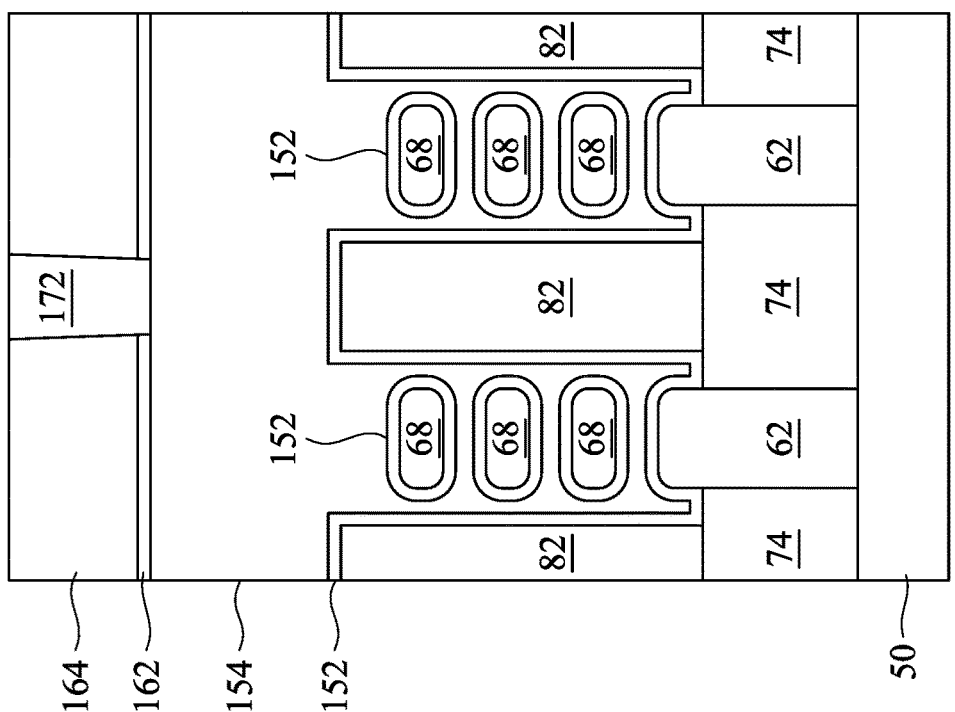
Figure 24C:
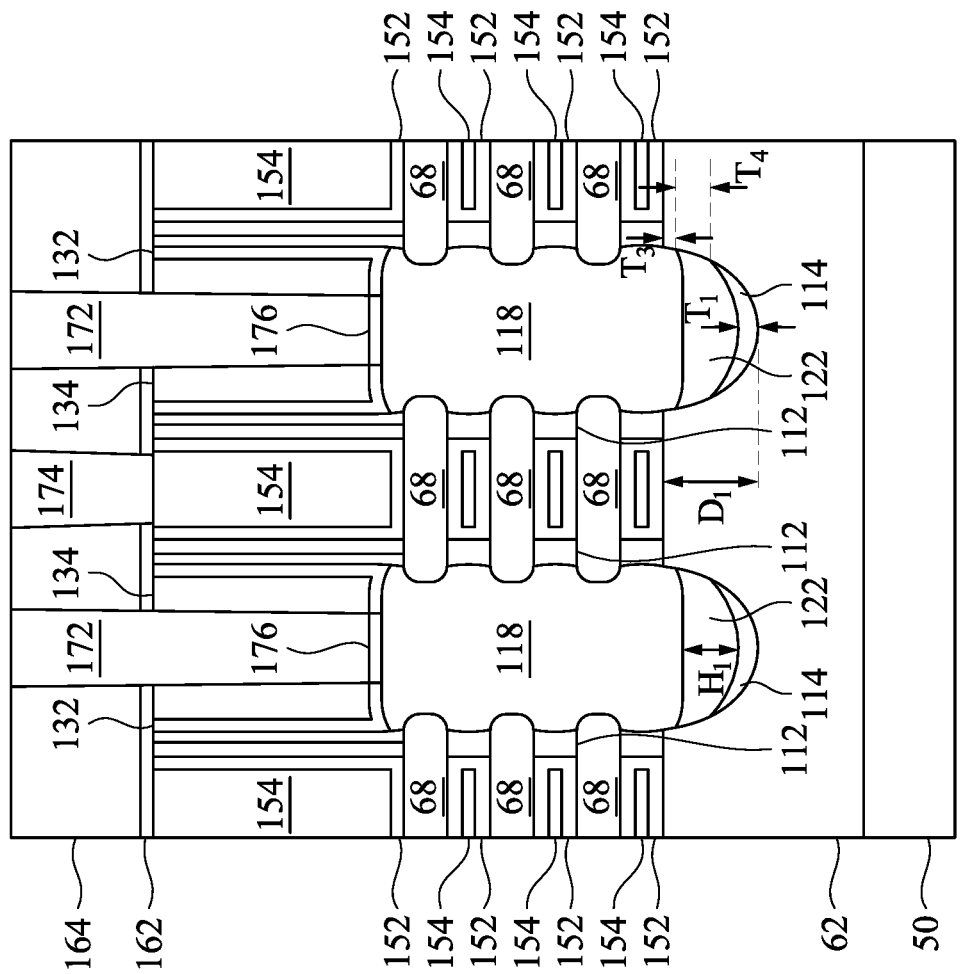

FIGS. 24A-24C are views of nanostructure-FETs, in accordance with some other embodiments. This embodiment is similar to the embodiment of FIGS. 21A-21C, except the bottom spacers 114 only cover the top surfaces of the semiconductor fins 62 in the source/drain recesses 102, and the sidewalls of the semiconductor fins 62 in the source/drain recesses 102 remain uncovered by the bottom spacers 114. Further, the inner spacers 112 are disposed in all of the sidewall recesses 104 (including the lower sidewall recesses 104L and the upper sidewall recesses 104U, see FIGS. 12A-12C). Additionally, the gate spacers 116 may not be formed, and the bottom spacers 114 have a small thickness (subsequently described). This embodiment may be formed when a large amount of etching is performed during the patterning of the spacer layer 106 (described for FIGS. 14A-14C). Specifically, the pitch between adjacent dummy gates 94 (see FIGS. 14A-14C) is large, causing a large amount of etching to be performed. For example, the pitch between adjacent dummy gates 94 may be in the range of 30 nm to 70 nm. In this embodiment, the epitaxial source/drain regions 118 contact portions of the sidewalls of the semiconductor fins 62 in the source/drain recesses 102, but do not contact the bottom spacers 114. The epitaxial source/drain regions 118 of this embodiment can be formed to a larger volume, which may help reduce the parasitic resistance of the resulting devices. Even though the epitaxial source/drain regions 118 contact the sidewalls of the semiconductor fins 62 in the source/drain recesses 102, the contact area between the epitaxial source/drain regions 118 and the semiconductor fins 62 is small. Further, the gaps 122 are still formed. Thus, a reduction in the leakage current and/or the parasitic capacitance of the resulting devices may still be achieved.

FIG. 24B illustrates the portions of the channel regions 68 and semiconductor fins 62 in ghost to better illustrate aspects of embodiment devices. As can be more clearly seen, the bottommost surface of an epitaxial source/drain region 118 is disposed below the topmost surface of the underlying semiconductor fin 62 (e.g., the top surface of the semiconductor fin 62 under a gate spacer 98). FIG. 24C illustrates the height $H_1$ of the gaps 122, the thickness $T_1$ of the bottom spacers 114 along the top surfaces of the semiconductor fins 62 in the source/drain recesses 102, the thickness $T_3$ of the contact area between the epitaxial source/drain regions 118 and the semiconductor fins 62, and the thickness $T_4$ of the exposed portions of the sidewalls of the semiconductor fins 62 in the source/drain recesses 102. The portions of the source/drain recesses 102 in the semiconductor fins 62 have a depth $D_1$. The thickness $T_3$ may be less than the thickness $T_4$, which may help reduce the leakage current of the resulting devices. As a result, the gaps 122 have a large height $H_1$. In some embodiments, the thickness $T_1$ is in the range of 1 Å to 200 Å, the thickness $T_3$ is in the range of 0 Å to 100 Å, the thickness $T_4$ is in the range of 1 Å to 200 Å, and the height $H_1$ is in the range of 1 Å to 200 Å.

Figure 25:
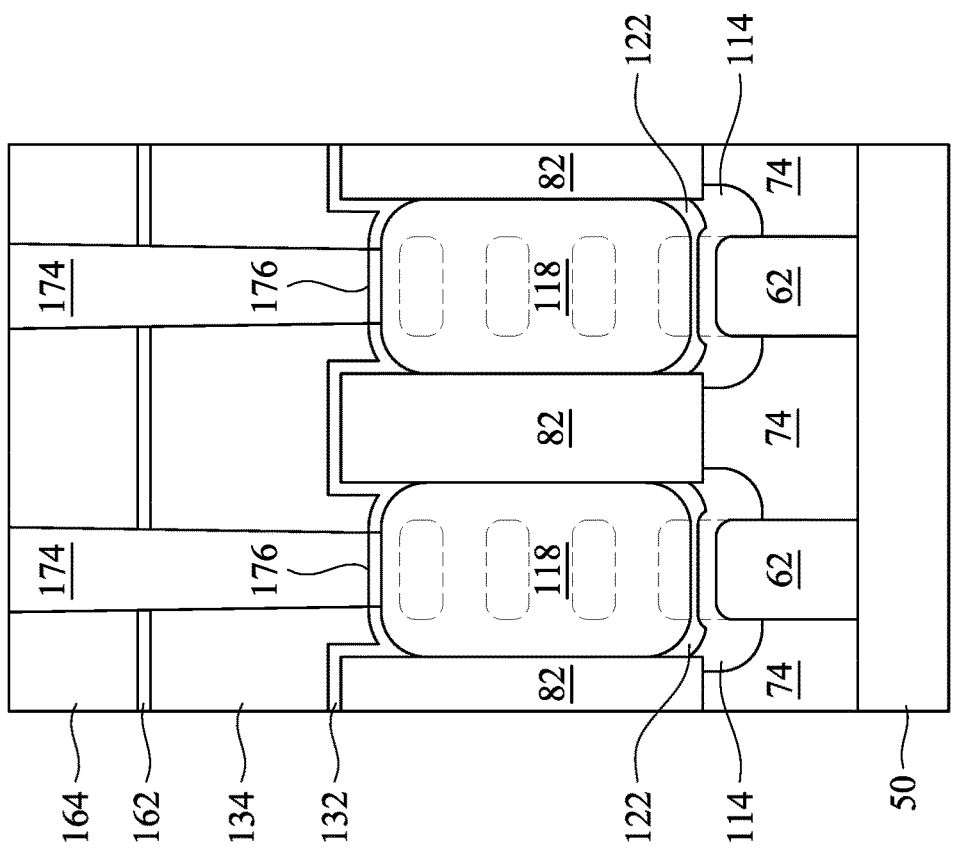
FIGS. 25A-25C are views of nanostructure-FETs, in accordance with some other embodiments.
Figure 25:
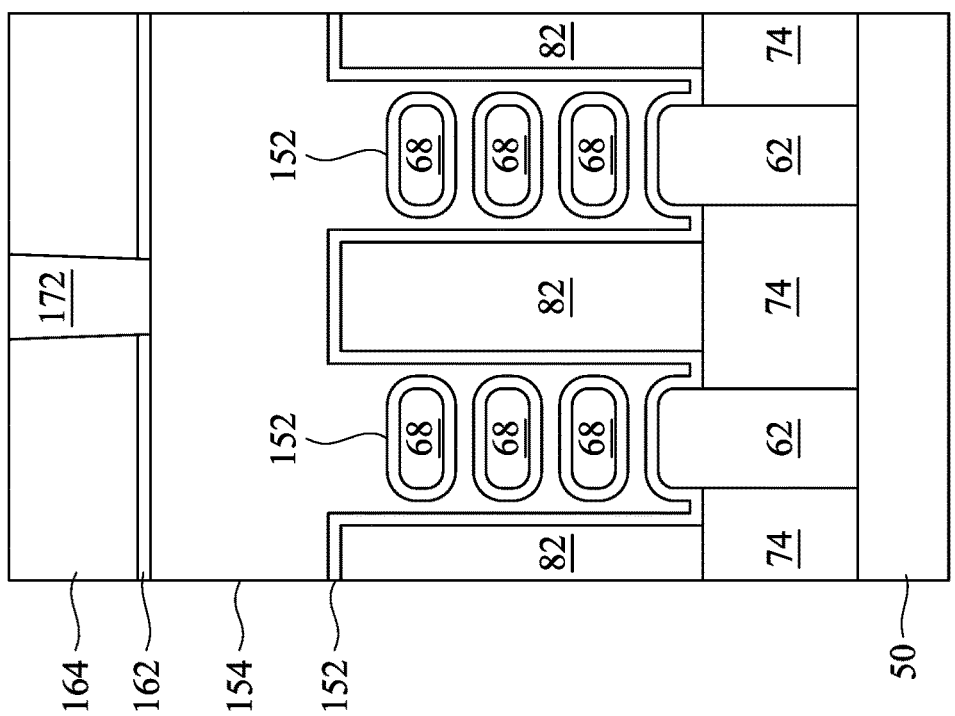
Figure 25C:
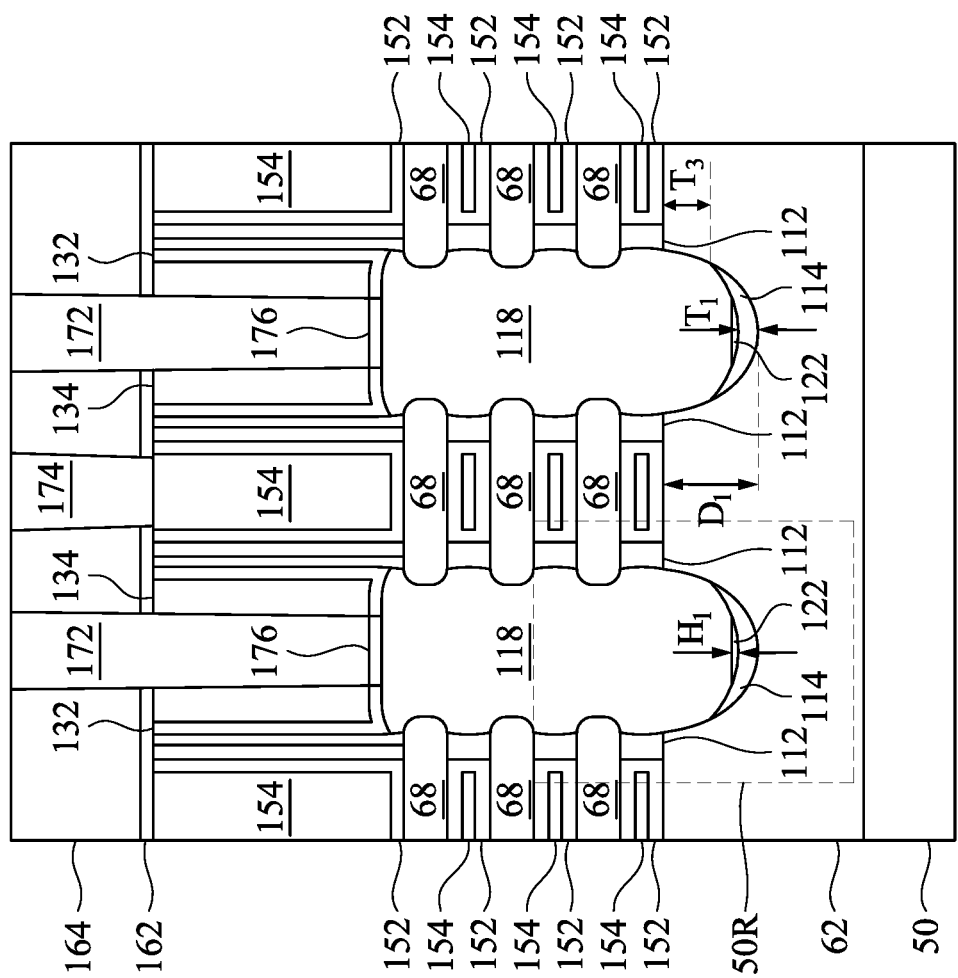

FIGS. 25A-25C are views of nanostructure-FETs, in accordance with some other embodiments. This embodiment is similar to the embodiment of FIGS. 24A-24C, except the epitaxial source/drain regions 118 also contact the bottom spacers 114. As can be more clearly seen, the gaps 122 have a small height $H_1$ as a result of the epitaxial source/drain regions 118 contacting the bottom spacers 114. This embodiment may also be formed when a large amount of etching is performed during the patterning of the spacer layer 106 (described for FIGS. 14A-14C). Specifically, the pitch between adjacent dummy gates 94 (see FIGS. 14A-14C) is large, causing a large amount of etching to be performed. For example, the pitch between adjacent dummy gates 94 may be in the range of 30 nm to 70 nm. The pitch between adjacent dummy gates 94 in this embodiment may be larger than in the embodiment of FIGS. 24A-24C.

Figure 26A:
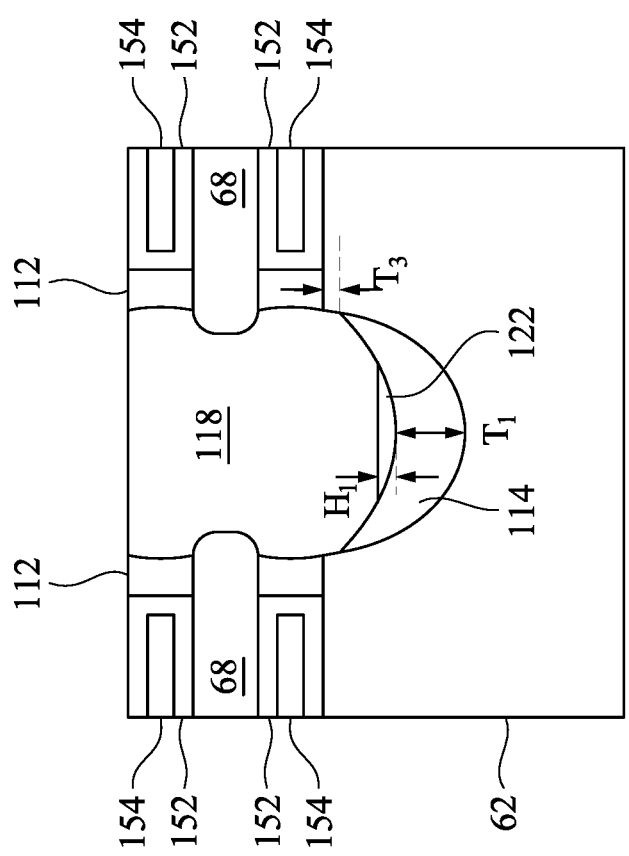
FIGS. 26A-26C are views of nanostructure-FETs, in accordance with some other embodiments.
Figure 26B:
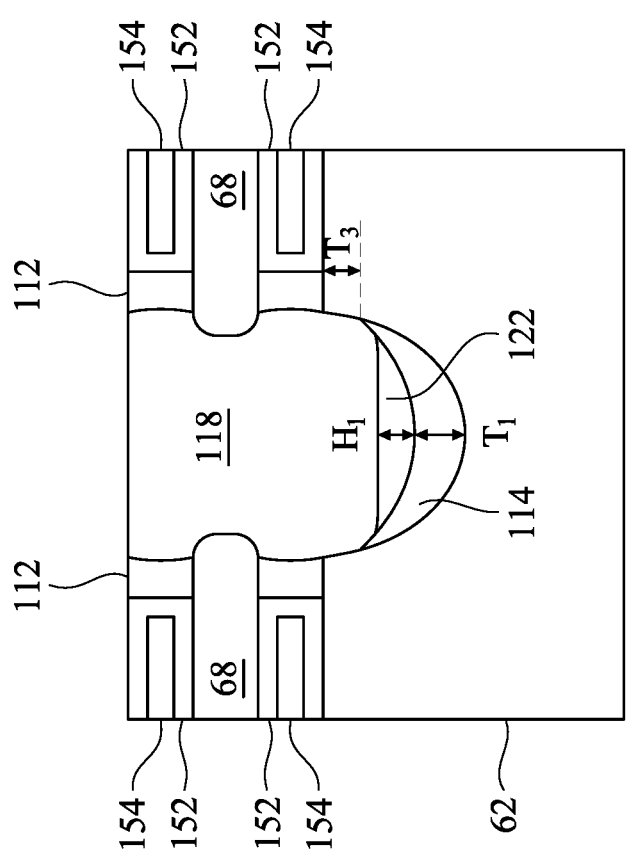
Figure 26C:
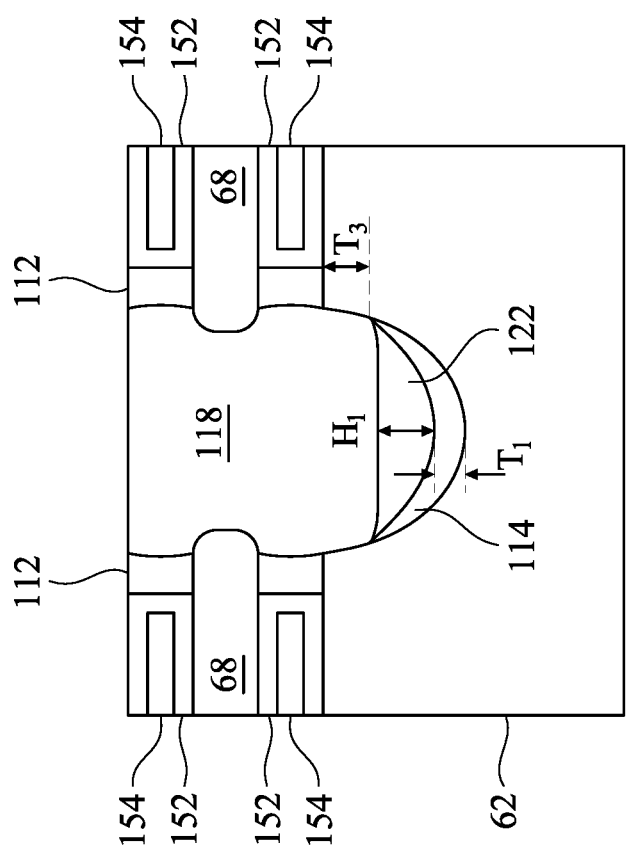

FIG. 25B illustrates the portions of the channel regions 68 and semiconductor fins 62 in ghost to better illustrate aspects of embodiment devices. As can be more clearly seen, the gaps 122 have a small height as a result of the epitaxial source/drain regions 118 being grown from the semiconductor fins 62. More specifically, the bottommost surface of an epitaxial source/drain region 118 is disposed below the topmost surface of the underlying semiconductor fin 62 (e.g., the top surface of the semiconductor fin 62 under a gate spacer 98). FIG. 25C illustrates the height $H_1$ of the gaps 122, the thickness $T_1$ of the bottom spacers 114 along the top surfaces of the semiconductor fins 62 in the source/drain recesses 102, and the thickness $T_3$ of the contact area between the epitaxial source/drain regions 118 and the semiconductor fins 62. The portions of the source/drain recesses 102 in the semiconductor fins 62 have a depth $D_1$. The height $H_1$ may be expressed as $H_1 \leq D_1 - T_1 - T_3$. FIGS. 26A-26C illustrate different dimensions for these parameters in a region 50R from FIG. 25C.

In the embodiment of FIG. 26A, the thickness $T_1$ is large. As a result, the gap 122 has a small height $H_1$ and the contact area between the epitaxial source/drain regions 118 and the semiconductor fins 62 has a small thickness $T_3$. In some embodiments, the thickness $T_1$ is in the range of 200 Å to 300 Å, the thickness $T_3$ is in the range of 1 Å to 100 Å, and the height $H_1$ is in the range of 1 Å to 100 Å.

In the embodiment of FIG. 26B, the thickness $T_1$ is moderate, such as less than the embodiment of FIG. 26A. As a result, the gap 122 has a moderate height $H_1$, such as greater than the embodiment of FIG. 26A, and the contact area between the epitaxial source/drain regions 118 and the semiconductor fins 62 has a moderate thickness $T_3$, such as greater than the embodiment of FIG. 26A. In some embodiments, the thickness $T_1$ is in the range of 100 Å to 200 Å, the thickness $T_3$ is in the range of 1 Å to 200 Å, and the height $H_1$ is in the range of 1 Å to 200 Å.

In the embodiment of FIG. 26C, the thickness $T_1$ is small, such as less than the embodiment of FIG. 26B. As a result, the gap 122 has a large height $H_1$, such as greater than the embodiment of FIG. 26B, and the contact area between the epitaxial source/drain regions 118 and the semiconductor fins 62 has a large thickness $T_3$, such as greater than the embodiment of FIG. 26B. In some embodiments, the thickness $T_1$ is in the range of 1 Å to 99 Å, the thickness $T_3$ is in the range of 1 Å to 300 Å, and the height $H_1$ is in the range of 1 Å to 300 Å.

Figure 27:
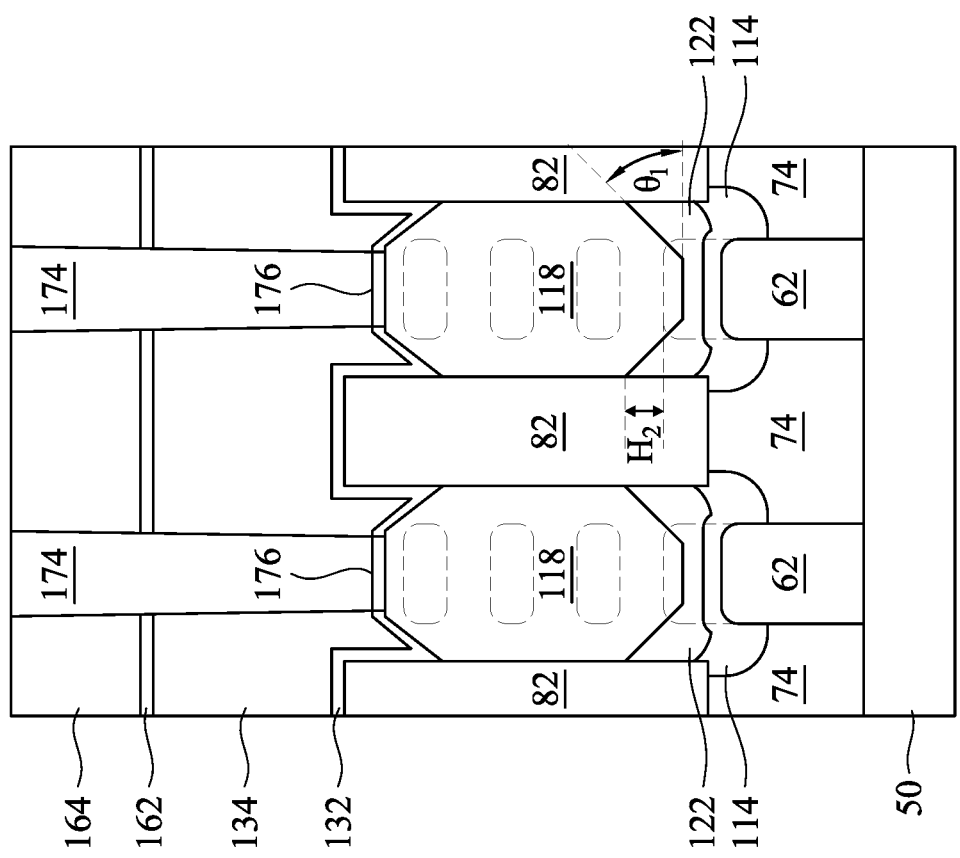
FIG. 27 is a view of nanostructure-FETs, in accordance with some other embodiments.

FIG. 27 is a view of nanostructure-FETs, in accordance with some other embodiments. This embodiment is similar to the embodiment of FIG. 25B, except the epitaxial source/drain regions 118 are grown to have <111> facets. The bottom surfaces of the epitaxial source/drain regions 118 form an angle $\theta_1$ with the <111> faceted surfaces of the epitaxial source/drain regions 118. In some embodiments, the angle $\theta_1$ is in the range of 5 degrees to 85 degrees. The angle $\theta_1$ in this embodiment may be greater than in the embodiment of FIG. 23. Forming the epitaxial source/drain regions 118 with <111> facets causes the gaps 122 to have a large height $H_2$ extending from the top surfaces of the semiconductor fins 62 and up the sidewalls of the insulating fins 82. In some embodiments, the height $H_2$ is in the range of 0 Å to 200 Å. Forming the gaps 122 with a large height $H_2$ allows the epitaxial source/drain regions 118 to have a decreased volume, which may help reduce the parasitic capacitance of the resulting devices. The height $H_2$ in this embodiment may be smaller than in the embodiment of FIG. 23.

The epitaxial source/drain regions 118 may be grown with <111> facets by flowing the etchant-containing precursor (described for FIGS. 15A-15C) at a high flow rate. The flow rate of the etchant-containing precursor when growing the epitaxial source/drain regions 118 of this embodiment may be greater than the flow rate of the etchant-containing precursor when growing the epitaxial source/drain regions 118 of the embodiment of FIGS. 25A-25C. In some embodiments, the semiconductor-containing precursor is flowed at a flow rate in the range of 10 sccm to 10000 sccm, and the etchant-containing precursor is flowed at a flow rate in the range of 10 sccm to 10000 sccm.

FIGS. 28A-31C are views of intermediate stages in the manufacturing of nanostructure-FETs, in accordance with some other embodiments. In this embodiment, the bottom spacers 114 are formed after the inner spacers 112. Further, semiconductor layers 182 (see FIGS. 30A-30C) are formed beneath the bottom spacers 114, to help reduce contouring at the bottom of the source/drain recesses 102. As such, the bottom spacers 114 may be formed to have a more uniform thickness and shape. In some embodiments, the bottom spacers 114 are substantially flat (within process variations).

Figure 28C:
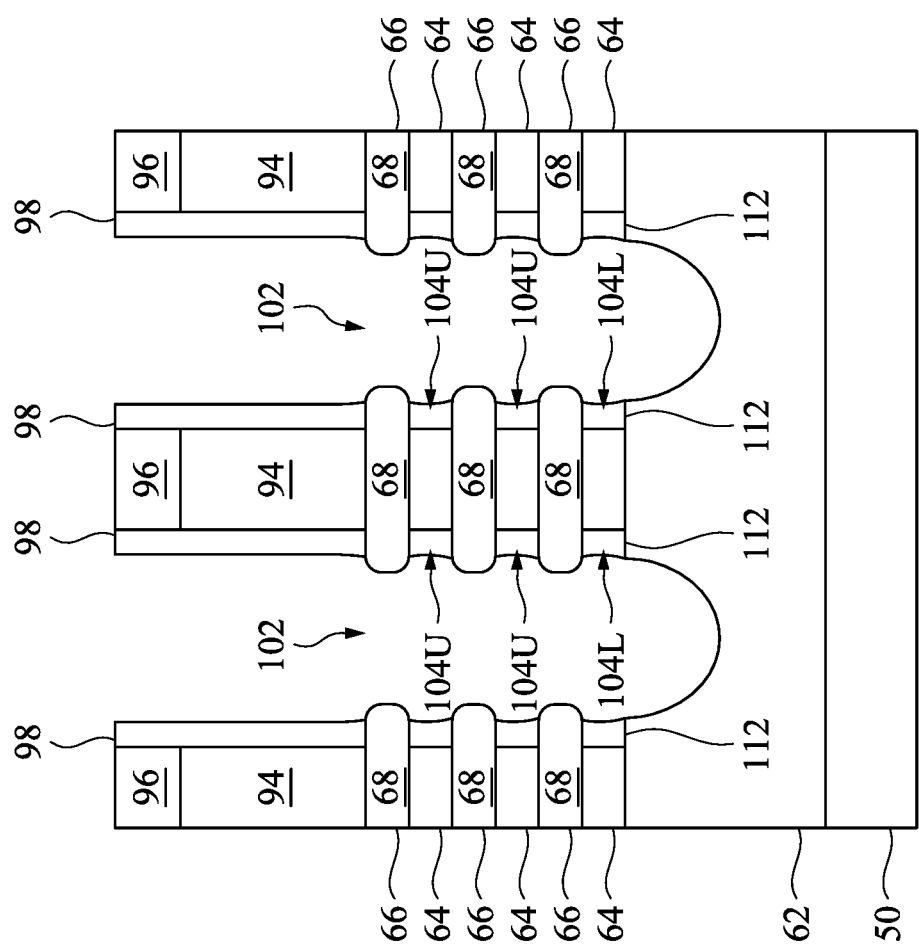
FIGS. 28A-31C are views of intermediate stages in the manufacturing of nanostructure-FETs, in accordance with some other embodiments.

In FIGS. 28A-28C, a structure similar to that of FIGS. 13A-13C is formed. The spacer layer 106 is then patterned to form inner spacers 112. The spacer layer 106 may be patterned as previously described, so that the inner spacers 112 are disposed in all of the sidewall recesses 104 (including the lower sidewall recesses 104L and the upper sidewall recesses 104U). In this embodiment, the gate spacers 116 and the bottom spacers 114 are not formed when patterning the spacer layer 106.

Figure 29C:
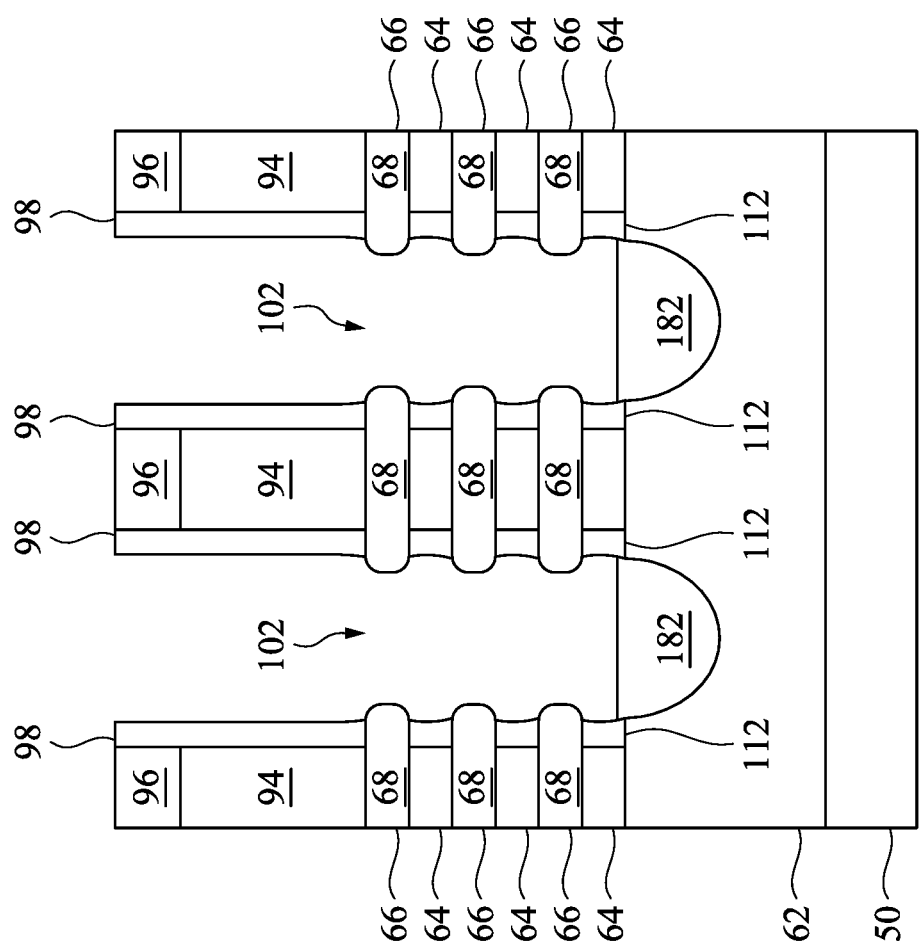

In FIGS. 29A-29C, semiconductor layers 182 are formed on the top surfaces and the sidewalls of the semiconductor fins 62 in the source/drain recesses 102. The semiconductor layers 182 may be formed of a semiconductor material selected from the candidate semiconductor materials of the substrate 50, which may be grown by a process such as vapor phase epitaxy (VPE) or molecular beam epitaxy (MBE), deposited by a process such as chemical vapor deposition (CVD) or atomic layer deposition (ALD), or the like. The semiconductor layers 182 may be doped to have a conductivity type opposite from a conductivity type of the subsequently formed source/drain regions. Doping the semiconductor layers 182 may help further increase the isolation between the subsequently formed source/drain regions and the semiconductor fins 62. In some embodiments, the doping concentration in the semiconductor layers 182 is in the range of $10^{15}$ cm$^{-3}$ to $10^{18}$ cm$^{-3}$.

The semiconductor layers 182 may be grown by flowing a semiconductor-containing precursor, an etchant-containing precursor, and a dopant-containing precursor in the source/drain recesses 102, in a similar manner as described for the epitaxial source/drain regions 118. The semiconductor layers 182 may be grown using the same semiconductor-containing precursor and etchant-containing precursor as used to grow the epitaxial source/drain regions 118, and may be grown at the same temperature and pressure as used to grow the epitaxial source/drain regions 118. In some embodiments, the etchant-containing precursor is flowed at a greater flow rate when growing the semiconductor layers 182 than when growing the epitaxial source/drain regions 118, which may promote bottom-up growth of the semiconductor layers 182. As such, the semiconductor layers 182 may be formed on the semiconductor fins 62 but not on the nanostructures 66. The semiconductor layers 182 may partially fill, completely fill, or overfill the portions of the source/drain recesses 102 in the semiconductor fins 62.

In this embodiment, the semiconductor layers 182 are grown until they contact the insulating fins 82, thereby forming gaps 124 between the semiconductor layers 182 and the sidewalls of the STI regions 74. The gaps 124 may be at a vacuum, filled with air, filled with an inert gas, or the like. In another embodiment (subsequently described), growth of the semiconductor layers 182 is stopped before they contact the insulating fins 82, thereby avoiding formation of the gaps 124.

Figure 30C:
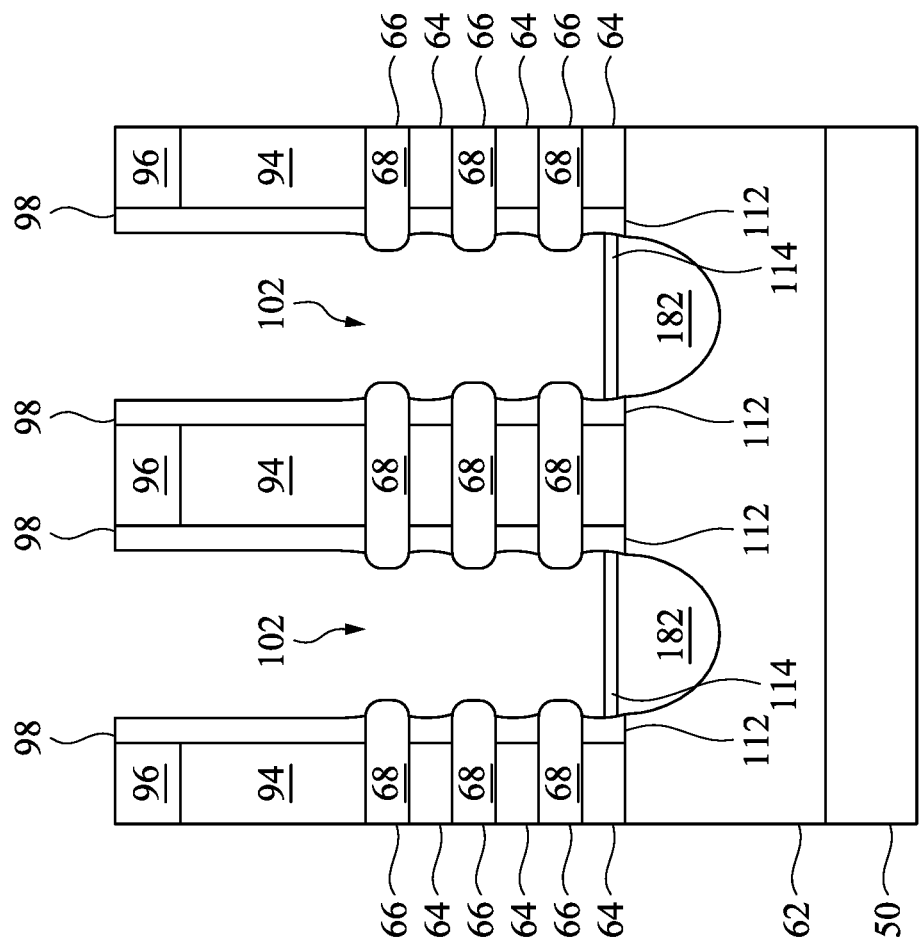

In FIGS. 30A-30C, the bottom spacers 114 are formed on the semiconductor layers 182. The bottom spacers 114 may be formed by depositing a spacer layer in the source/drain recesses 102 and on the semiconductor layers 182, and subsequently patterning the spacer layer to form the bottom spacers 114. The spacer layer may be formed from the candidate materials of the spacer layer 106 (described for FIGS. 13A-13C). The spacer layer may be patterned using the candidate etching processes for patterning the spacer layer 106 (described for FIGS. 14A-14C). Each bottom spacer 114 extends continuously across a top surface of a semiconductor layer 182, between respective inner spacers 112.

In this embodiment, the semiconductor layers 182 overfill the portions of the source/drain recesses 102 (see FIGS. 28A-28C) in the semiconductor fins 62. As such, the bottom spacers 114 do not contact the semiconductor fins 62 or the STI regions 74. In another embodiment (subsequently described), the semiconductor layers 182 underfill the portions of the source/drain recesses 102 in the semiconductor fins 62, such that the bottom spacers 114 contact the semiconductor fins 62 and the STI regions 74.

Figure 31B:
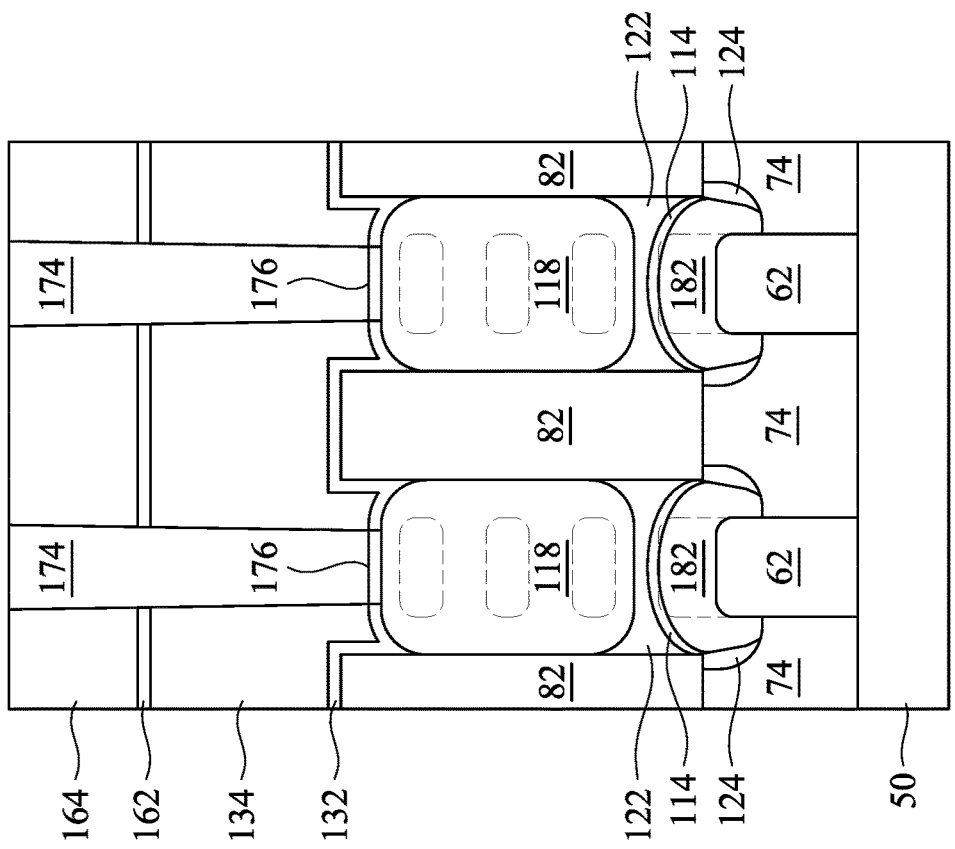
Figure 31A:
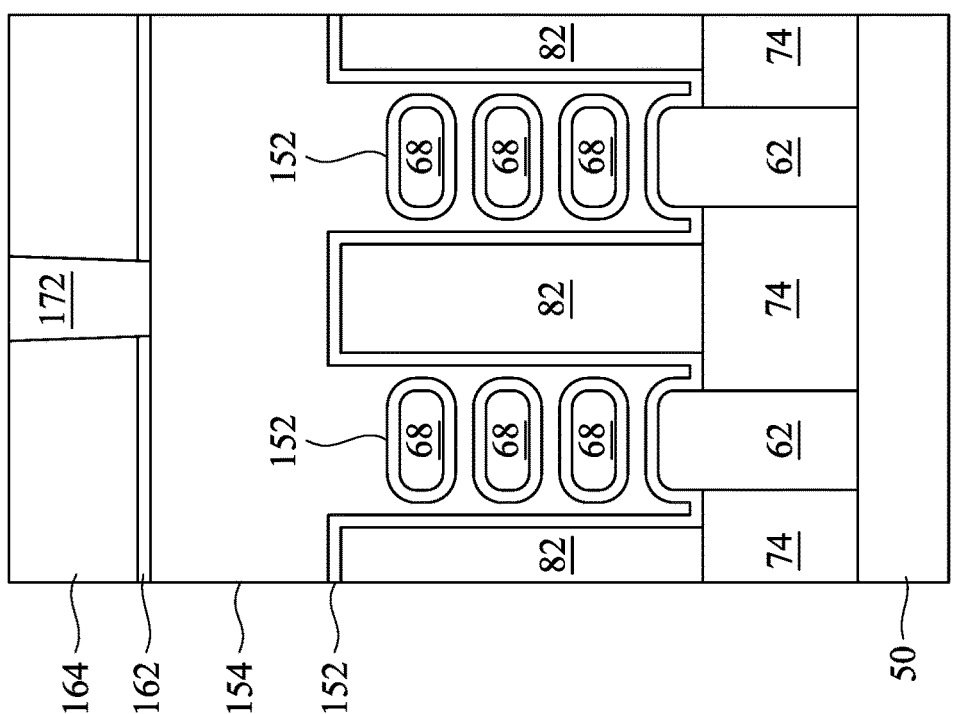
Figure 31C:
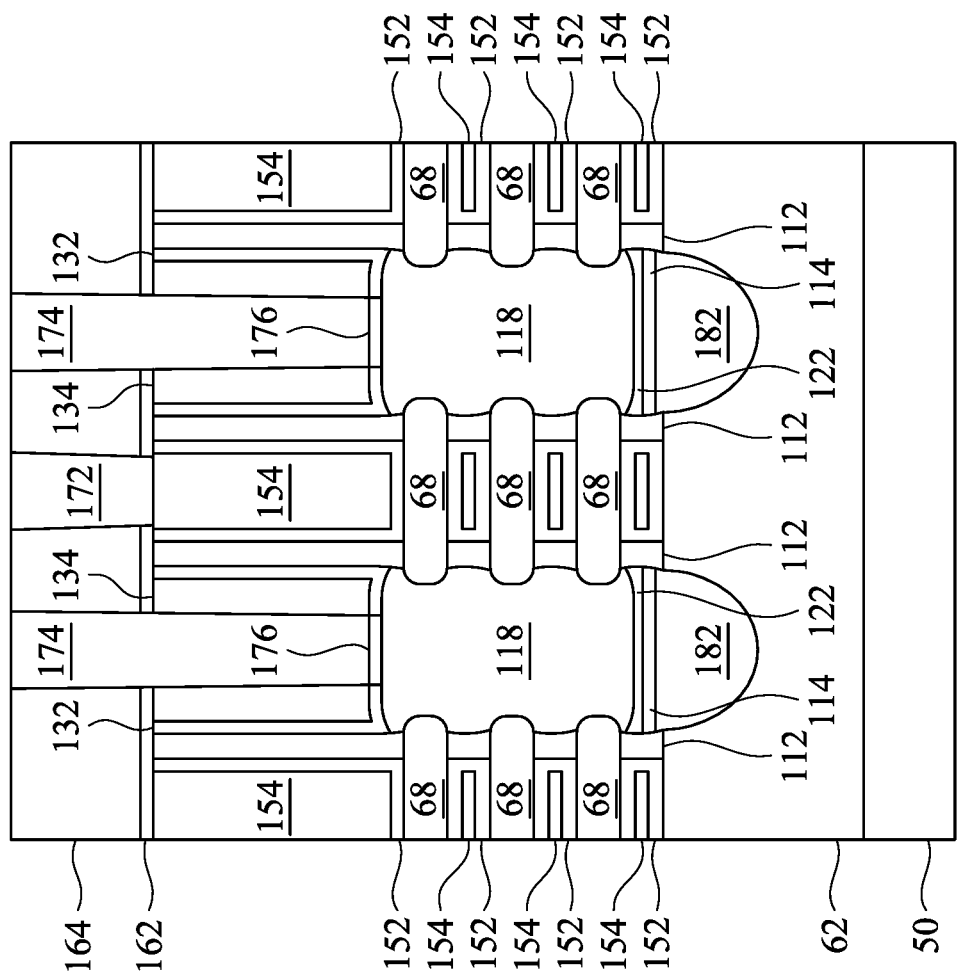

In FIGS. 31A-31C, appropriate steps as previously described are performed to complete formation of the nanostructure-FETs. The gaps 122 are formed beneath the epitaxial source/drain regions 118. The epitaxial source/drain regions 118 do not contact the bottom spacers 114 in this embodiment.

Figure 32B:
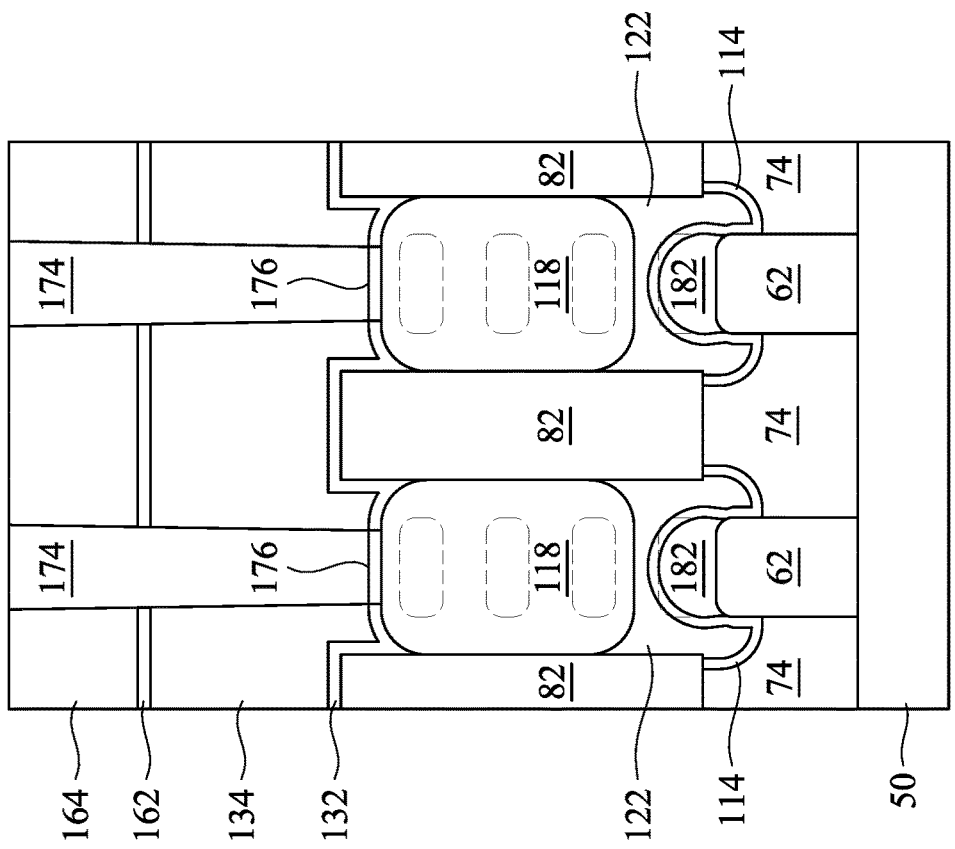
FIGS. 32A-32C are views of nanostructure-FETs, in accordance with some other embodiments.
Figure 32A:
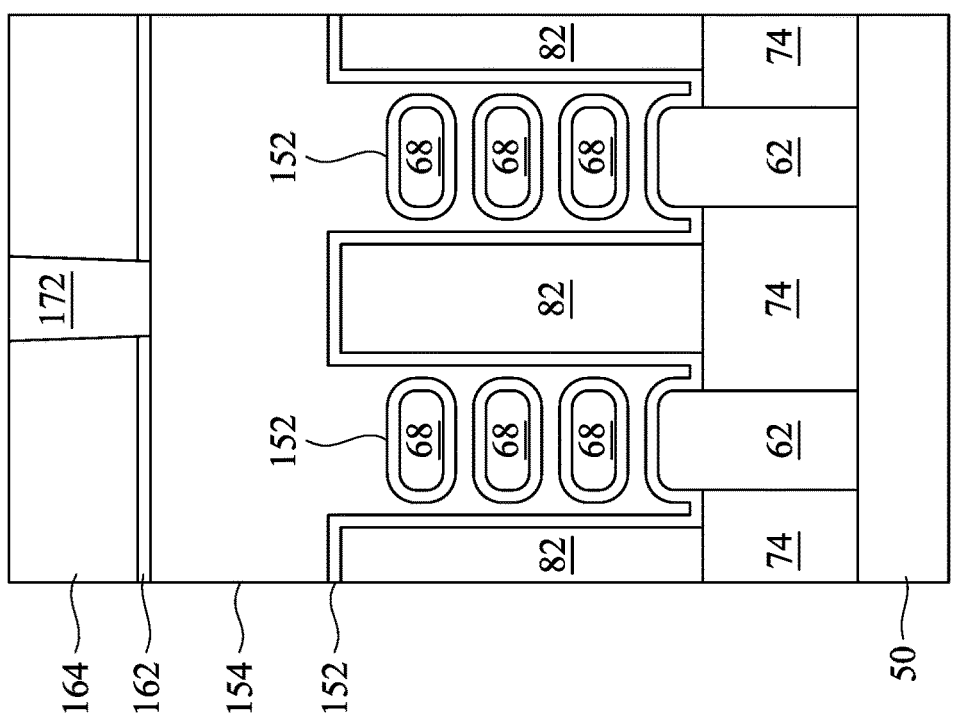
Figure 32C:
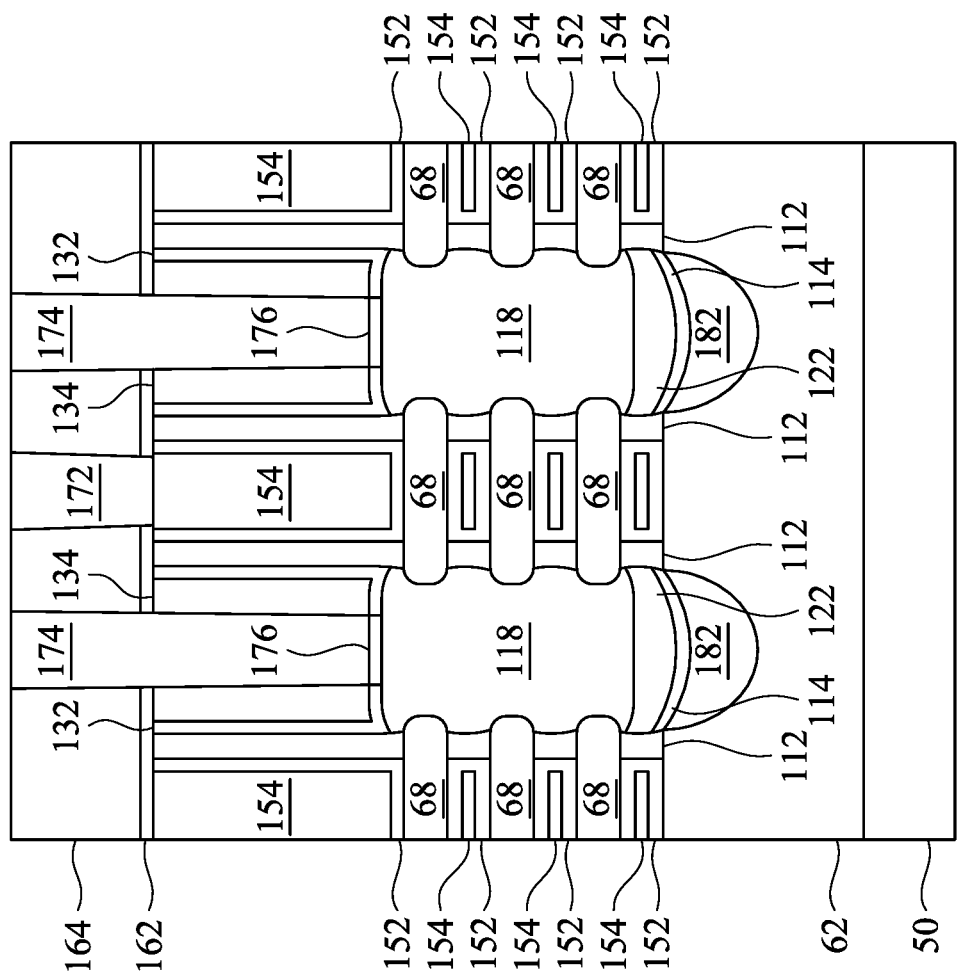

FIGS. 32A-32C are views of nanostructure-FETs, in accordance with some other embodiments. This embodiment is similar to the embodiment of FIGS. 31A-31C, except the semiconductor layers 182 underfill the portions of the source/drain recesses 102 (see FIGS. 28A-28C) in the semiconductor fins 62. The thickness of the semiconductor layers 182 in this embodiment is less than the embodiment of FIGS. 31A-31C. As a result, the bottom spacers 114 contact the semiconductor fins 62 and the STI regions 74 in the source/drain recesses 102. The growth of the semiconductor layers 182 is stopped before they contact the insulating fins 82, thereby avoiding formation of the gaps 124. Avoiding formation of the gaps 124 and forming the semiconductor layers 182 to a lesser thickness increases the height $H_1$ of the gaps 122, which may help reduce the parasitic capacitance of the resulting devices.

Figure 33:
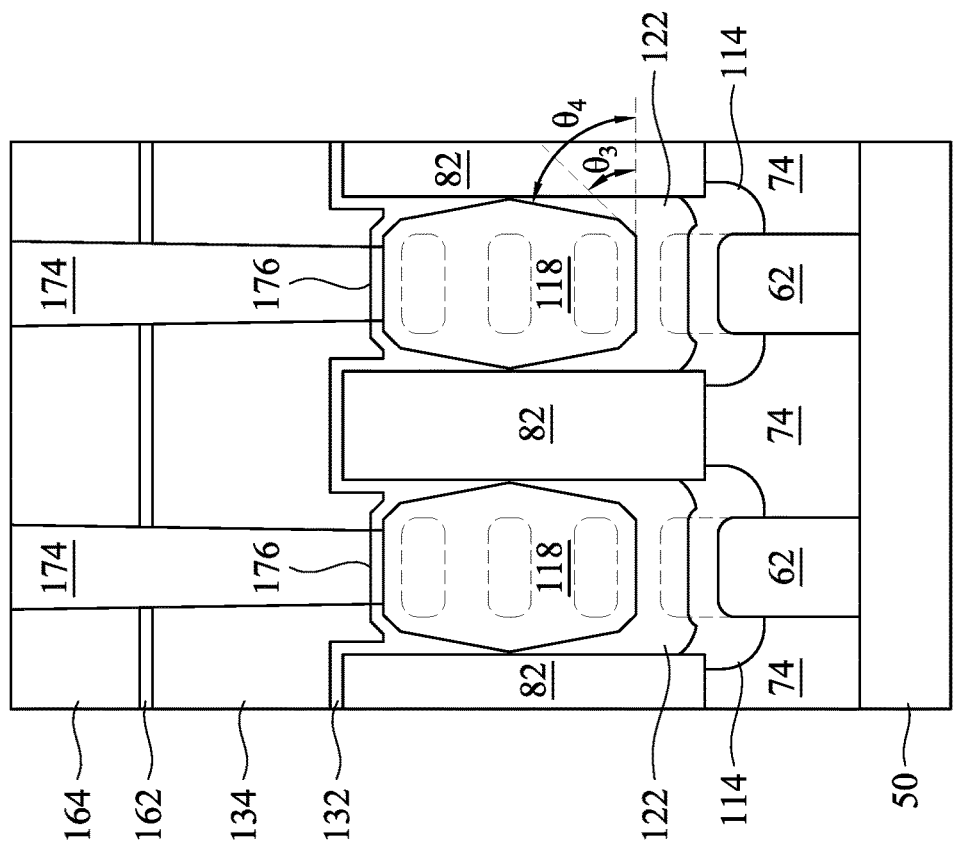
FIG. 33 is a view of nanostructure-FETs, in accordance with some other embodiments.

FIG. 33 is a view of nanostructure-FETs, in accordance with some other embodiments. This embodiment is similar to the embodiment of FIG. 21B (e.g., where the bottommost surface of an epitaxial source/drain region 118 is disposed above the topmost surface of the underlying semiconductor fin 62), except the epitaxial source/drain regions 118 are grown to have lower and upper <111> facets. The epitaxial source/drain region 118 of this embodiment may also be formed in the embodiments of FIGS. 24B, 25B, and 31B. The bottom surfaces of the epitaxial source/drain regions 118 form an angle $\theta_3$ with lower <111> faceted surfaces of the epitaxial source/drain regions 118, and form an angle $\theta_4$ with upper <111> faceted surfaces of the epitaxial source/drain regions 118. The angle $\theta_4$ is greater than the angle $\theta_3$. In some embodiments, the angle $\theta_3$ is in the range of 5 degrees to 85 degrees, and the angle $\theta_4$ is in the range of 5 degrees to 89 degrees. Forming the epitaxial source/drain regions 118 with upper and lower <111> facets causes the gaps 122 to have a large height $H_2$ extending from the top surfaces of the semiconductor fins 62 and up the sidewalls of the insulating fins 82. In some embodiments, the height $H_2$ is in the range of 0 Å to 500 Å. The height $H_2$ in this embodiment may be greater than in the embodiment of FIG. 23. Forming the gaps 122 with a large height $H_2$ allows the epitaxial source/drain regions 118 to have a decreased volume, which may help reduce the parasitic capacitance of the resulting devices.

The epitaxial source/drain regions 118 may be grown with <111> facets by performing a multi-cycle growth and etching process. An epitaxial growth process as described for FIGS. 15A-15C may be performed to grow some portions of the epitaxial source/drain regions 118. The epitaxial growth process may be stopped, and an etching process performed to reshape the epitaxial source/drain regions 118 to have a desired shape. The epitaxial growth process and etching process may then be cyclically repeated a desired quantity of times, until the epitaxial source/drain regions 118 have a desired shape.

Figure 34:
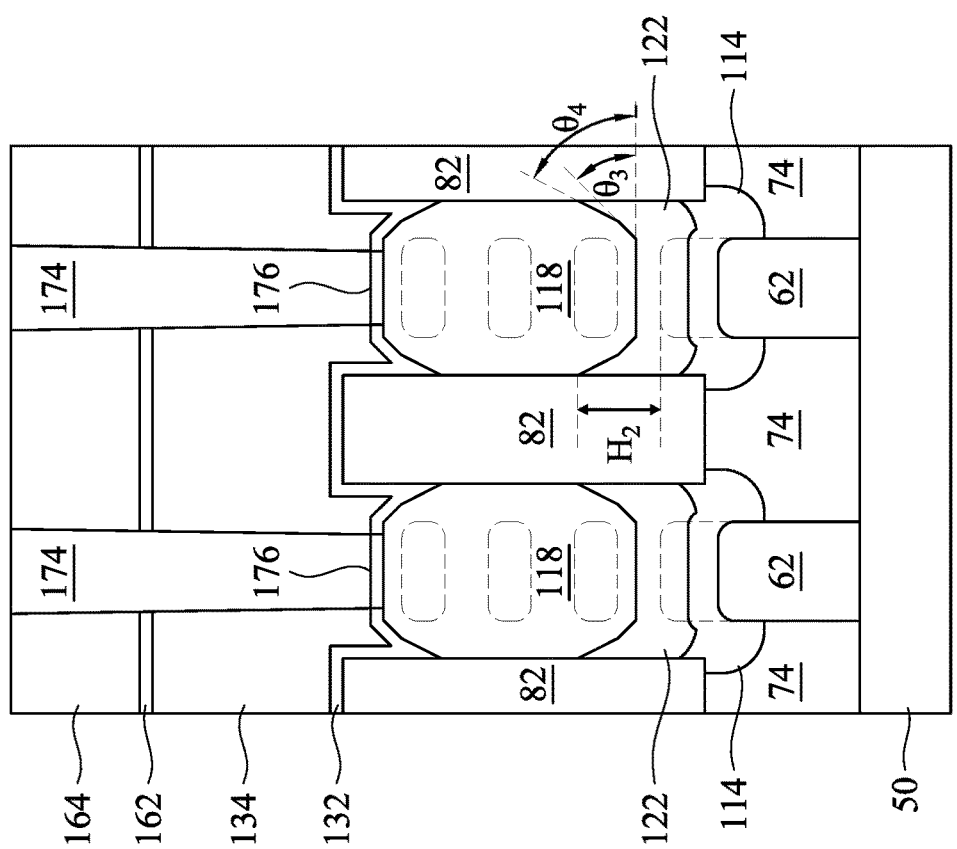
FIG. 34 is a view of nanostructure-FETs, in accordance with some other embodiments.

FIG. 34 is a view of nanostructure-FETs, in accordance with some other embodiments. This embodiment is similar to the embodiment of FIG. 33, except the epitaxial source/drain regions 118 are separated from (e.g., do not contact) the insulating fins 82. The epitaxial source/drain region 118 of this embodiment may also be formed in the embodiments of FIGS. 24B, 25B, and 31B. The bottom surfaces of the epitaxial source/drain regions 118 form an angle $\theta_3$ with lower <111> faceted surfaces of the epitaxial source/drain regions 118, and form an angle $\theta_4$ with upper <111> faceted surfaces of the epitaxial source/drain regions 118. The angle $\theta_4$ is greater than the angle $\theta_3$. In some embodiments, the angle $\theta_3$ is in the range of 5 degrees to 85 degrees, and the angle $\theta_4$ is in the range of 5 degrees to 90 degrees. The angles $\theta_3$ and $\theta_4$ in this embodiment may be greater than in the embodiment of FIG. 23.

The epitaxial source/drain regions 118 may be grown with <111> facets by performing a multi-cycle growth and etching process. An epitaxial growth process as described for FIGS. 15A-15C may be performed to grow some portions of the epitaxial source/drain regions 118. The epitaxial growth process may be stopped, and an etching process performed to reshape the epitaxial source/drain regions 118 to have a desired shape. The epitaxial growth process and etching process may then be cyclically repeated a desired quantity of times, until the epitaxial source/drain regions 118 have a desired shape. The epitaxial source/drain regions 118 in this embodiment may be etched a greater amount than the embodiment of FIG. 23.

Embodiments may achieve advantages. The bottom spacers 114 reduce the electrical coupling between the semiconductor fins 62 and the epitaxial source/drain regions 118. Reducing electrical coupling between the semiconductor fins 62 and the epitaxial source/drain regions 118 may help reduce the leakage current of the resulting devices. Specifically, the operation of parasitic channel regions 68P of the semiconductor fins 62 may be avoided. The gaps 122, when present, may further reduce electrical coupling between the semiconductor fins 62 and the epitaxial source/drain regions 118 by blocking leakage currents. Performance of the resulting devices may thus be improved.

Figure 35B:
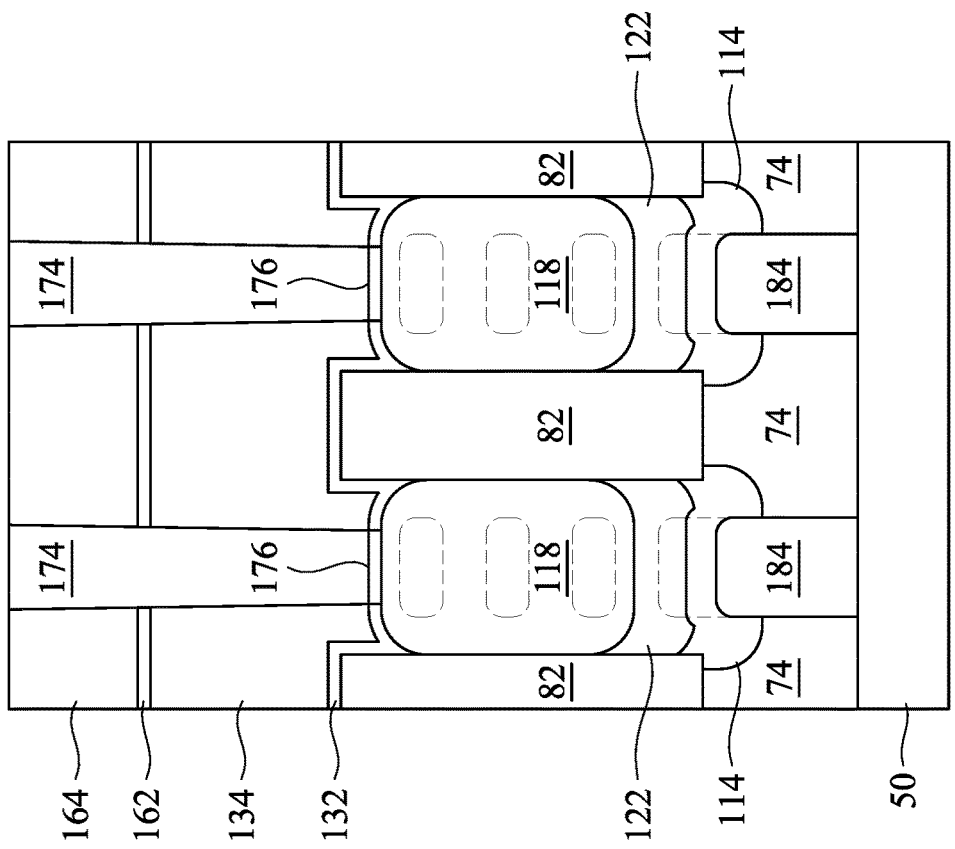
FIGS. 35A-35C are views of nanostructure-FETs, in accordance with some other embodiments.
Figure 35A:
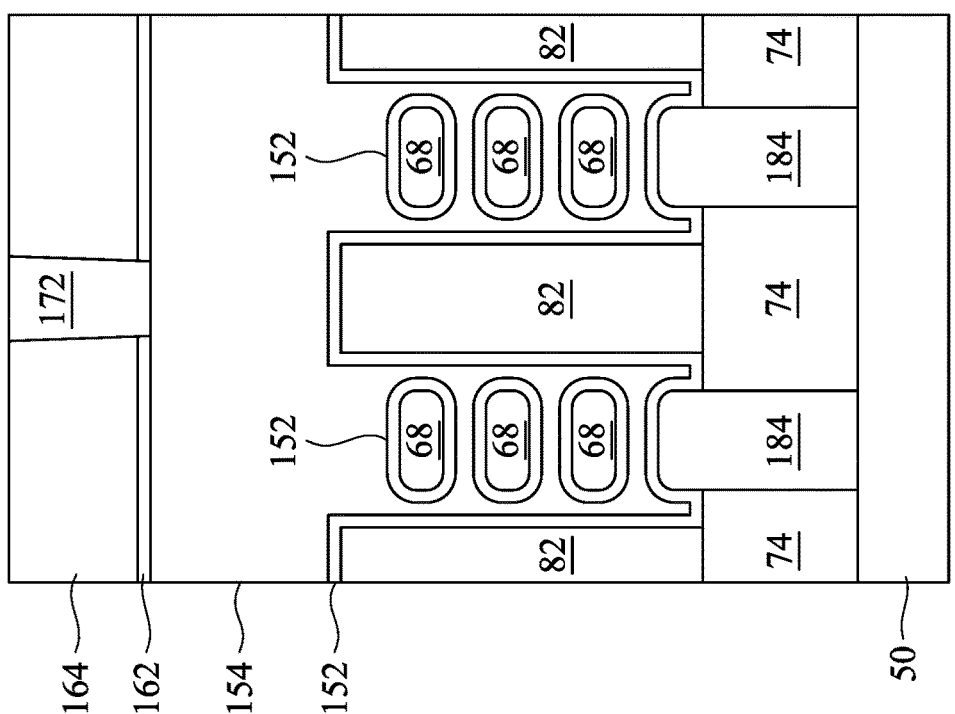
Figure 35C:
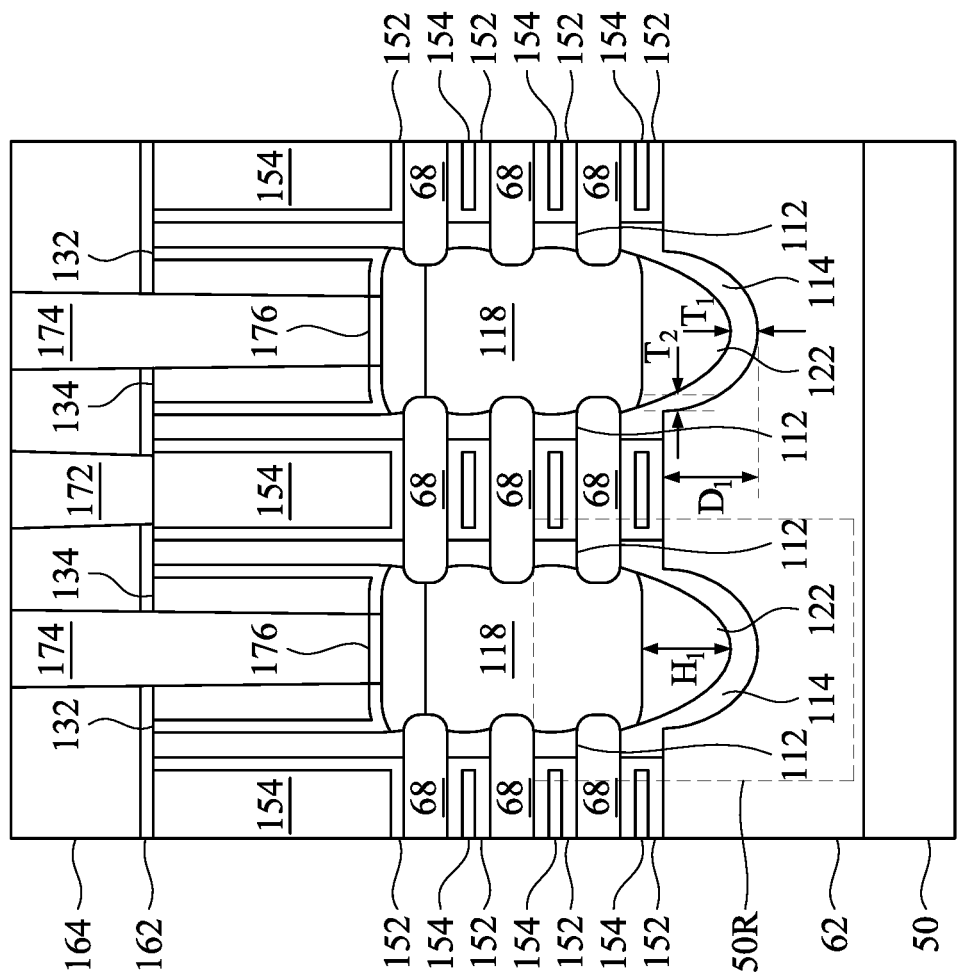

FIGS. 35A-35C are views of nanostructure-FETs, in accordance with some other embodiments. This embodiment is similar to the embodiment of FIGS. 21A-21C, except the semiconductor fins 62 are not formed, and insulating fins 184 are formed in lieu of the semiconductor fins 62. Replacing the semiconductor fins 62 with the insulating fins 184 may help further reduce the leakage current of the resulting devices. The insulating fins 184 of this embodiment may also be utilized in any of the other embodiments previously described.

FIGS. 36-39 are views of intermediate stages in the manufacturing of nanostructure-FETs, in accordance with some other embodiments. Specifically, FIGS. 33-36 are three-dimensional views illustrating a process for forming the insulating fins 184.

Figure 36:
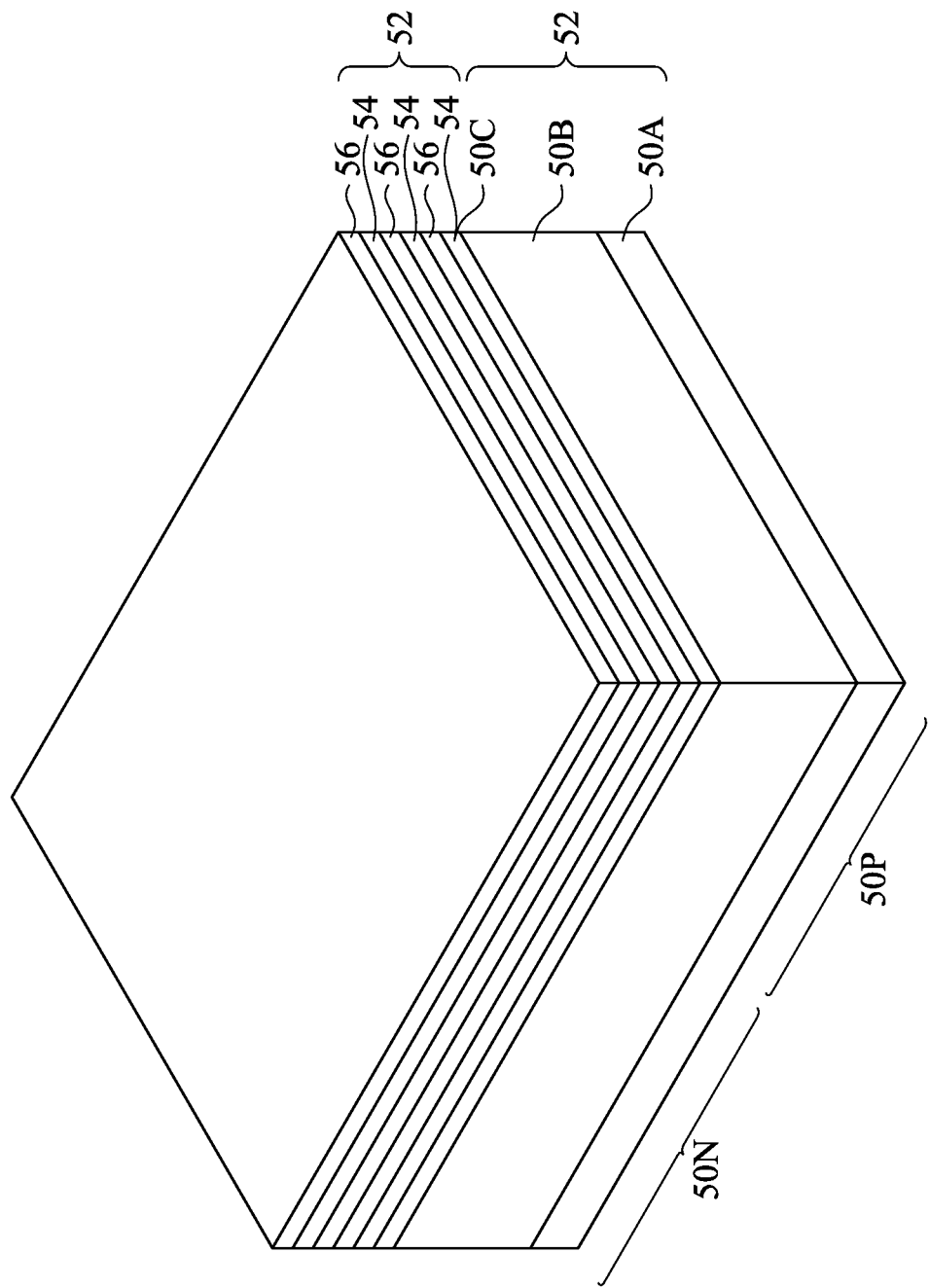
FIGS. 36-39 are views of intermediate stages in the manufacturing of nanostructure-FETs, in accordance with some other embodiments.

In FIG. 36, a substrate 50 is provided for forming nanostructure-FETs. In this embodiment, the substrate 50 is a semiconductor-on-insulator (SOI) substrate, including a substrate 50A, an insulator layer 50B, and a semiconductor layer 50C. The substrate 50A and the semiconductor layer 50C may be formed of any of the previously described semiconductor materials. The insulator layer 50B may be, for example, a buried oxide (BOX) layer, a silicon oxide layer, or the like, formed on the substrate 50A.

A multi-layer stack 52 is formed over the substrate 50. In this embodiment, the semiconductor layer 50C of the substrate 50 is formed of the same material as the first semiconductor layers 54, and as such, the semiconductor layer 50C may be utilized as the first semiconductor layer 54 at the bottom of the multi-layer stack 52. The remaining layers of the multi-layer stack may be formed in a similar manner as described for FIG. 2.

Figure 37:
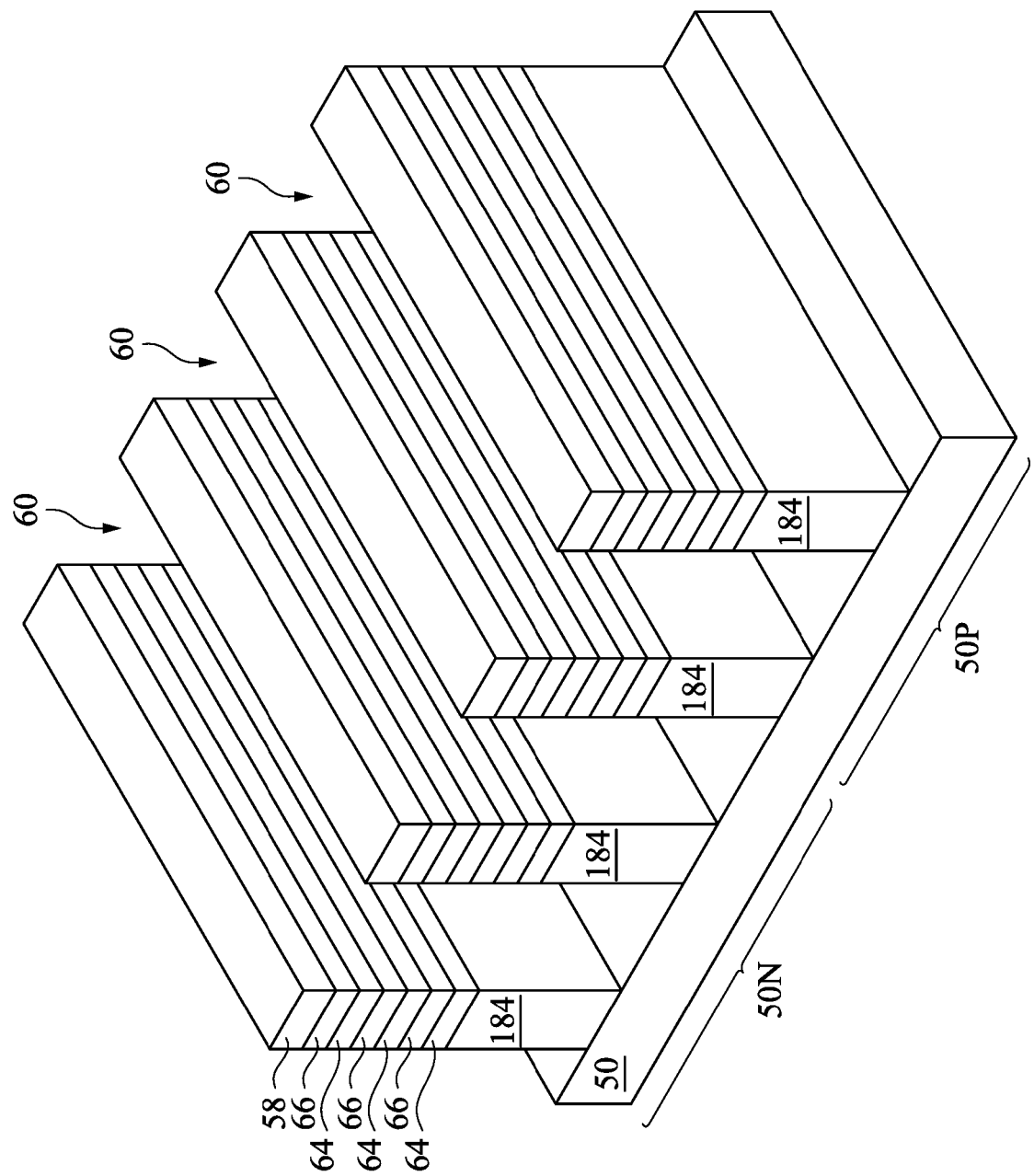

In FIG. 37, trenches 60 are patterned in the substrate 50 and the multi-layer stack 52 to form insulating fins 184, nanostructures 64, and nanostructures 66. The insulating fins 184 include the remaining portions of the insulator layer 50B. The nanostructures 64 and the nanostructures 66 include the remaining portions of the first semiconductor layers 54 and the second semiconductor layers 56, respectively. The trenches 60 may be formed in a similar manner as described for FIG. 3.

Figure 38:
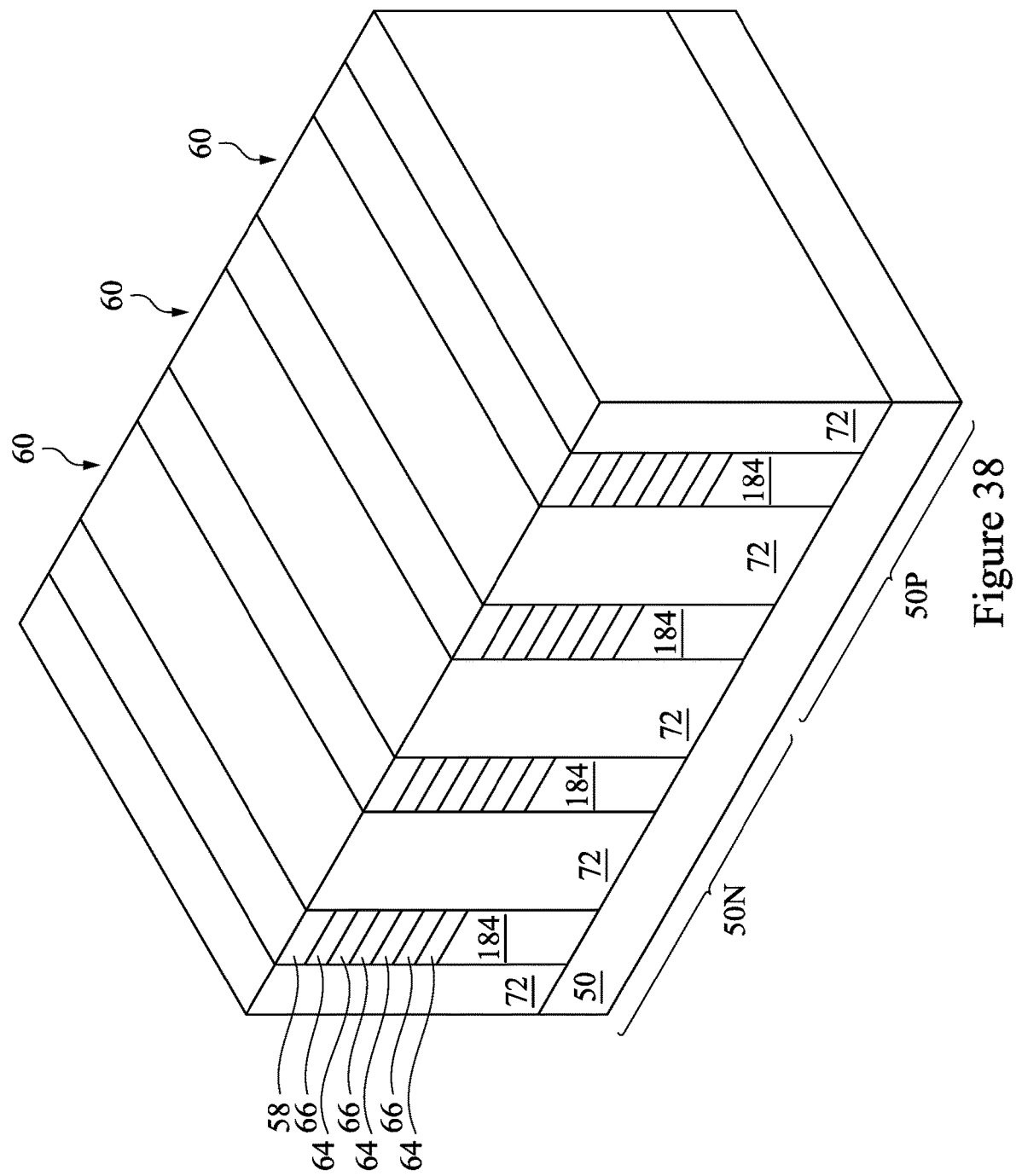

In FIG. 38, an insulation material 72 is formed over the substrate 50 and the nanostructures 64, 66, and in the trenches 60 between adjacent semiconductor fins 62. The insulation material 72 may be formed in a similar manner as described for FIG. 4.

Figure 39:
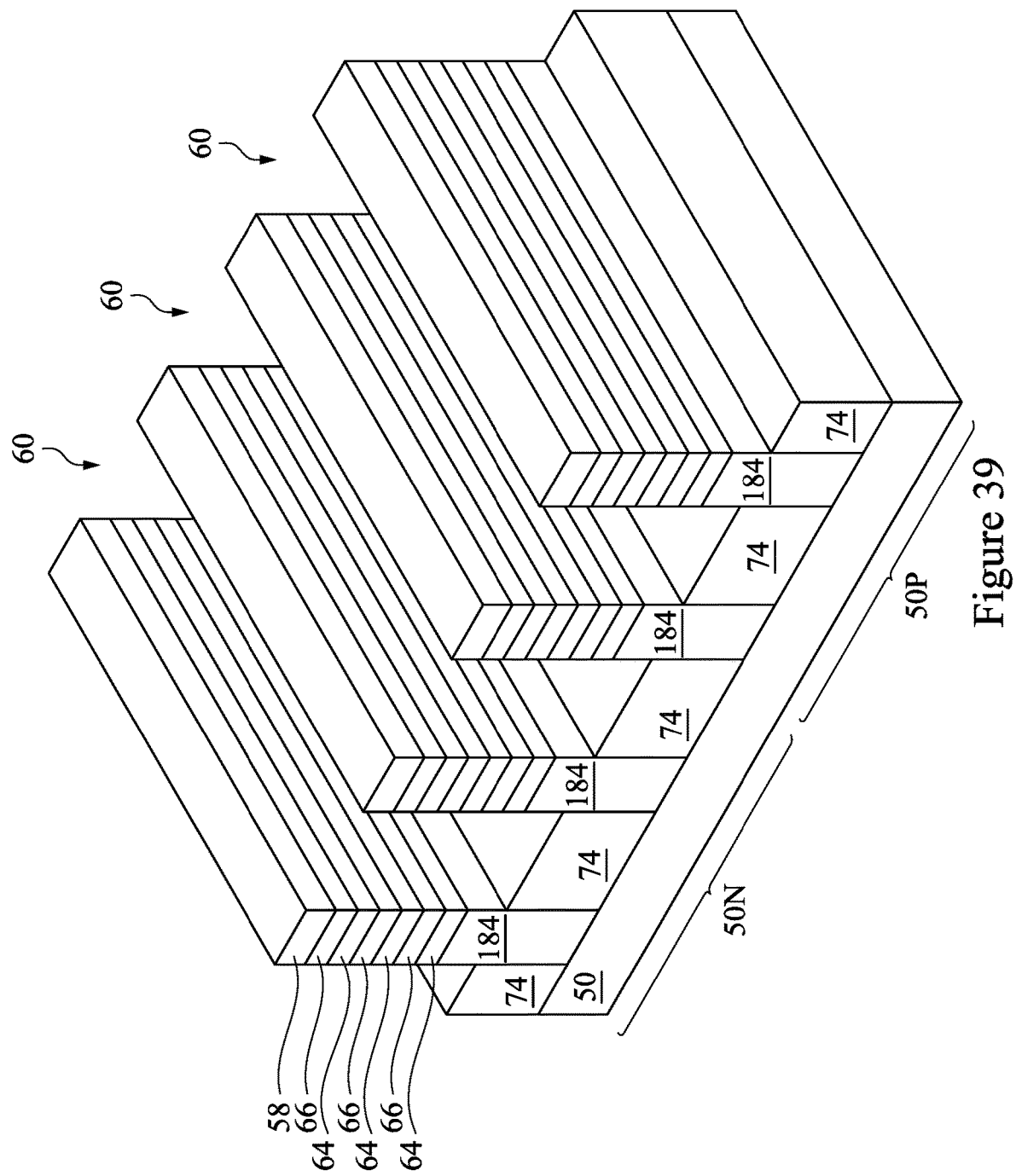

In FIG. 39, the insulation material 72 is recessed to form STI regions 74. The insulation material 72 may be recessed in a similar manner as described for FIG. 5. Subsequently, appropriate steps as previously described are performed to complete formation of the nanostructure-FETs.

In an embodiment, a device includes: a semiconductor fin extending from a semiconductor substrate; a nanostructure above the semiconductor fin; a source/drain region adjacent a channel region of the nanostructure; a bottom spacer between the source/drain region and the semiconductor fin; and a gap between the bottom spacer and the source/drain region. In some embodiments, the device further includes: a gate structure wrapped around the channel region of the nanostructure, a portion of the gate structure disposed between the nanostructure and the semiconductor fin, where the bottom spacer is disposed between the source/drain region and the portion of the gate structure. In some embodiments of the device, the bottom spacer is disposed in a source/drain recess in the semiconductor fin, the bottom spacer having a first thickness along a top surface of the semiconductor fin in the source/drain recess, the bottom spacer having a second thickness along a sidewall of the semiconductor fin in the source/drain recess. In some embodiments of the device, the first thickness is greater than the second thickness. In some embodiments of the device, the first thickness is equal to the second thickness. In some embodiments, the device further includes: a gate structure wrapped around the channel region of the nanostructure, a portion of the gate structure disposed between the nanostructure and the semiconductor fin; and an inner spacer between the source/drain region and the portion of the gate structure, the inner spacer different from the bottom spacer. In some embodiments of the device, the source/drain region contacts the bottom spacer. In some embodiments of the device, the source/drain region does not contact the bottom spacer. In some embodiments, the device further includes: a semiconductor layer between the bottom spacer and the semiconductor fin.

In an embodiment, a device includes: a semiconductor fin extending from a semiconductor substrate; a nanostructure above the semiconductor fin; a gate structure wrapped around the nanostructure in a first cross-sectional view; an insulating fin beneath the gate structure; a source/drain region adjacent the insulating fin in a second cross-sectional view; a bottom spacer disposed beneath the source/drain region and on the semiconductor fin; and a gap between the bottom spacer and the source/drain region. In some embodiments of the device, a bottom surface of the source/drain region is disposed below a topmost surface of the semiconductor fin. In some embodiments of the device, a bottom surface of the source/drain region is disposed above a topmost surface of the semiconductor fin.

In an embodiment, a method includes: etching a source/drain recess in a first nanostructure, a second nanostructure, and a semiconductor fin; recessing a sidewall of the second nanostructure in the source/drain recess to form a sidewall recess; forming an inner spacer on the sidewall of the second nanostructure in the sidewall recess; forming a bottom spacer disposed on a top surface of the semiconductor fin in the source/drain recess; and growing an epitaxial source/drain region in the source/drain recess, the epitaxial source/drain region grown from the first nanostructure. In some embodiments of the method, the epitaxial source/drain region fills an upper portion of the source/drain recess, a lower portion of the source/drain recess remaining unfilled by the epitaxial source/drain region to form a gap between the epitaxial source/drain region and the bottom spacer. In some embodiments of the method, the bottom spacer is also disposed on a sidewall of the semiconductor fin in the source/drain recess. In some embodiments of the method, the bottom spacer is not disposed on a sidewall of the semiconductor fin in the source/drain recess. In some embodiments of the method, forming the inner spacer and the bottom spacer includes: depositing a spacer layer in the sidewall recess and the source/drain recess; and patterning the spacer layer to form the bottom spacer and the inner spacer. In some embodiments, the method further includes: forming a gate structure around the first nanostructure; and forming a first gate spacer on a sidewall of the gate structure, where patterning the spacer layer forms a second gate spacer on a sidewall of the first gate spacer. In some embodiments of the method, patterning the spacer layer includes etching the spacer layer with an isotropic wet etch performed using potassium hydroxide, tetramethylammonium hydroxide, or ethylenediamine pyrocatechol as an etchant. In some embodiments, the method further includes: after forming the inner spacer, growing a semiconductor layer on the top surface of the semiconductor fin in the source/drain recess, the bottom spacer formed after growing the semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   etching a source/drain recess in a first nanostructure, a second nanostructure, and a semiconductor fin;
   recessing a sidewall of the second nanostructure in the source/drain recess to form a sidewall recess;
   forming an inner spacer on the sidewall of the second nanostructure in the sidewall recess;
   after forming the inner spacer, growing a semiconductor layer on a top surface of the semiconductor fin in the source/drain recess;
   after growing the semiconductor layer, forming a bottom spacer on the semiconductor layer and in the source/drain recess; and
   growing an epitaxial source/drain region in the source/drain recess, the epitaxial source/drain region grown from the first nanostructure.

2. The method of claim 1, wherein the epitaxial source/drain region fills an upper portion of the source/drain recess, a lower portion of the source/drain recess remaining unfilled by the epitaxial source/drain region to form a gap between the epitaxial source/drain region and the bottom spacer.

3. The method of claim 2, wherein the semiconductor layer is also grown on a sidewall of the semiconductor fin in the source/drain recess.

4. The method of claim 1, wherein forming the inner spacer comprises:
   depositing a spacer layer in the sidewall recess and the source/drain recess; and
   patterning the spacer layer to form the inner spacer.

5. The method of claim 4, further comprising:
   forming a gate structure around the first nanostructure; and
   forming a first gate spacer on a sidewall of the gate structure, wherein patterning the spacer layer forms a second gate spacer on a sidewall of the first gate spacer.

6. The method of claim 4, wherein patterning the spacer layer comprises etching the spacer layer with an isotropic wet etch performed using potassium hydroxide, tetramethylammonium hydroxide, or ethylenediamine pyrocatechol as an etchant.

7. The method of claim 2, wherein the semiconductor layer contacts a sidewall of the inner spacer.

8. The method of claim 2, wherein the semiconductor layer is doped to have a conductivity type opposite from a conductivity type of the epitaxial source/drain region.

9. The method of claim 2, wherein growing the semiconductor layer comprises growing the semiconductor layer until the semiconductor layer contacts insulating fins in the source/drain recess, wherein gaps are formed between the semiconductor layer and sidewalls of isolation regions beneath the insulating fins.

10. The method of claim 2, wherein growing the semiconductor layer comprises stopping growth of the semiconductor layer before the semiconductor layer contacts insulating fins in the source/drain recess.

11. A method comprising:
    forming a first spacer and a second spacer, the first spacer formed between a first nanostructure and a semiconductor fin, the second spacer formed between a second nanostructure and the semiconductor fin;
    growing a semiconductor layer on a top surface of the semiconductor fin;
    forming a third spacer on the semiconductor layer, the third spacer extending continuously across a top surface of the semiconductor layer and between the first spacer and the second spacer; and
    growing an epitaxial source/drain region over the third spacer and between the first nanostructure and the second nanostructure, the epitaxial source/drain region being doped to have a conductivity type opposite from a conductivity type of the semiconductor layer.

12. The method of claim 11, wherein the semiconductor layer extends continuously across the top surface of the semiconductor fin and between the first spacer and the second spacer.

13. The method of claim 11, wherein the semiconductor layer is grown with a first growth process using an etchant-containing precursor, the epitaxial source/drain region is grown with a second growth process using the etchant-containing precursor, and the etchant-containing precursor is flowed at a greater flow rate during the first growth process than during the second growth process.

14. The method of claim 11, further comprising:
    forming an insulating fin, the epitaxial source/drain region being grown until the epitaxial source/drain region contacts the insulating fin, the semiconductor layer being grown until the semiconductor layer contacts the insulating fin.

15. The method of claim 11, further comprising:
    forming an insulating fin, the epitaxial source/drain region being grown until the epitaxial source/drain region contacts the insulating fin, growth of the semiconductor layer being stopped before the semiconductor layer contacts the insulating fin.

16. The method of claim 11, wherein growth of the epitaxial source/drain region is stopped so that a gap is formed between the epitaxial source/drain region and the third spacer.

17. The method of claim 11, wherein the semiconductor layer is grown on a sidewall of the semiconductor fin.

18. The method of claim 11, wherein the semiconductor layer is not grown on a sidewall of the semiconductor fin.

19. A method comprising:
    forming a source/drain recess in a semiconductor fin and in nanostructures stacked over the semiconductor fin;
    growing a semiconductor layer in the source/drain recess to at least partially fill a portion of the source/drain recess in the semiconductor fin, the semiconductor layer having a flat top surface;
    forming a bottom spacer extending continuously along the flat top surface of the semiconductor layer between opposing sidewalls of the source/drain recess;
    growing an epitaxial source/drain region in the source/drain recess and over the bottom spacer;

forming an interlayer dielectric over the epitaxial source/drain region; and forming a source/drain contact extending through the interlayer dielectric to contact the epitaxial source/drain region.

20. The method of claim 19, wherein growing the epitaxial source/drain region comprises growing the epitaxial source/drain region with a process that promotes semiconductor material growth from the nanostructures while suppressing growth from the bottom spacer.

* * * * *